US011626418B2

(12) United States Patent
Ninomiya

(10) Patent No.: US 11,626,418 B2
(45) Date of Patent: Apr. 11, 2023

(54) THREE-DIMENSIONAL MEMORY DEVICE WITH PLURAL CHANNELS PER MEMORY OPENING AND METHODS OF MAKING THE SAME

(71) Applicant: SANDISK TECHNOLOGIES LLC, Addison, TX (US)

(72) Inventor: Takeki Ninomiya, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 96 days.

(21) Appl. No.: 17/119,051

(22) Filed: Dec. 11, 2020

(65) Prior Publication Data

US 2022/0189986 A1 Jun. 16, 2022

(51) Int. Cl.

| | |
|---|---|
| ***H01L 27/11582*** | (2017.01) |
| ***H01L 23/522*** | (2006.01) |
| ***H01L 27/11556*** | (2017.01) |
| ***H01L 25/065*** | (2006.01) |
| ***H01L 25/18*** | (2006.01) |
| ***H01L 23/00*** | (2006.01) |
| ***H01L 25/00*** | (2006.01) |

(52) U.S. Cl.

CPC .... *H01L 27/11582* (2013.01); *H01L 23/5226* (2013.01); *H01L 24/08* (2013.01); *H01L 24/80* (2013.01); *H01L 25/0657* (2013.01); *H01L 25/18* (2013.01); *H01L 25/50* (2013.01); *H01L 27/11556* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search

None

See application file for complete search history.

(56) References Cited

U.S. PATENT DOCUMENTS

| | | | |
|---|---|---|---|
| 9,620,514 | B2 | 4/2017 | Kai et al. |
| 9,627,399 | B2 | 4/2017 | Kanakamedala et al. |
| 9,666,594 | B2 | 5/2017 | Mizuno et al. |
| 9,728,546 | B2 | 8/2017 | Serov et al. |
| 9,837,431 | B2 | 12/2017 | Nishikawa et al. |
| 9,935,123 | B2 | 4/2018 | Nishikawa et al. |
| 9,935,124 | B2 | 4/2018 | Nishikawa et al. |
| 10,381,376 | B1 | 8/2019 | Nishikawa et al. |
| 10,559,588 | B2 | 2/2020 | Dong et al. |
| 10,622,368 | B2 | 4/2020 | Kanakamedala et al. |
| 10,629,616 | B1 | 4/2020 | Kai et al. |

(Continued)

OTHER PUBLICATIONS

Fujiwara, M. et al., "3D Semicircular Flash Memory Cell: Novel Split-Gate Technology to Boost Bit Density," 2019 IEEE International Electron Devices Meeting (IEDM), San Francisco, CA, USA, 2019, pp. 28.1.1-28.1.4, doi: 10.1109/IEDM19573.2019.8993673.

(Continued)

*Primary Examiner* — Telly D Green

(74) *Attorney, Agent, or Firm* — The Marbury Law Group PLLC

(57) ABSTRACT

A three-dimensional memory device includes an alternating stacks of insulating layers and electrically conductive layers. Memory opening fill structures located in memory openings include a memory film and plural vertical semiconductor channels.

15 Claims, 81 Drawing Sheets

(56) References Cited

U.S. PATENT DOCUMENTS

| | | | | |
|---|---|---|---|---|
| 10,700,078 | B1 | 6/2020 | Cui et al. | |
| 10,700,086 | B2 | 6/2020 | Makala et al. | |
| 10,700,090 | B1 | 6/2020 | Cui et al. | |
| 10,720,444 | B2 | 7/2020 | Nishikawa et al. | |
| 10,777,575 | B1 * | 9/2020 | Cui | H01L 27/11565 |
| 2016/0071860 | A1 | 3/2016 | Kai et al. | |
| 2016/0071861 | A1 | 3/2016 | Serov et al. | |
| 2016/0071876 | A1 | 3/2016 | Mizuno et al. | |
| 2017/0025431 | A1 | 1/2017 | Kanakamedala et al. | |
| 2017/0148805 | A1 | 5/2017 | Nishikawa et al. | |
| 2017/0148808 | A1 | 5/2017 | Nishikawa et al. | |
| 2017/0148809 | A1 | 5/2017 | Nishikawa et al. | |
| 2019/0221575 | A1 * | 7/2019 | Dong | H01L 29/2003 |
| 2019/0252405 | A1 | 8/2019 | Tsutsumi | |
| 2019/0371803 | A9 | 12/2019 | Kanakamedala et al. | |
| 2019/0371807 | A1 * | 12/2019 | Nishikawa | H01L 27/11573 |
| 2020/0006375 | A1 | 1/2020 | Zhou et al. | |
| 2020/0006376 | A1 | 1/2020 | Makala et al. | |
| 2020/0058672 | A1 | 2/2020 | Nishikawa et al. | |
| 2020/0235090 | A1 * | 7/2020 | Chowdhury | H01L 24/08 |
| 2020/0303397 | A1 * | 9/2020 | Cui | H01L 27/11582 |

OTHER PUBLICATIONS

Shibata, N., "History and Future of Multi-Level-Cell Technology in 2D and 3D Flash Memory," 2020 IEEE International Memory Workshop (IMW), May 17, 2020 Dresden, Germany, DOI: 10.1109/IMW48823.2020.9108115.

Sakotsubo, Y., "Three-Dimensional Memory Device With Plural Channels Per Memory Opening And Methods Of Making The Same," U.S. Appl. No. 17/119,002, filed Dec. 11, 2020.

Lue, H.T. et al., "A 128Gb (MLC)/192Gb (TLC) Single-Gate Vertical Channel (SGVC) Architecture 3D NAND Using Only 16 Layers with Robust Read Disturb, Long-Retention and Excellent Scaling Capability," IEDM Proceedings, pp. IEDM 17-461-17-464, (2017).

U.S. Appl. No. 16/142,447, filed Sep. 26, 2018 SanDisk Technologies LLC.

U.S. Appl. No. 16/423,500, filed May 28, 2019 SanDisk Technologies LLC.

U.S. Appl. No. 16/707,541, filed Dec. 9, 2019 SanDisk Technologies LLC.

U.S. Appl. No. 16/829,591, filed Mar. 25, 2020 SanDisk Technologies LLC.

U.S. Appl. No. 16/829,667, filed Mar. 25, 2020 SanDisk Technologies LLC.

U.S. Appl. No. 16/876,816, filed May 18, 2020 SanDisk Technologies LLC.

U.S. Appl. No. 16/876,877, filed May 18, 2020 SanDisk Technologies LLC.

U.S. Appl. No. 16/985,335, filed Aug. 5, 2020 SanDisk Technologies LLC.

U.S. Appl. No. 17/062,988, filed Oct. 5, 2020 SanDisk Technologies LLC.

U.S. Appl. No. 17/082,629, filed Oct. 28, 2020 SanDisk Technologies LLC.

U.S. Appl. No. 17/109,592, filed Dec. 2, 2020 SanDisk Technologies LLC.

* cited by examiner hd1
hd2
B
B'
C
C'
A
A'
50
52
54
56
60
62
162
32
42
70
9

THREE-DIMENSIONAL MEMORY DEVICE WITH PLURAL CHANNELS PER MEMORY OPENING AND METHODS OF MAKING THE SAME

FIELD

The present disclosure relates generally to the field of semiconductor devices, and particular to a three-dimensional flat NAND memory device with plural channels per memory opening and methods of manufacturing the same.

BACKGROUND

A prior art three-dimensional NAND memory device includes a plurality of memory openings and a vertical semiconductor channel and a memory film in each memory opening. A vertical stack of word lines surrounds the memory openings.

SUMMARY

According to an aspect of the present disclosure, a three-dimensional memory device comprising a memory die is provided. The memory die includes: an alternating stack of insulating layers and electrically conductive layers; memory openings vertically extending through the alternating stack; and memory opening fill structures located in the memory openings, wherein each of the memory opening fill structures located in one of the memory openings comprises a memory film and two vertical semiconductor channels each having a respective crescent-shaped horizontal cross-sectional profile.

According to another aspect of the present disclosure, a three-dimensional memory device comprising a memory die is provided. The memory die includes: an alternating stack of insulating layers and electrically conductive layers located over a source layer; memory openings vertically extending through the alternating stack; memory opening fill structures located in the memory openings, wherein each of the memory opening fill structures comprises a memory film and two vertical semiconductor channels, and the memory openings and the memory opening fill structures are arranged in rows that laterally extend along a first horizontal direction and are laterally spaced from each other along a second horizontal direction; and drain-select-level dielectric isolation structures extending through each row of the memory opening fill structures at least at a level of a topmost one of the electrically conductive layers.

According to yet another aspect of the present disclosure, a method of forming a three-dimensional memory device is provided, which comprises: forming an alternating stack of insulating layers and sacrificial material layers over a substrate; forming memory openings through the alternating stack; forming a memory film in each of the memory openings; forming a semiconductor channel layer over the memory film; and performing a curvature-dependent lateral etch process that etches surfaces of the semiconductor channel layer having a lower curvature at a higher etch rate than surfaces of the semiconductor channel layer having a higher curvature, wherein remaining portions of the semiconductor channel layer comprise pairs of vertical semiconductor channels located within a respective one of the memory openings.

According to an aspect of the present disclosure, a three-dimensional memory device comprising a memory die is provided, which includes: an alternating stack of insulating layers and electrically conductive layers; elongated trenches that vertically extend through the alternating stack, laterally bounded by sidewalls of the alternating stack, laterally extending along a first horizontal direction, and laterally spaced apart from each other along a second horizontal direction; and trench fill structures located in the elongated trenches, wherein each of the trench fill structures comprises two rows of memory stack structures that are arranged along the first horizontal direction and laterally spaced apart from each other along the second horizontal direction, and each of the memory stack structures comprises a vertical semiconductor channel and a memory film. The electrically conductive layers comprise word-line-level electrically conductive layers, and each of the word-line-level electrically conductive layers laterally encloses a plurality of trench fill structures as a respective continuous structure.

According to another aspect of the present disclosure, a method of forming a three-dimensional memory device including a memory die is provided. The method comprises: forming an alternating stack of insulating layers and sacrificial material layers over a substrate; forming elongated trenches through the alternating stack, wherein each of the elongated trenches laterally extend along a first horizontal direction; forming a memory film and a semiconductor channel layer in the elongated trenches; forming two rows of memory stack structures within each of the elongated trenches by patterning the semiconductor channel layer and the memory film, wherein the two rows of memory stack structures are arranged along the first horizontal direction and are laterally spaced apart from each other along the second horizontal direction, and each of the memory stack structures comprises a vertical semiconductor channel that is a patterned portion of the semiconductor channel layer and a patterned portion of the memory film; replacing the sacrificial material layers with electrically conductive layers; removing the substrate after formation of the electrically conductive layers; exposing source side surfaces of the vertical semiconductor channels after removing the substrate; and forming a source layer on physically exposed surfaces of the vertical semiconductor channels.

DETAILED DESCRIPTION

Figure 1:
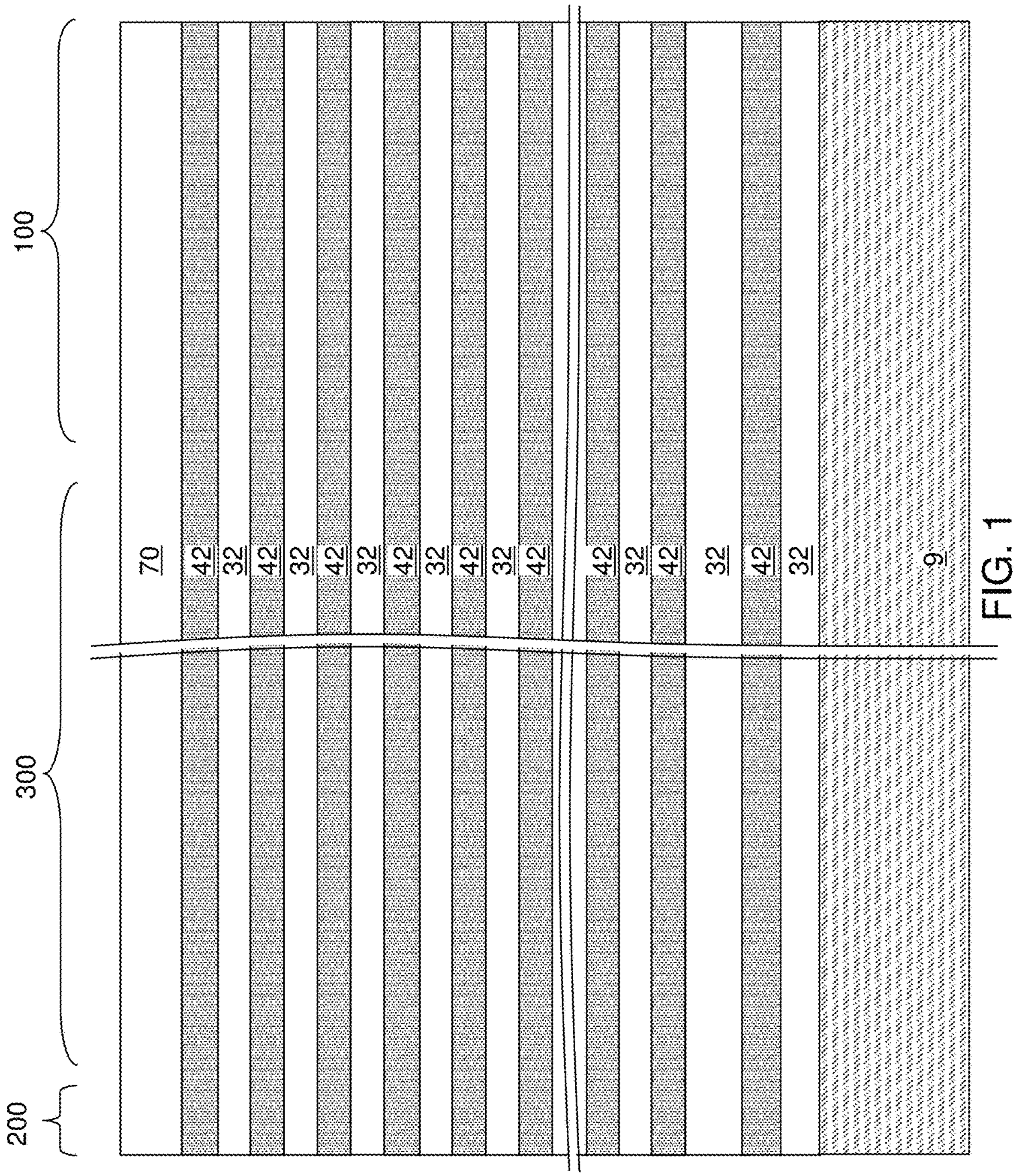
FIG. 1 is a schematic vertical cross-sectional view of a first exemplary structure after formation of insulating layers and sacrificial material layers according to a first embodiment of the present disclosure.

The present inventors realized that by forming plural vertical semiconductor channels in one memory opening, the device density can be increased. Furthermore, dummy rows of inactive semiconductor channels located under drain-select-level dielectric isolation structures may be eliminated when plural semiconductor channels are formed each memory opening, further increasing device density. The embodiments of the disclosure can be employed to form various structures including a multilevel memory structure, non-limiting examples of which include semiconductor devices such as three-dimensional monolithic memory array devices comprising a plurality of NAND memory strings containing plural semiconductor channels in a memory opening.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A stack of an alternating plurality of first material layers (which can be insulating layers 32) and second material layers (which can be sacrificial material layer 42) is formed over the top surface of the substrate semiconductor layer 9. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2A:
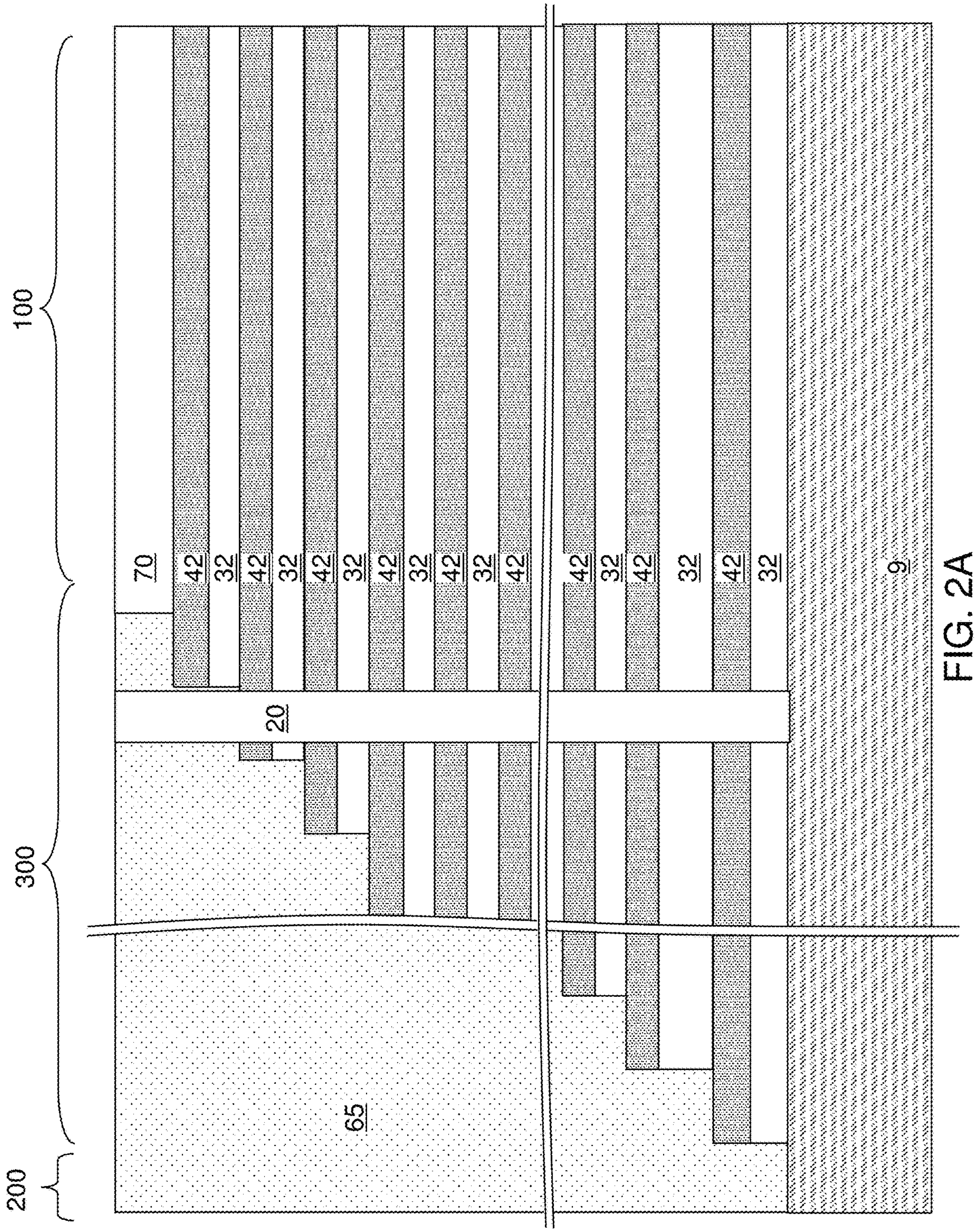
FIG. 2A is a schematic vertical cross-sectional view of the first exemplary structure after formation of stepped terraces, a retro-stepped dielectric material portion, and support pillar structures according to the first embodiment of the present disclosure.
Figure 2B:
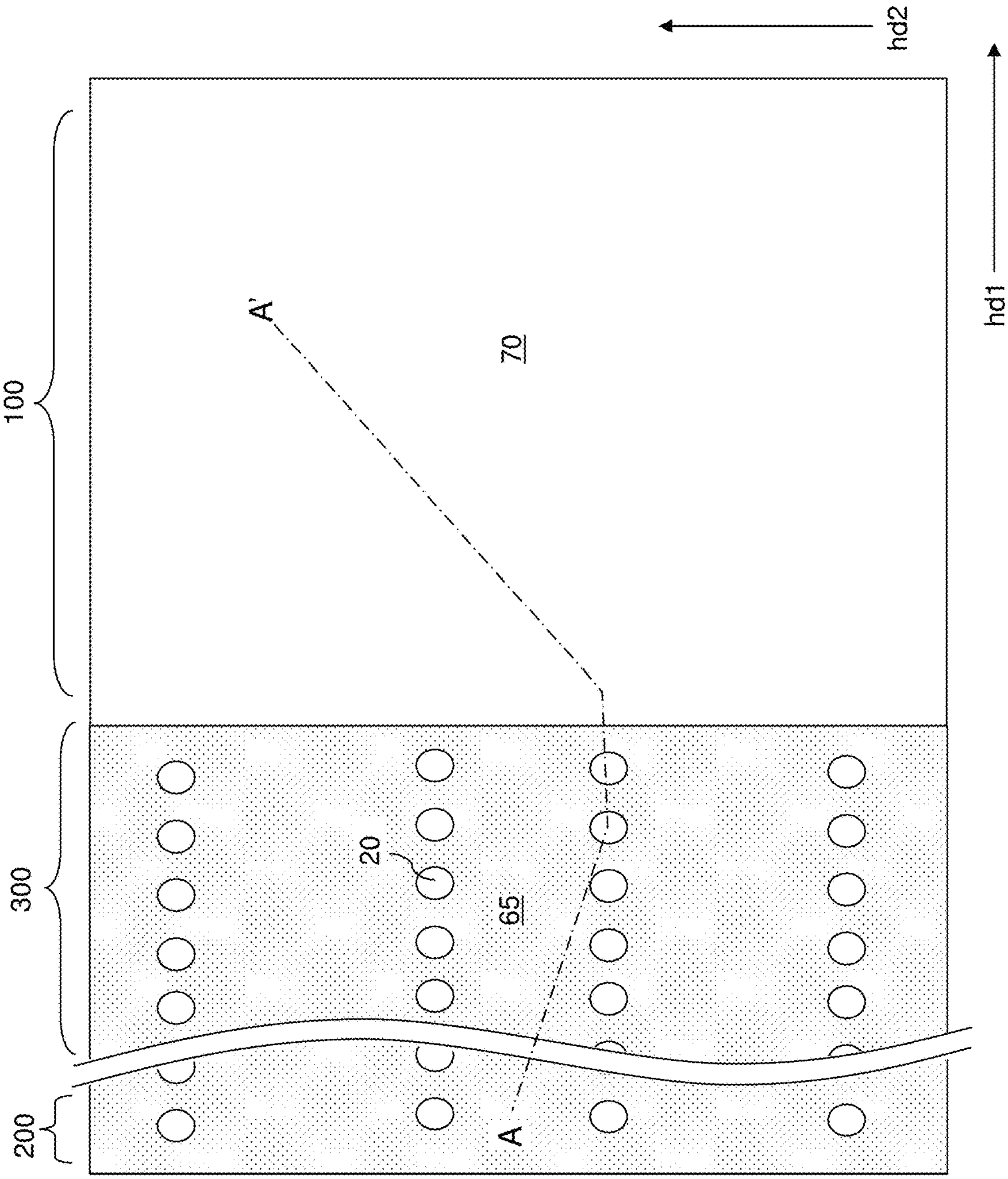
FIG. 2B is a top-down view of the first exemplary structure of FIG. 2A. The vertical plane A-A' is the plane of the cross-section for FIG. 2A.

Referring to FIGS. 2A and 2B, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate semiconductor layer 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, via cavities can be formed in the contact region 300, and can be filled with a dielectric fill material to form support pillar structures 20. The support pillar structures 20 can vertically extend from the substrate semiconductor layer 9 to a horizontal plane including the top surface of the insulating cap layer 70, and provides structural support to the insulating layers 30 during subsequent replacement of the sacrificial material layers 42 with electrically conductive layers. Alternatively, the via cavities and the support pillar structures 20 may be formed later during the same steps as the memory opening fill structures described in more detail below.

Figure 3A:
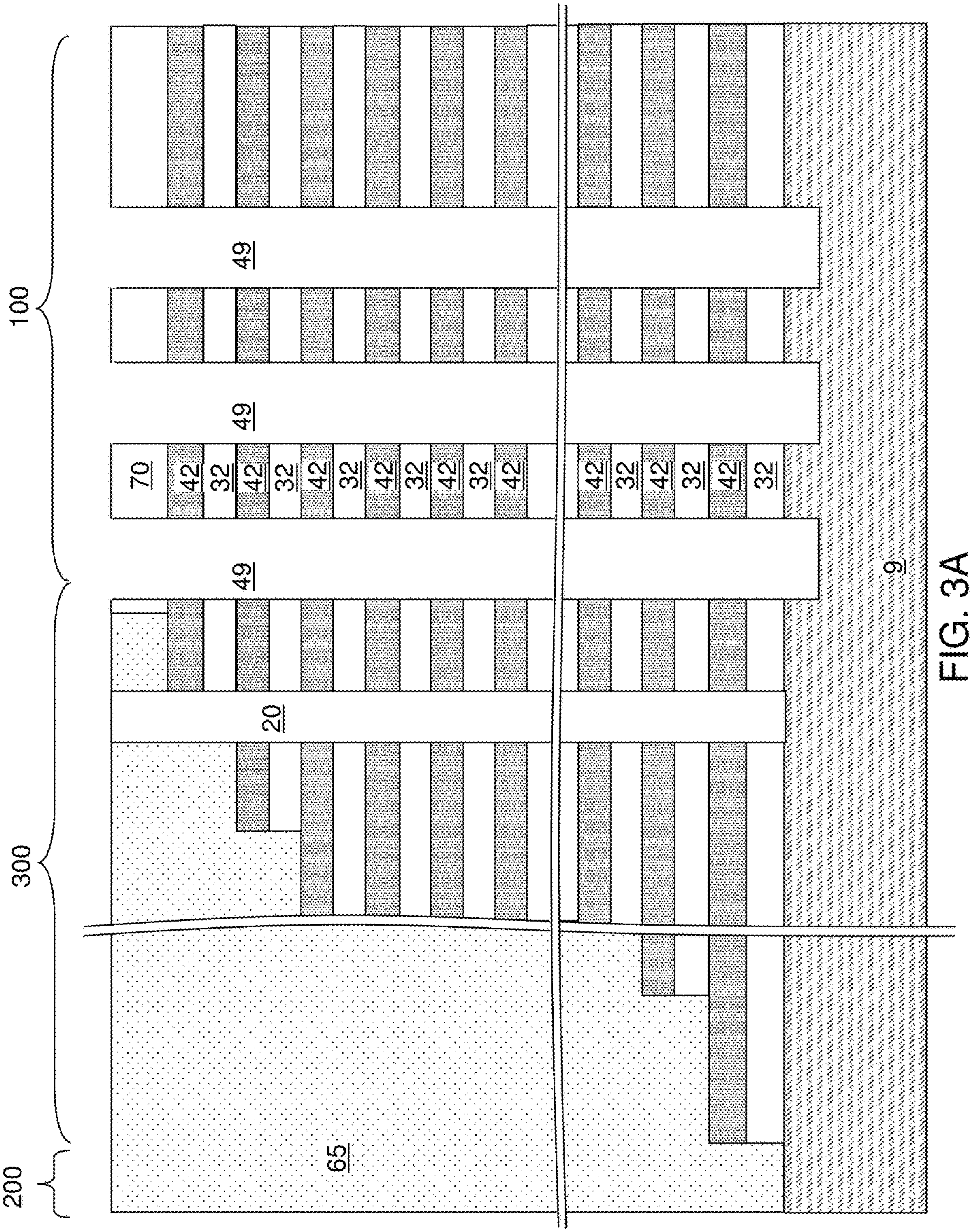
FIG. 3A is a schematic vertical cross-sectional view of the first exemplary structure after formation of memory openings according to the first embodiment of the present disclosure.
Figure 3B:
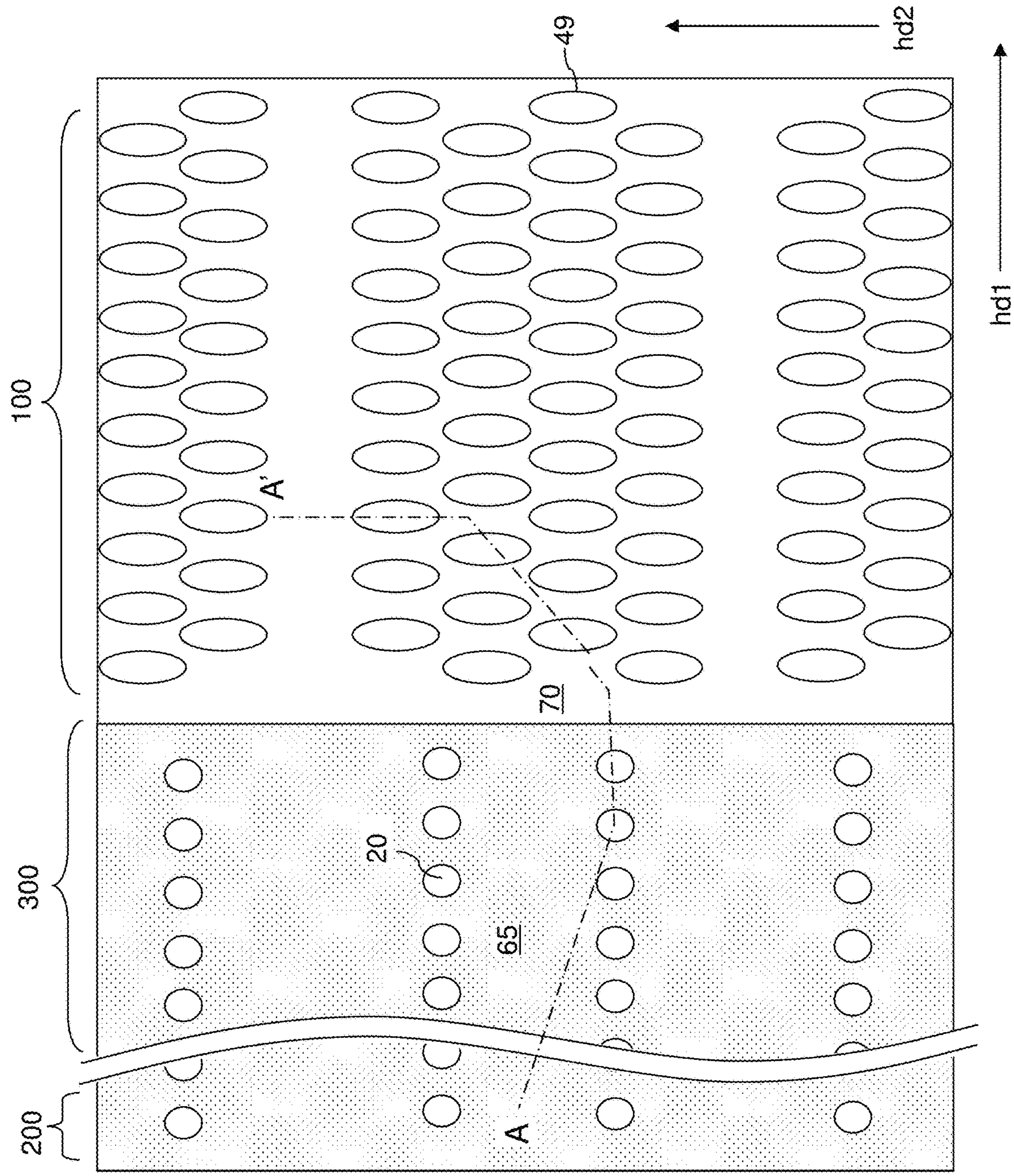
FIG. 3B is a top-down view of the first exemplary structure of FIG. 3A. The vertical plane A-A' is the plane of the cross-section for FIG. 3A.
Figure 4A:
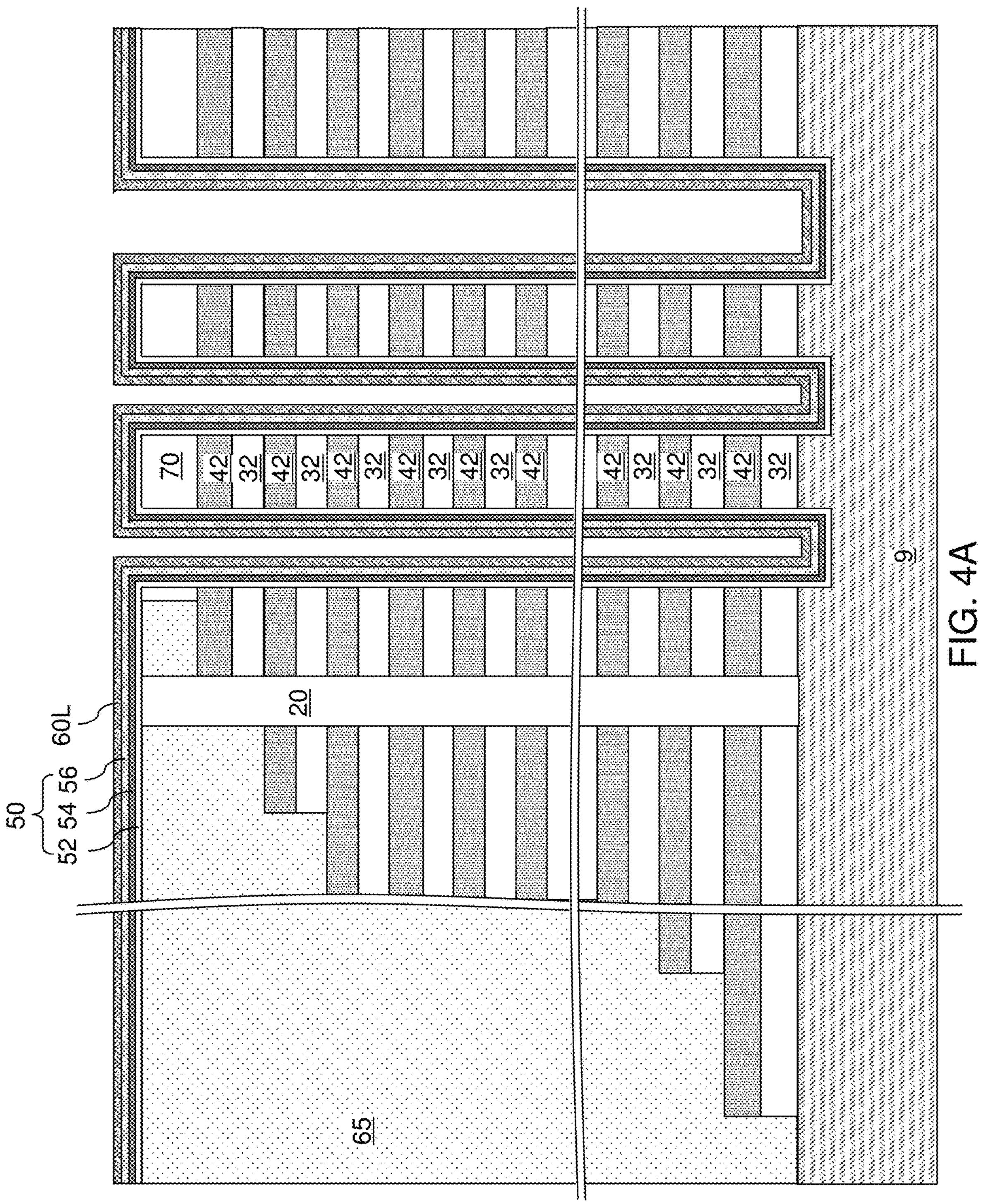
FIG. 4A is a schematic vertical cross-sectional view of the first exemplary structure after formation of a memory film and a semiconductor channel layer according to the first embodiment of the present disclosure.
Figure 4B:
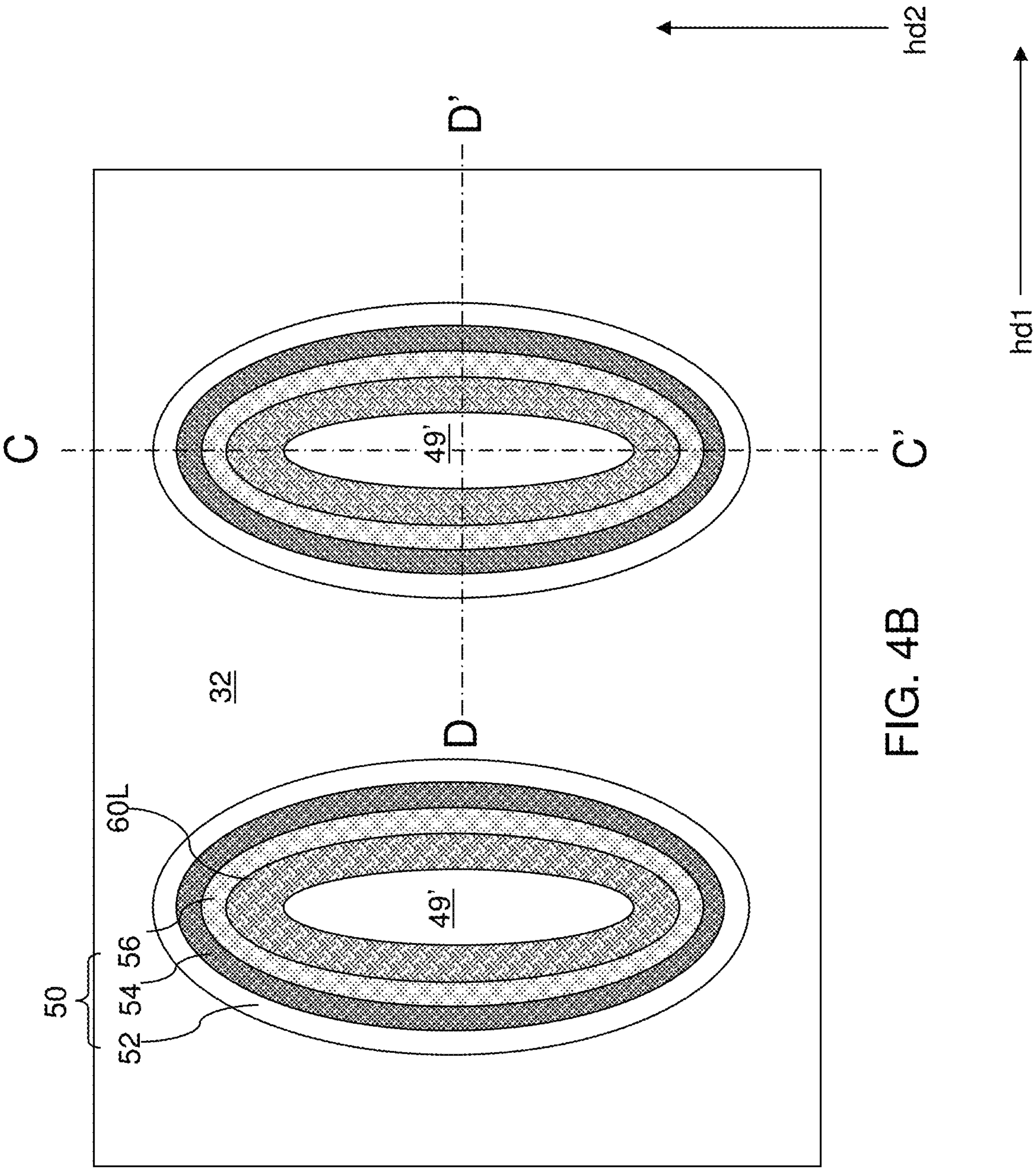
FIG. 4B is a horizontal cross-sectional view of a region of the first exemplary structure of FIG. 4A.
Figure 4C:
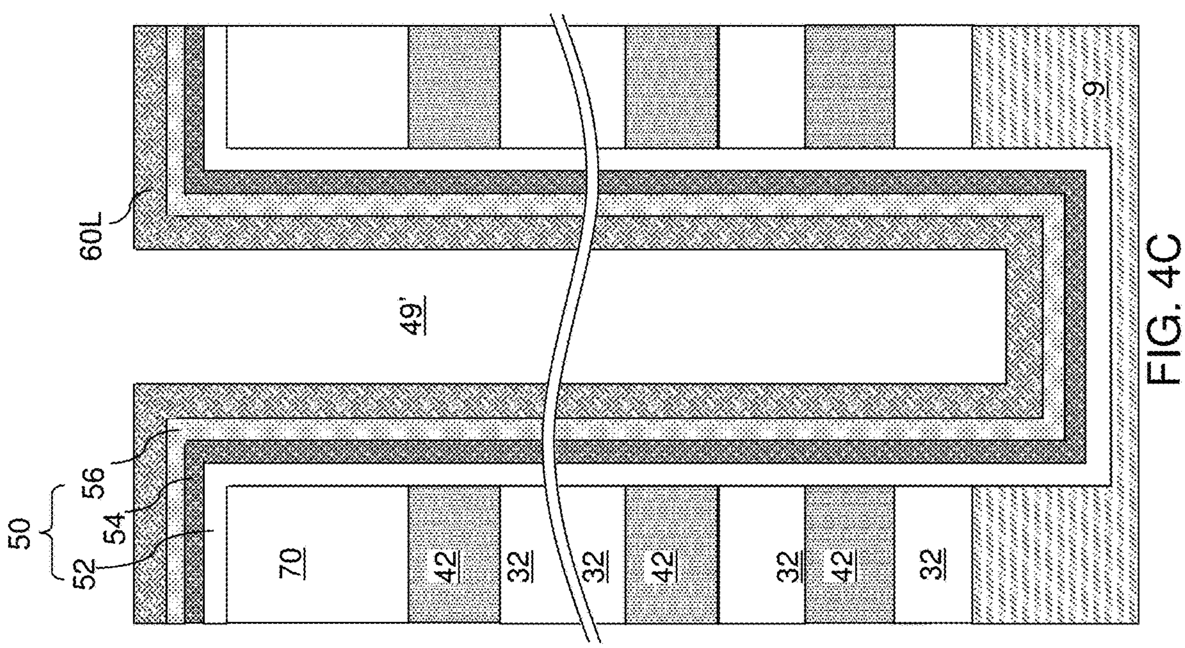
FIG. 4C is a vertical cross-sectional view the first exemplary structure along the vertical cross-sectional plane C-C' of FIG. 4B.
Figure 4D:
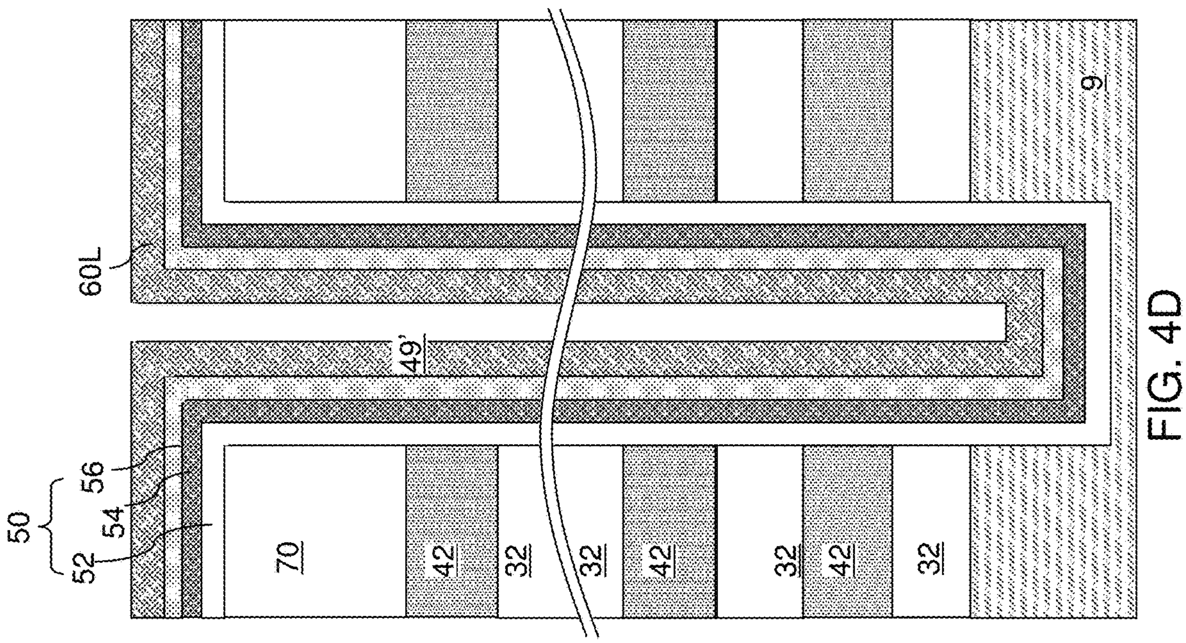
FIG. 4D is a vertical cross-sectional view the first exemplary structure along the vertical cross-sectional plane D-D' of FIG. 4B.
Figure 5A:
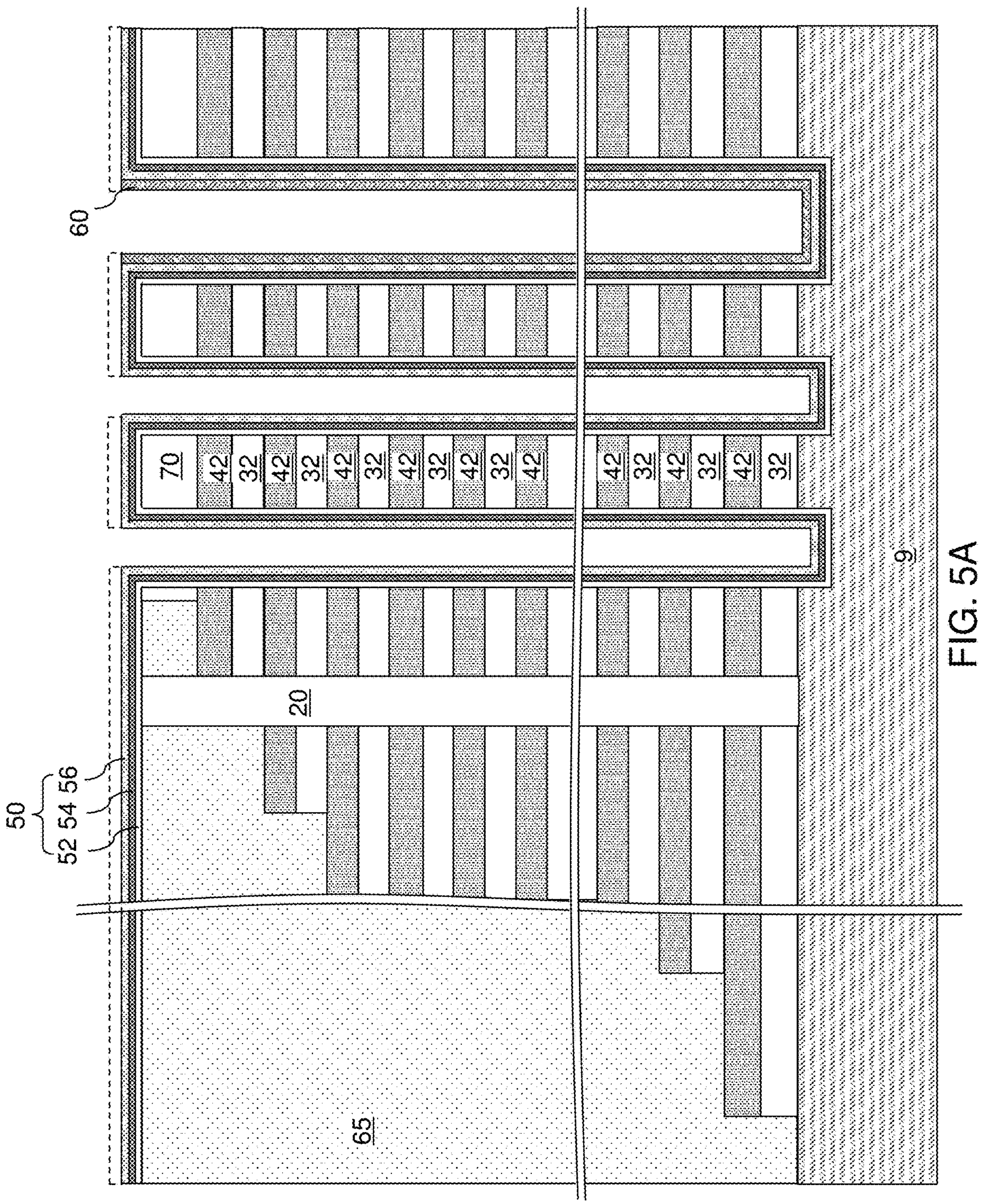
FIG. 5A is a schematic vertical cross-sectional view of the first exemplary structure after performing a curvature-dependent lateral etch process according to the first embodiment of the present disclosure.
Figure 5B:
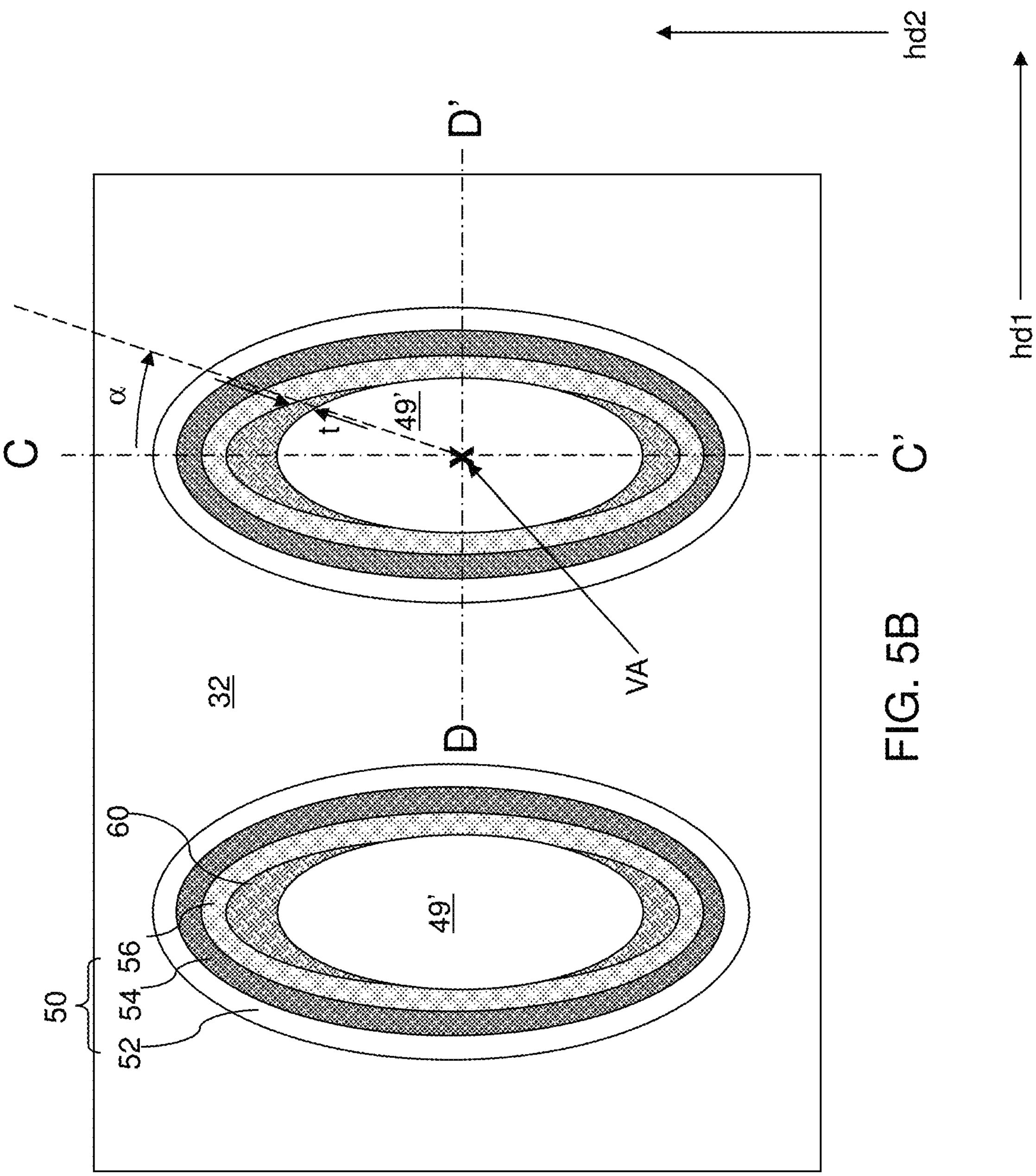
FIG. 5B is a horizontal cross-sectional view of a region of the first exemplary structure of FIG. 5A.
Figure 5D:
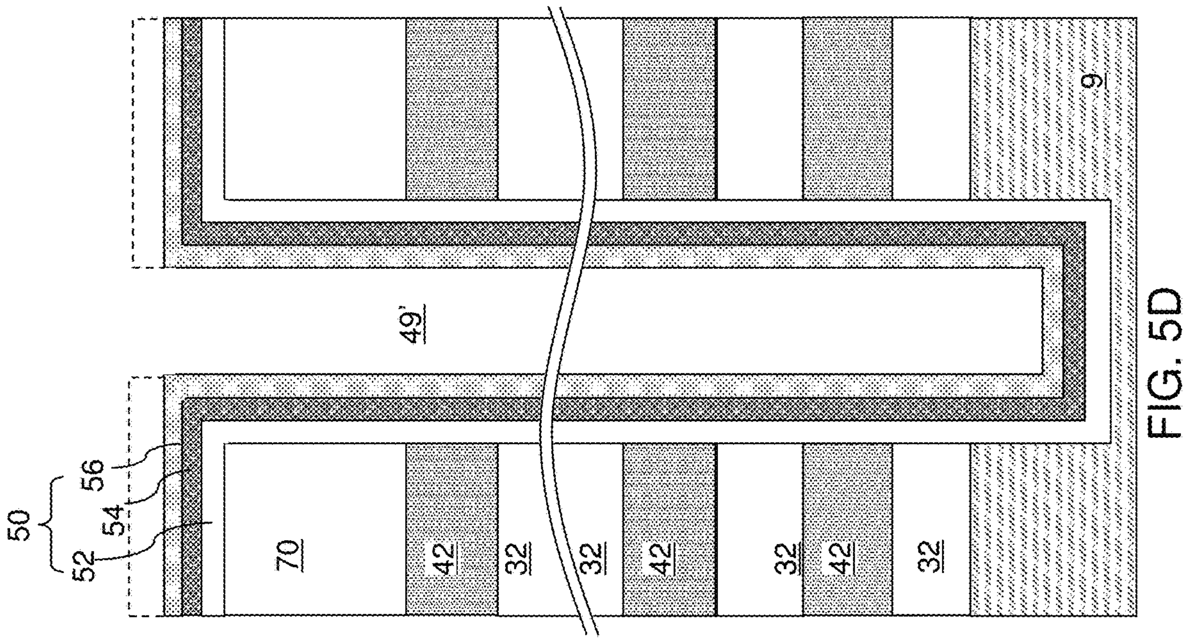
FIG. 5D is a vertical cross-sectional view the first exemplary structure along the vertical cross-sectional plane D-D' of FIG. 5B.
Figure 5C:
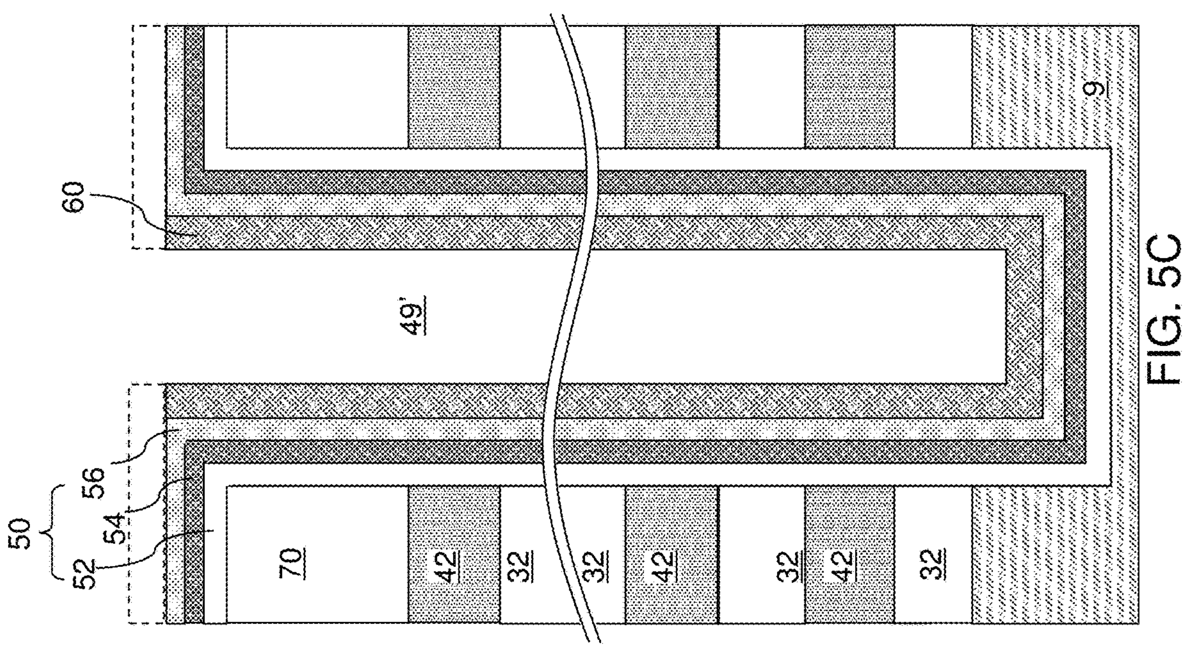
FIG. 5C is a vertical cross-sectional view the first exemplary structure along the vertical cross-sectional plane C-C' of FIG. 5B.

Referring to FIGS. 3A and 3B, a lithographic material stack (not shown) including at least a photoresist layer can be formed over the insulating cap layer 70 and the retro-stepped dielectric material portion 65, and can be lithographically patterned to form openings therein. Memory openings 49 are formed through the insulating cap layer 70 and each layer of the alternating stack (32, 42) in the memory array region 100. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The patterned lithographic material stack can be subsequently removed, for example, by ashing. In an alternative embodiment, the via cavities for the support pillar structures 20 may be formed during the same step as the memory openings 49.

The memory openings 49 can be arranged in rows that laterally extend along a first horizontal direction (e.g., word line direction) hd1 that is perpendicular to interfaces between the retro-stepped dielectric material portion 65 and vertical sidewalls of the layers within the alternating stack (32, 42). Each row of memory openings 49 can include a plurality of memory openings 49 that are arranged along the first horizontal direction hd1. The rows of memory openings 49 can be laterally spaced apart along a second horizontal direction (e.g., bit line direction) hd2 that is perpendicular to the first horizontal direction hd1. In one embodiment, a set of rows of memory openings 49 (such as a set of four rows memory openings 49 as illustrated in FIG. 3B) can be provided as a cluster between a neighboring pair of areas that are free of memory openings 49.

According to an aspect of the present disclosure, the memory openings 49 can be laterally elongated along the second horizontal direction hd2. The ratio of the maximum lateral dimension of a memory opening 49 along the second horizontal direction hd2 relative to the maximum lateral dimension of the memory opening 49 along the first horizontal direction hd1 can be in a range from 1.5 to 6, such as from 2 to 4, although lesser and greater ratios may also be employed. The maximum lateral dimension of each memory opening 49 along the first horizontal direction hd1 may be in a range from 30 nm to 300 nm, although lesser and greater dimensions may also be employed. Generally, each of the memory openings 49 can have a laterally-elongated shape having a first lateral dimension along the first horizontal direction hd1 (such as the maximum lateral direction along the first horizontal direction hd1) and a second lateral dimension along the second horizontal direction hd2 (such as the maximum lateral direction along the second horizontal direction hd2) that is greater than the first lateral dimension.

Referring to FIGS. 4A-4D, a stack of layers including a blocking dielectric layer 52, a charge storage layer 54, a tunneling dielectric layer 56, and a semiconductor channel layer 60L can be sequentially deposited in the memory openings 49. In an alternative embodiment, if the support pillar structures 20 are not formed at the step of FIG. 2A, then the stack of layers may also be formed in the via cavities in the contact region 300.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the three-dimensional NAND memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The combination of the tunneling dielectric layer 56, the charge storage layer 54, and the blocking dielectric layer 52 constitutes a memory film 50.

The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 5 nm to 40 nm, although lesser and greater thicknesses can also be employed. A memory cavity is formed in the volume of each memory opening 49 that is not filled with the deposited material layers (52, 54, 56, 60L). The semiconductor channel layer 60L can be deposited as a polycrystalline semiconductor material layer, or may be deposited as an amorphous semiconductor material layer and may be subsequently converted into a polycrystalline semiconductor material layer by performing an anneal process.

In an optional embodiment, dopants of a second conductivity type (e.g., n-type dopants such as phosphorus or arsenic for silicon channel layer 60L) may be implanted into a top portion (e.g., horizontal portion) of the semiconductor channel layer 60L. The implanted portion may be used as an etch stop to prevent or reduce etching of the top (e.g., horizontal) portion of the semiconductor channel layer 60L.

Referring to FIGS. 5A-5D and according to an aspect of the present disclosure, a curvature-dependent lateral etch process (e.g., a slimming process) can be performed to etch back portions of the semiconductor channel layer 60L. The curvature-dependent lateral etch process can be an isotropic etch process that etches the semiconductor material of the semiconductor channel layer 60L at surface portions having a lower curvature (i.e., a greater radius of curvature) faster (i.e., at a greater rate) than at surface portions having a higher curvature (i.e., i.e., a smaller radius of curvature). A curvature of a surface refers to the reciprocal of a radius of curvature of the surface. The radius of curvature of any surface can be defined by the radius of a sphere or a cylinder that tangentially touches the surface. In one embodiment, the curvature dependent lateral etch process may be a wet etch process employing hot trimethyl-2 hydroxyethyl ammonium hydroxide ("hot TMY") or tetramethyl ammonium hydroxide (TMAH).

Portions of the semiconductor channel layer 60L that generally extend laterally along the second horizontal direction hd2 (i.e., in areas of lower curvature) can be removed, while portions of the semiconductor channel layer 60L located in areas of higher curvature at azimuthal directions from the geometrical center of each memory opening 49 remain, and constitute discrete vertical semiconductor channels 60. In other words, remaining portions of the semiconductor channel layer 60L comprise pairs of discrete vertical semiconductor channels 60 located within a respective one of the memory openings 49. If the protective ion implant is not performed after the step shown in FIG. 4A, then the curvature-dependent lateral etch process also etches (e.g., completely removes) the top horizontal semiconductor channel layer 60L from above the insulating cap layer 70. If the protective ion implant is performed after the step shown in FIG. 4A, then the curvature-dependent lateral etch process does not completely remove the top horizontal portions of the semiconductor channel layer 60L (shown in dashed lines in FIGS. 5A, 5C and 5D) from above the insulating cap layer 70, because the heavier doped top horizontal portions of the semiconductor material are etched at a lower rate than lighter doped or undoped vertical portions of the semiconductor material located in the memory openings 49. The memory film 50 may remain on top of the insulating cap layer 70.

Generally, two discrete vertical semiconductor channels 60 that are disjoined from each other can be formed within each memory opening 49. Each vertical semiconductor channel 60 can have a respective crescent-shaped horizontal cross-sectional profile. As used herein, a crescent-shaped horizontal cross-sectional profile refers to a horizontal cross-sectional profile having a crescent shape, which has an outer convex surface and an inner concave surface having a greater radius of curvature than the outer convex surface. Within each memory opening 49, the two vertical semiconductor channels 60 can be laterally spaced from each other along the second horizontal direction hd2 by a respective void, which is herein referred to as a memory cavity 49'. The minimum thickness of memory cavity 49' along the second horizontal direction may be at least 25 nm, such as 50 nm to 75 nm.

The memory film 50 can contact an entirety of outer sidewalls of the two vertical semiconductor channels 60 within each memory opening 49. In one embodiment, the memory film 50 can comprise a tunneling dielectric layer that contacts the two vertical semiconductor channels 60. In one embodiment, each memory opening 149 can contain two vertical semiconductor channels 60 therein, and the two vertical semiconductor channels 60 can have a maximum lateral thickness along the second horizontal direction hd2, and can have a variable lateral thickness t that decreases with an increase in an azimuthal angle α around a vertical axis VA passing through a geometrical center of the laterally-elongated shape of the memory opening 49 as measured from the second horizontal direction hd2. In one embodiment, the laterally-elongated shape can be the shape of an oval or an ellipse, and the geometrical center of the laterally-elongated shape can be the center of the oval or the ellipse.

Referring to FIGS. 6A-6D, a dielectric core layer 62L can be deposited within each memory opening 49 on physically exposed surfaces of a respective pair of vertical semiconductor channels 60. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 6A:
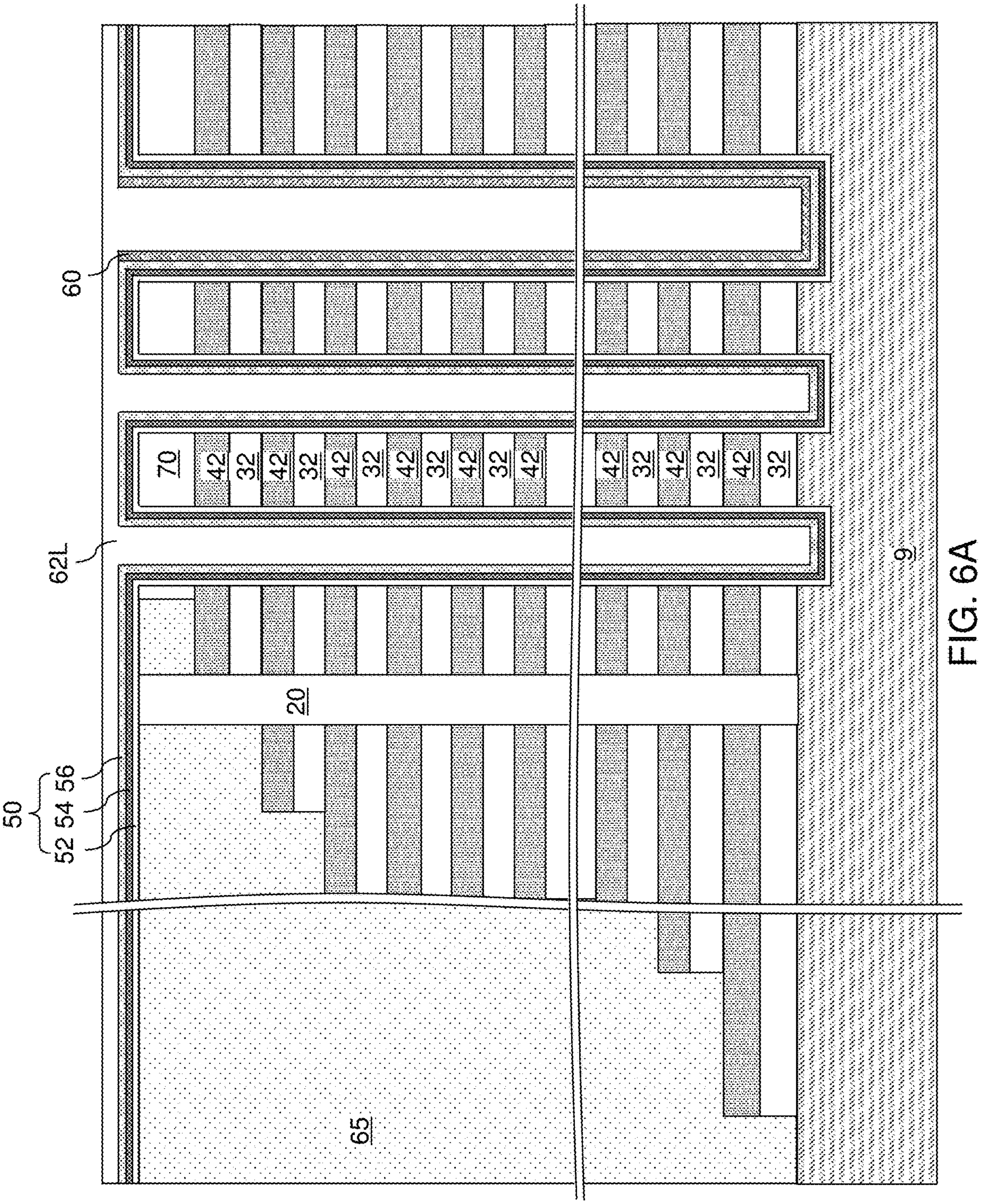
FIG. 6A is a schematic vertical cross-sectional view of the first exemplary structure after depositing a dielectric core layer according to the first embodiment of the present disclosure.
Figure 6B:
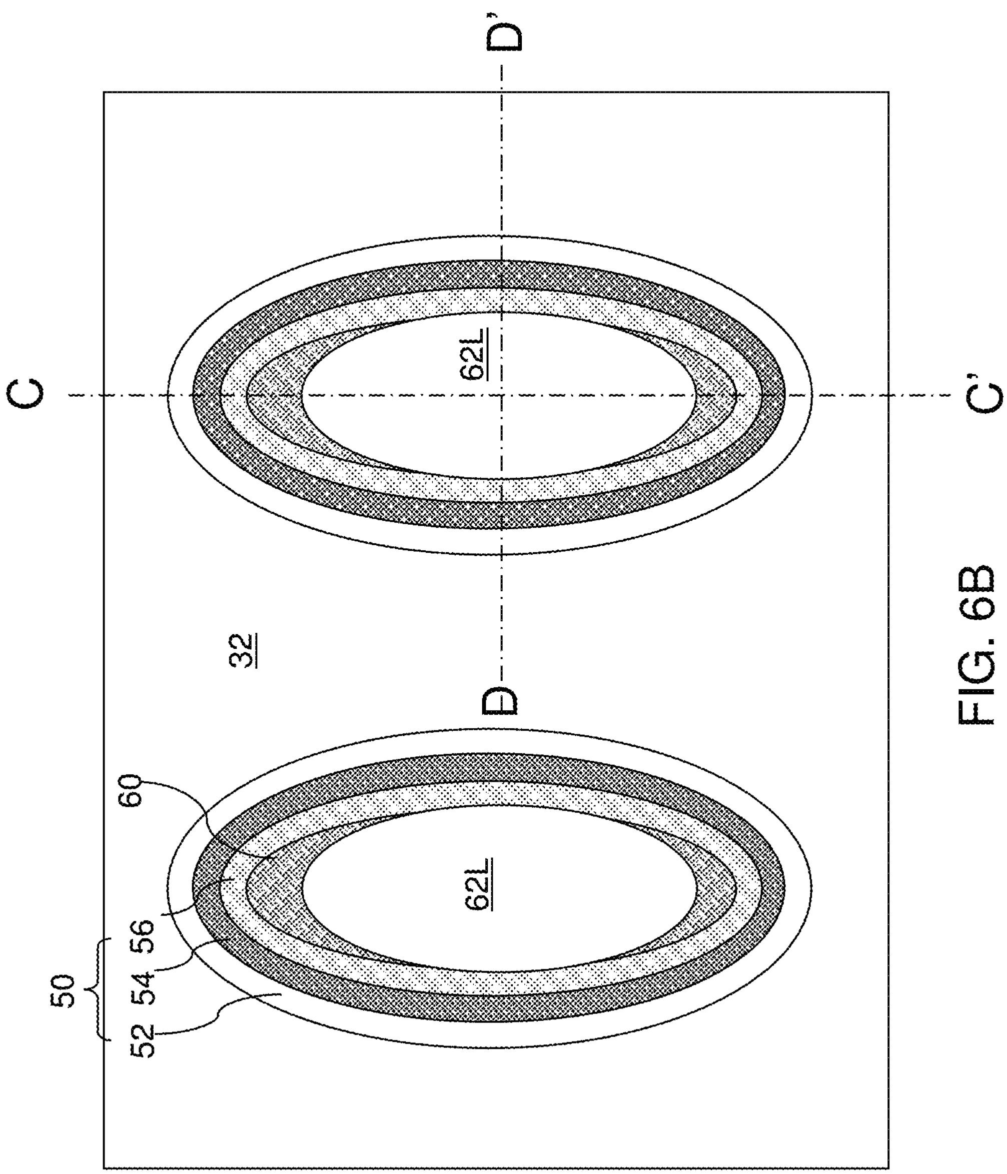
FIG. 6B is a horizontal cross-sectional view of a region of the first exemplary structure of FIG. 6A.
Figure 6C:
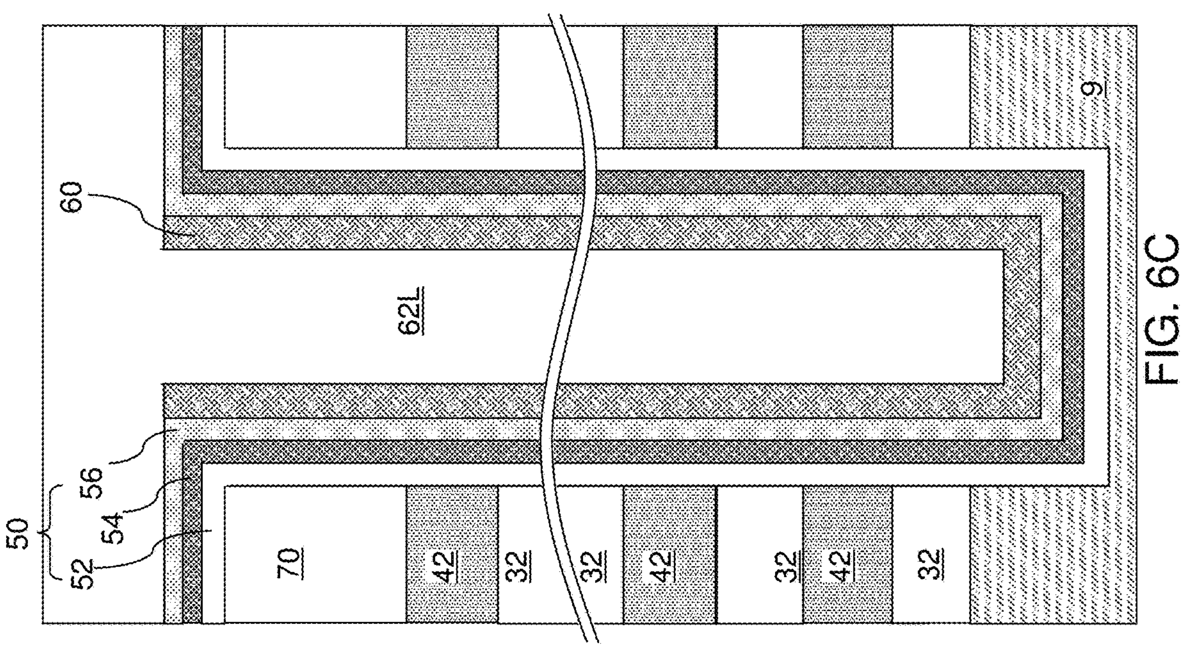
FIG. 6C is a vertical cross-sectional view the first exemplary structure along the vertical cross-sectional plane C-C' of FIG. 6B.
Figure 6D:
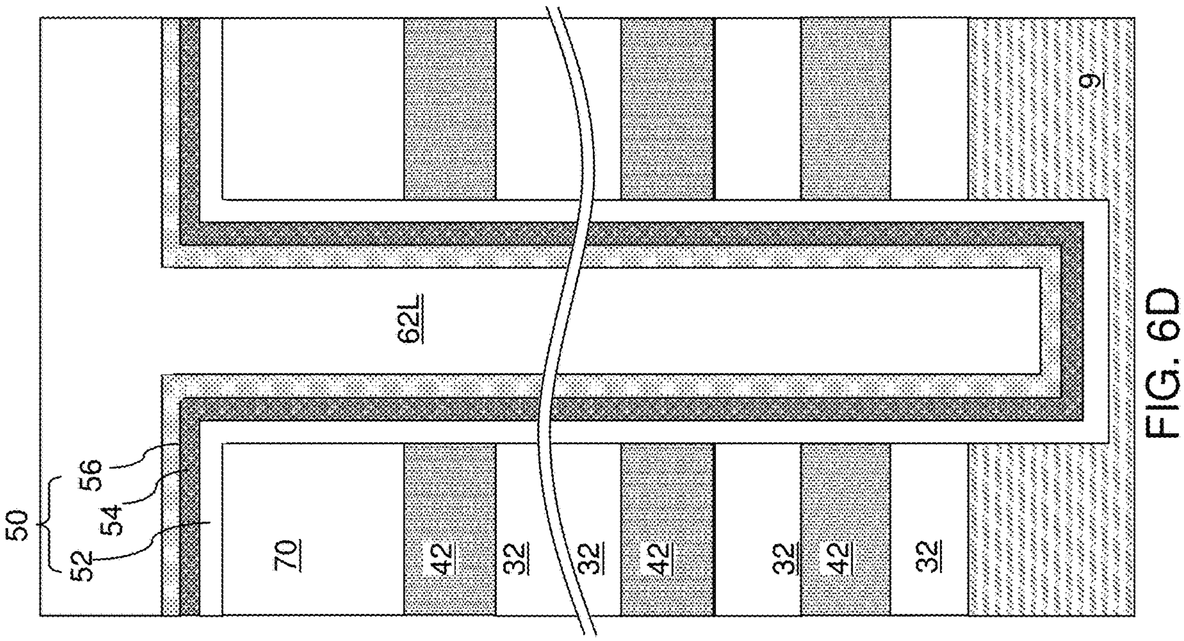
FIG. 6D is a vertical cross-sectional view the first exemplary structure along the vertical cross-sectional plane D-D' of FIG. 6B.
Figure 6E:
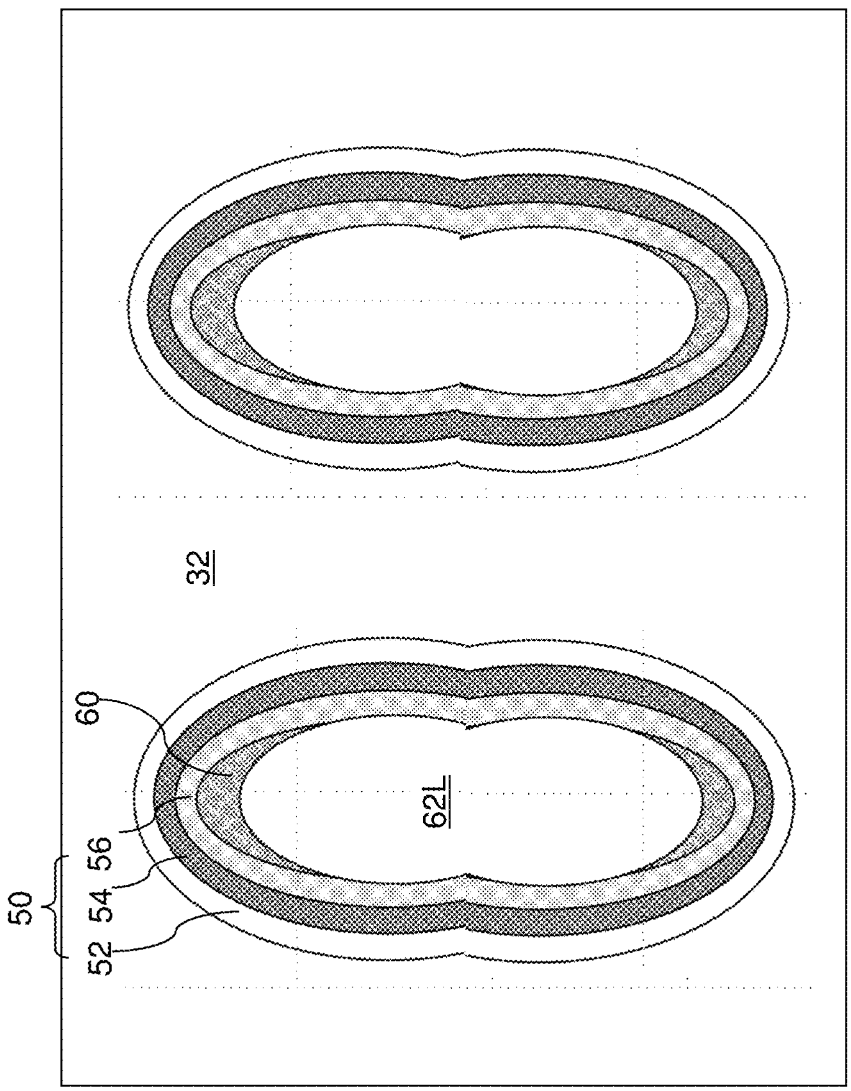
FIG. 6E is a horizontal cross-sectional view of a region of an alternative configuration of the first exemplary structure at the processing steps of FIGS. 6A-6D.

Referring to FIG. 6E, an alternative configuration of the first exemplary structure is illustrated. In this case, each memory opening 49 can be formed with a constricted center portion such that the curvature of the portions of the semiconductor channel layer 60L that are formed at the processing steps of FIGS. 4A-4D has a negative curvature (i.e., a convex surface). Generally, a pair of vertical semiconductor channels 60 that are laterally spaced apart along the elongated direction can be formed within each memory opening 49.

Figure 7A:
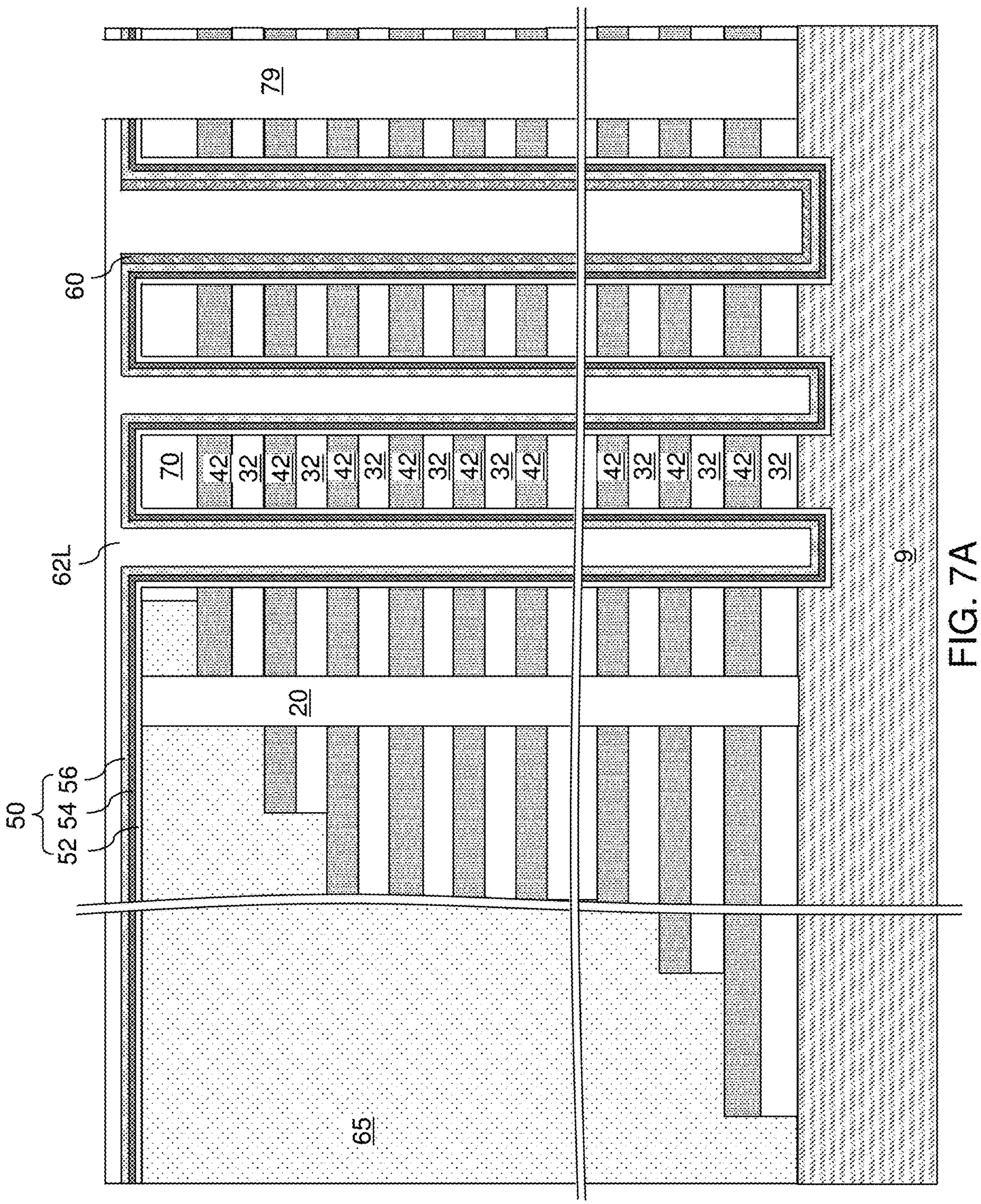
FIG. 7A is a schematic vertical cross-sectional view of the first exemplary structure after formation of backside trenches according to the first embodiment of the present disclosure.
Figure 7B:
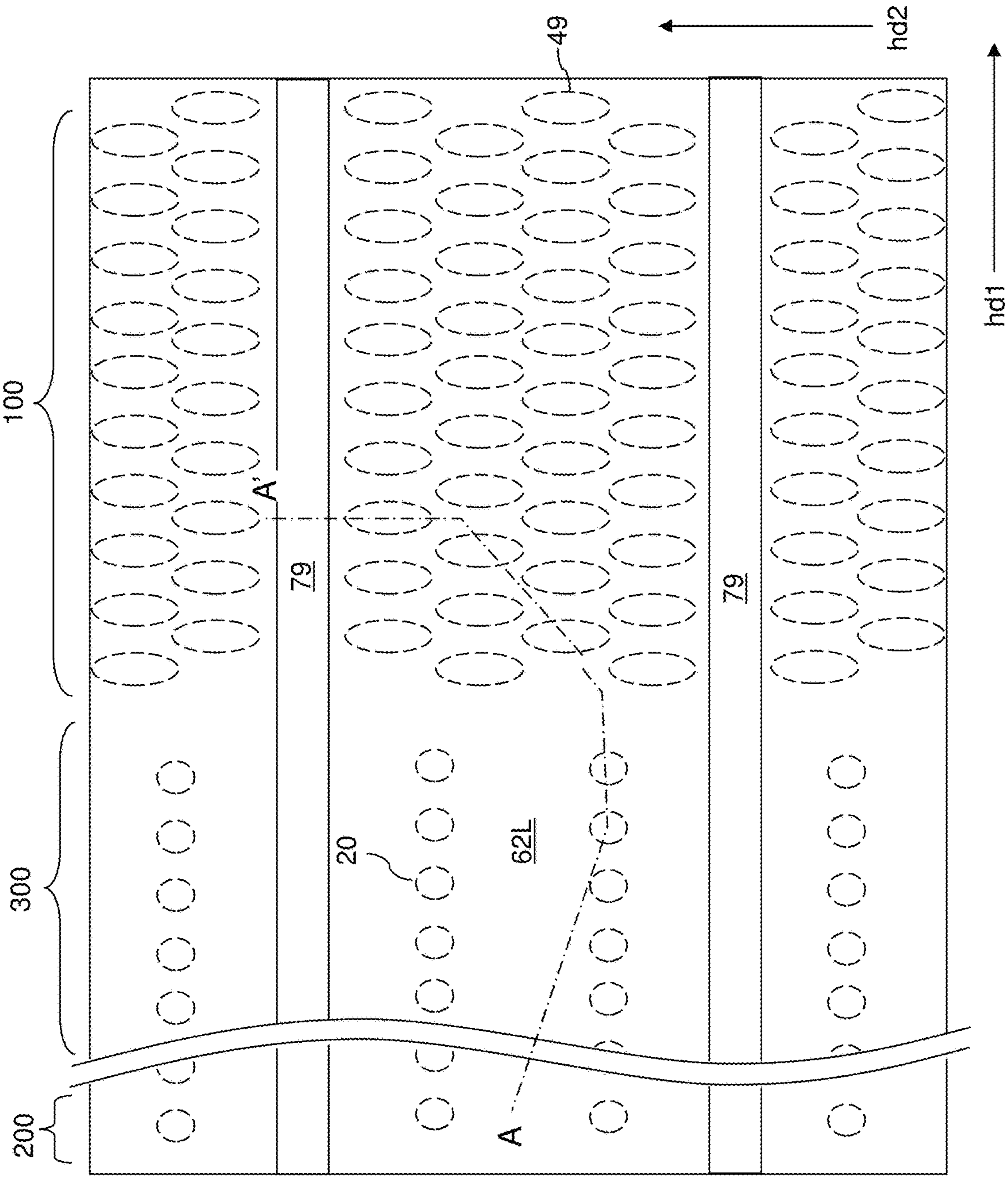
FIG. 7B is a top-down view of the first exemplary structure of FIG. 7A.

Referring to FIGS. 7A and 7B, a photoresist layer (not shown) can be applied over the dielectric core layer 62L, and is lithographically patterned to form openings in areas between clusters of memory openings 49. The pattern in the photoresist layer can be transferred through horizontally-extending portions of the dielectric core layer 62L and the memory film 50, the insulating cap layer 70, the alternating stack (32, 42), and/or the retro-stepped dielectric material portion 65 employing an anisotropic etch to form backside trenches 79, which vertically extend from the top surface of the insulating cap layer 70 at least to the top surface of the substrate semiconductor layer 9, and laterally extend through the memory array region 100 and the contact region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory openings 49 can be arranged in rows that extend along the first horizontal direction hd1. Each backside trench 79 can have a uniform width that is invariant along the lengthwise direction (i.e., along the first horizontal direction hd1). Multiple rows of memory openings 49 can be located between a neighboring pair of a backside trench 79. The photoresist layer can be removed, for example, by ashing.

Figure 8:
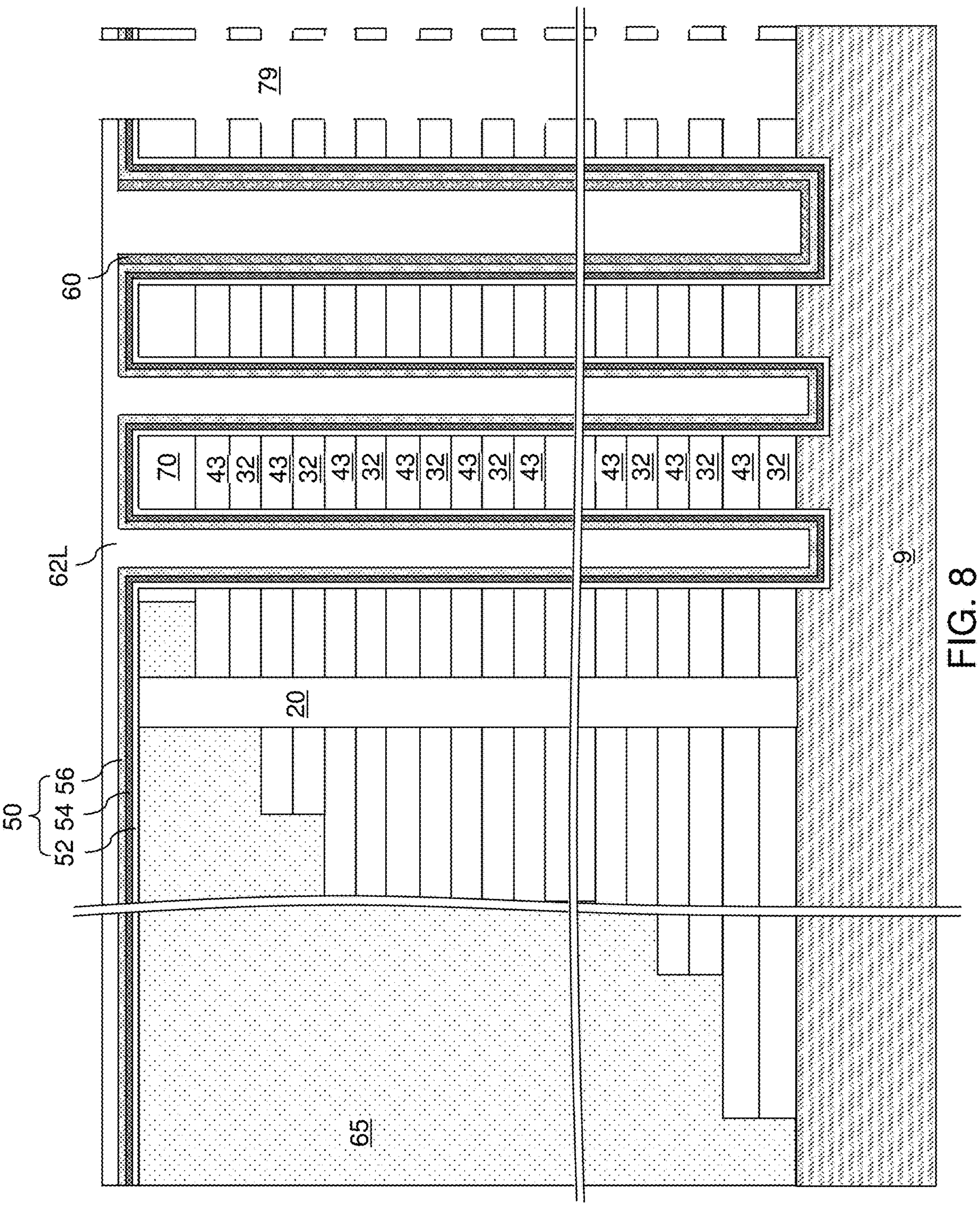
FIG. 8 is a schematic vertical cross-sectional view of the first exemplary structure after formation of backside recesses according to the first embodiment of the present disclosure.

Referring to FIG. 8, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the substrate semiconductor layer 9, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the layers filling the memory openings 49 provide structural support while the backside recesses 43 are present within volumes previously occupied by the sacrificial material layers 42.

Figure 9:
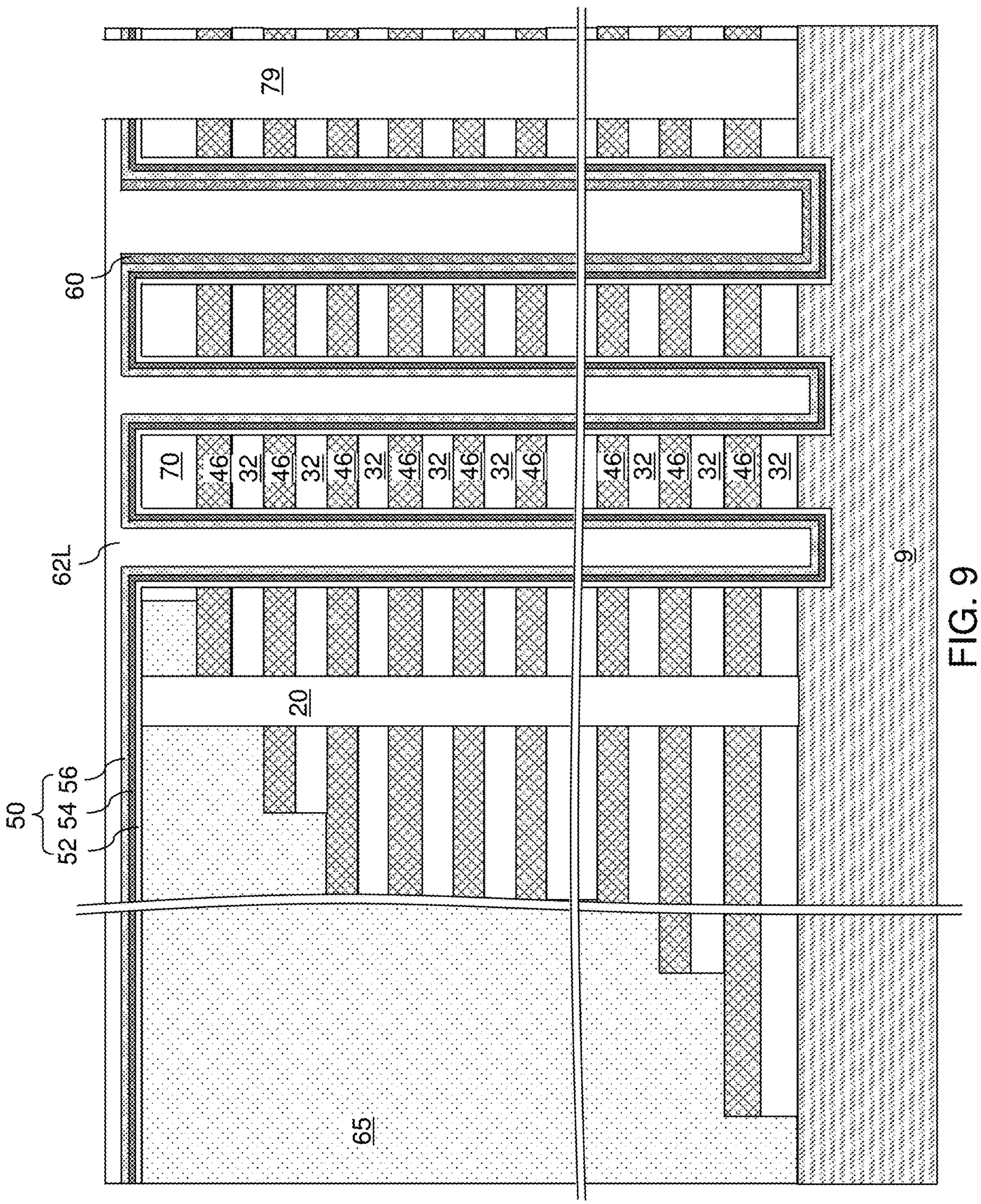
FIG. 9 is a schematic vertical cross-sectional view of the first exemplary structure after formation of electrically conductive layers according to the first embodiment of the present disclosure.

Referring to FIG. 9, an optional backside blocking dielectric layer (not shown), such as an aluminum oxide layer, can be optionally formed in the backside recesses 43. At least one metallic material can be subsequently deposited in the backside recesses 43 and at peripheral regions of the backside trenches 79. For example, a metallic barrier layer and a metallic fill material can be sequentially deposited by conformal deposition processes.

The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material is deposited in the plurality of backside recesses 43, on the sidewalls of the at least one the backside trench 79, and over the top surface of the dielectric core layer 62L to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities.

A plurality of electrically conductive layers 46 can be formed in the plurality of backside recesses 43, and a continuous metallic material layer can be formed on the sidewalls of each backside trench 79 and over the dielectric core layer 62L. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the dielectric core layer 62L.

The deposited metallic material of the continuous electrically conductive material layer is etched back from the sidewalls of each backside trench 79 and from above the dielectric core layer 62L, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Figure 10:
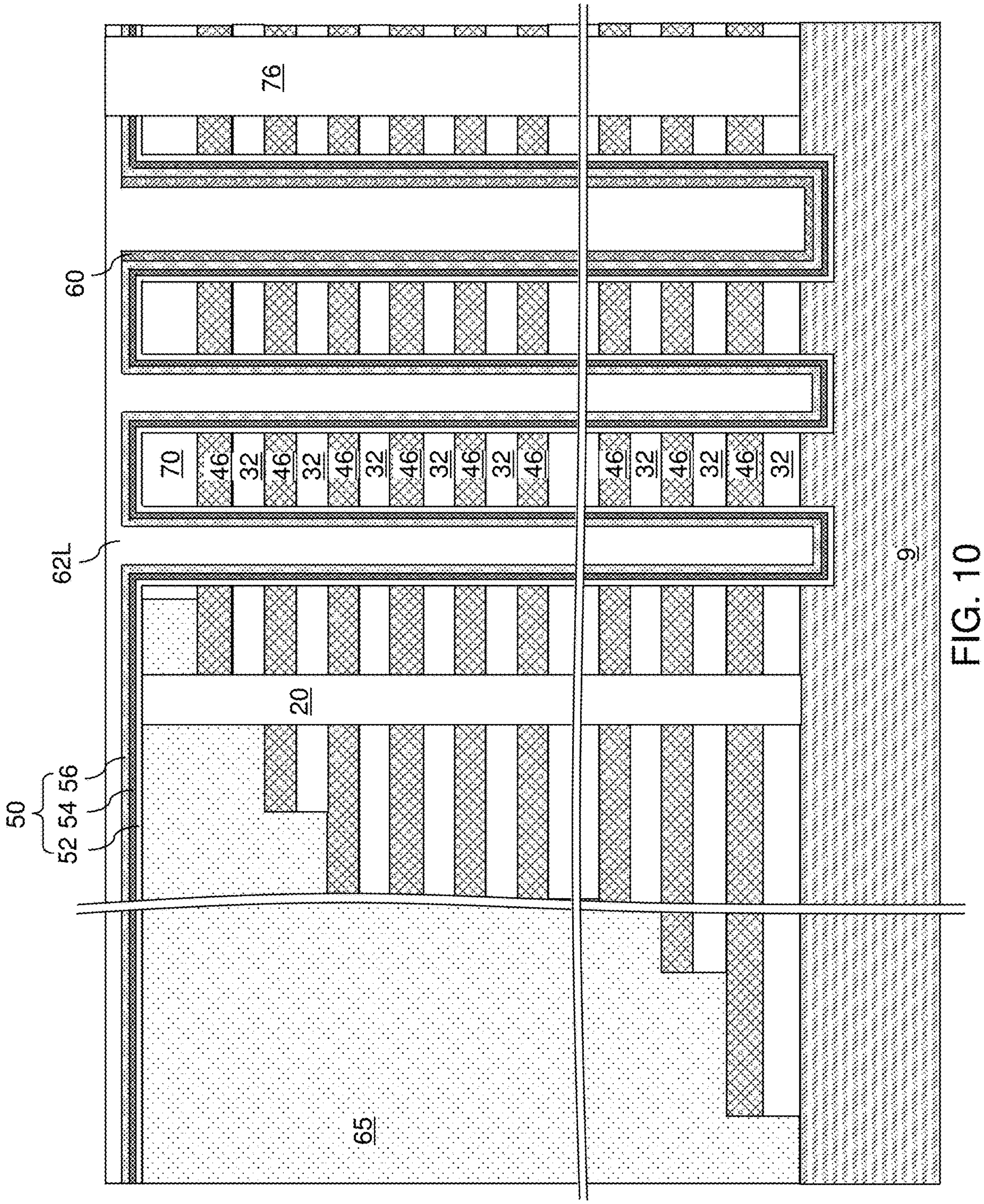
FIG. 10 is a schematic vertical cross-sectional view of the first exemplary structure after formation of backside trench fill structures according to the first embodiment of the present disclosure.

Referring to FIG. 10, a dielectric material such as silicon oxide can be deposited in the backside trenches 79 to form backside trench fill structures 76. In an alternative embodiment, a source region may be implanted into the substrate semiconductor layer 9 through the backside trenches. Then, a combination of an insulating spacer and an electrically conductive source electrode (e.g., source local interconnect) which contacts the source region may be formed in the backside trenches.

Figure 11A:
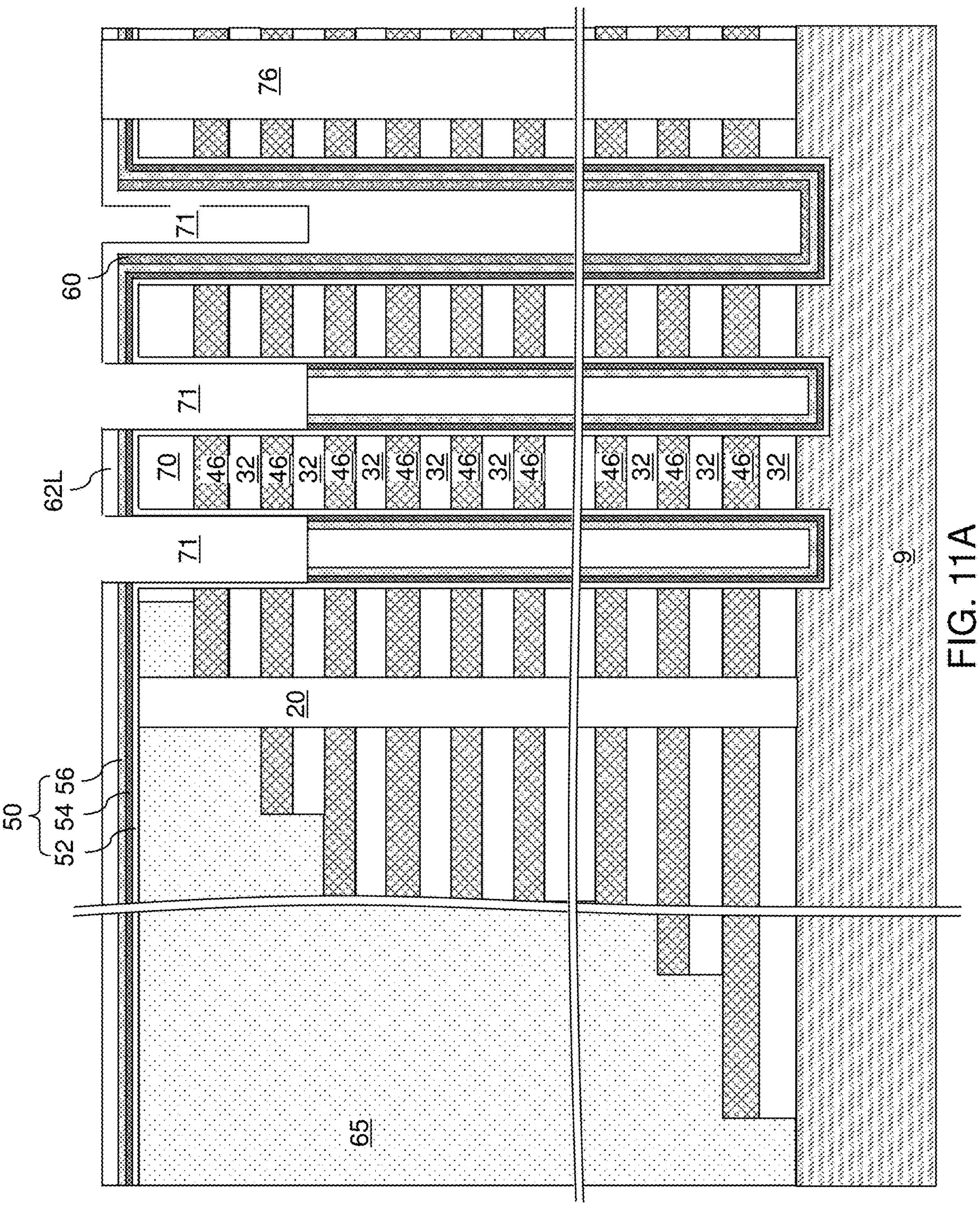
FIG. 11A is a schematic vertical cross-sectional view of the first exemplary structure after formation of drain-select-level isolation trenches according to the first embodiment of the present disclosure.
Figure 11B:
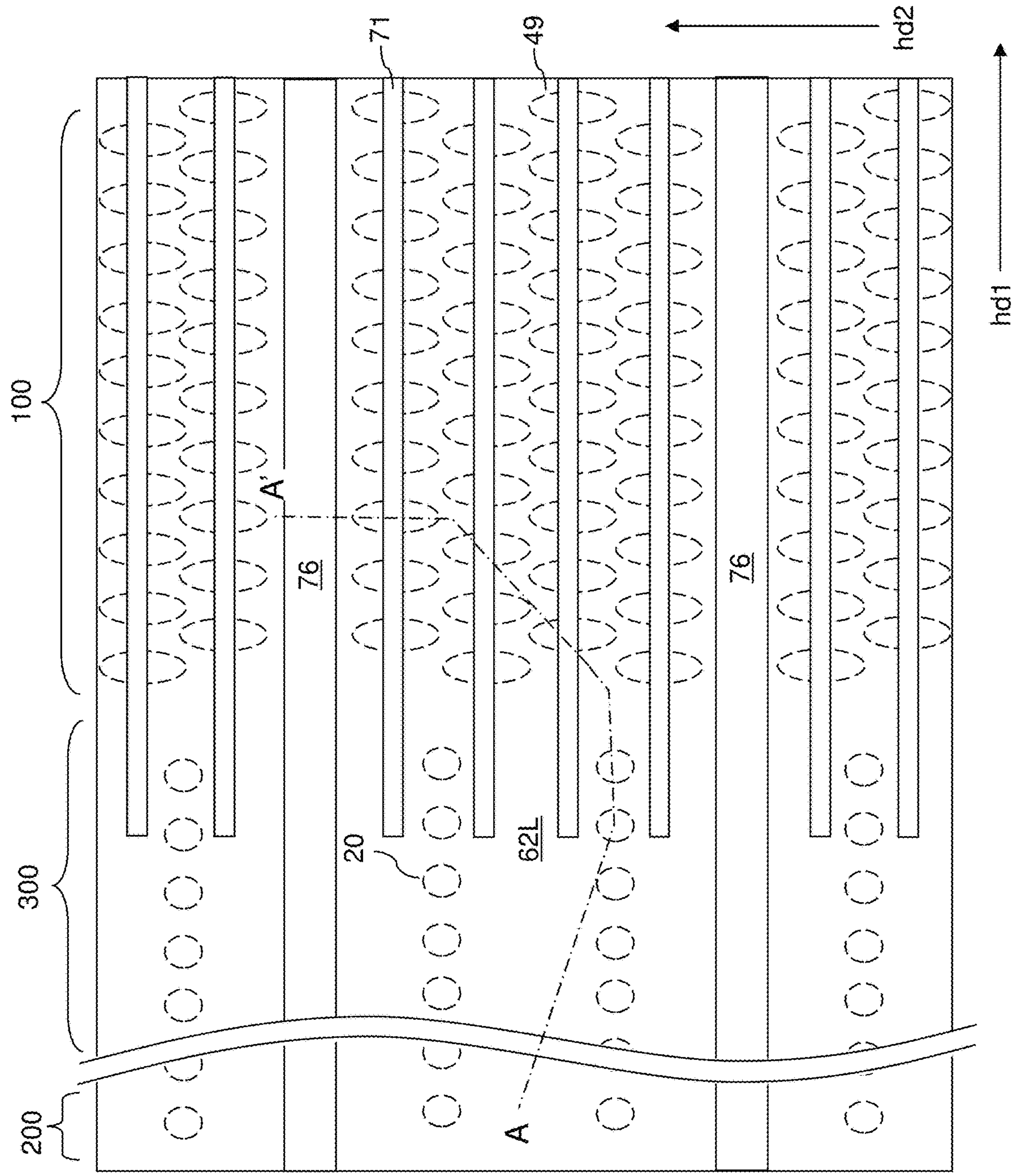
FIG. 11B is a top-down view of the first exemplary structure of FIG. 11A.

Referring to FIGS. 11A and 11B, a photoresist layer (not shown) can be applied over the dielectric core layer 62L, and can be lithographically patterned to form elongated rectangular openings that laterally extend along the first horizontal direction hd1. According to an aspect of the present disclosure, the elongated rectangular openings can be formed over a respective row of memory openings 49 such that each elongated rectangular opening extends over center regions of a respective row of memory openings 49.

An anisotropic etch process can be performed to transfer the pattern of the rectangular openings through electrically conductive layers 46 located at drain select levels. As used herein, a drain select level refers to a level of an electrically conductive layer 46 (i.e., a drain side select gate electrode) that is employed to activate or deactivate a vertical semiconductor channel 60 from a drain side, which is the side of the upper end of each vertical semiconductor channel 60. The total number of levels of the electrically conductive layers 46 that are employed as drain select levels may be in a range from 1 to 8, such as from 2 to 4, although lesser and greater numbers may also be employed. The trenches formed by the anisotropic etch process are herein referred to as drain-select-level isolation trenches 71. The drain-select-level isolation trenches 71 are formed into upper portions of the memory openings 49 and through a topmost one of the electrically conductive layers 46 and optionally through additional electrically conductive layers 46 that underlie the topmost one of the electrically conductive layers 46. The drain-select-level isolation trenches 71 are formed into upper portions of the memory openings 49 in every row of memory openings 49 which extends in the first horizontal direction hd1.

Figure 12A:
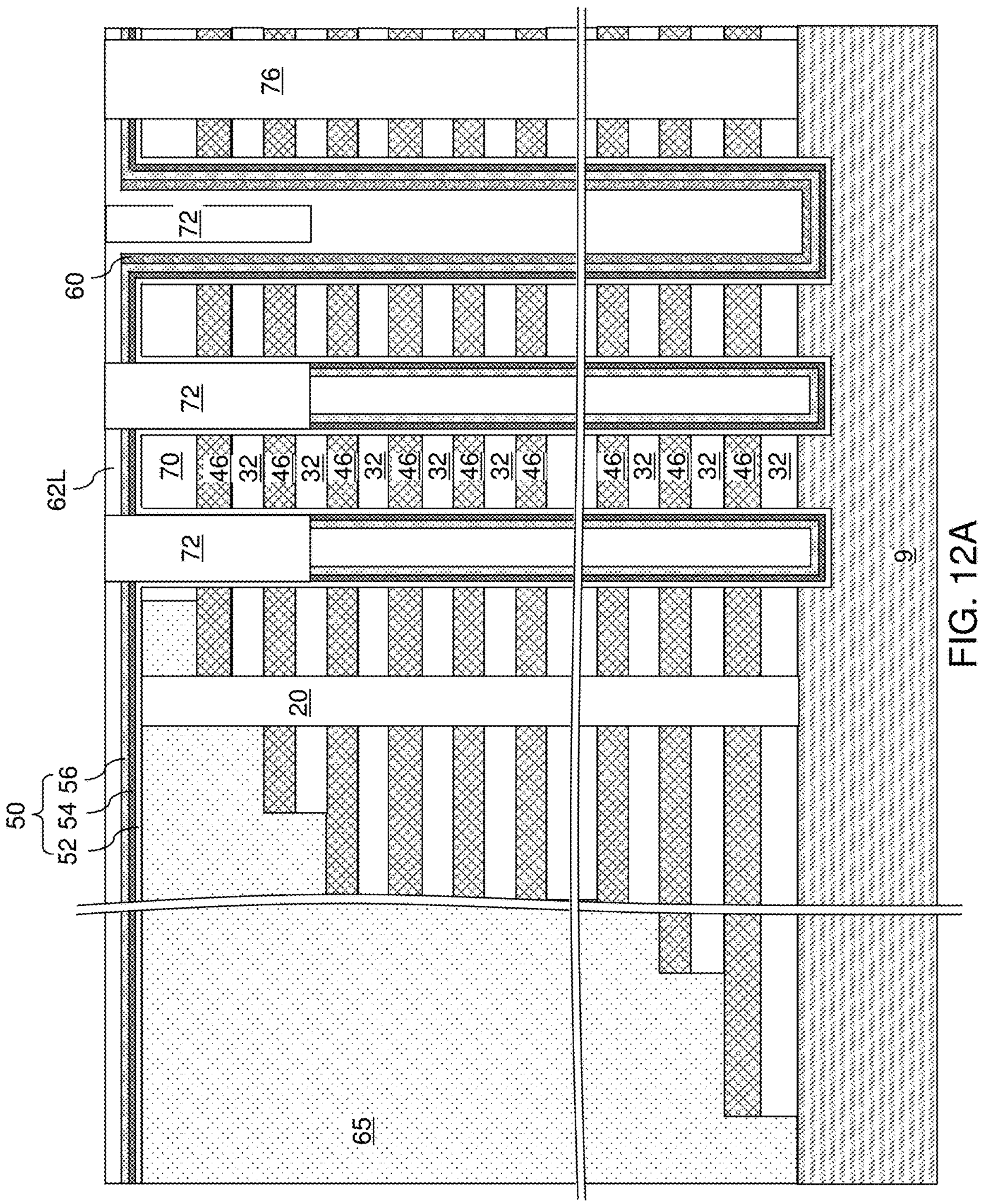
FIG. 12A is a schematic vertical cross-sectional view of the first exemplary structure after formation of drain-select-level dielectric isolation structures according to the first embodiment of the present disclosure.
Figure 12B:
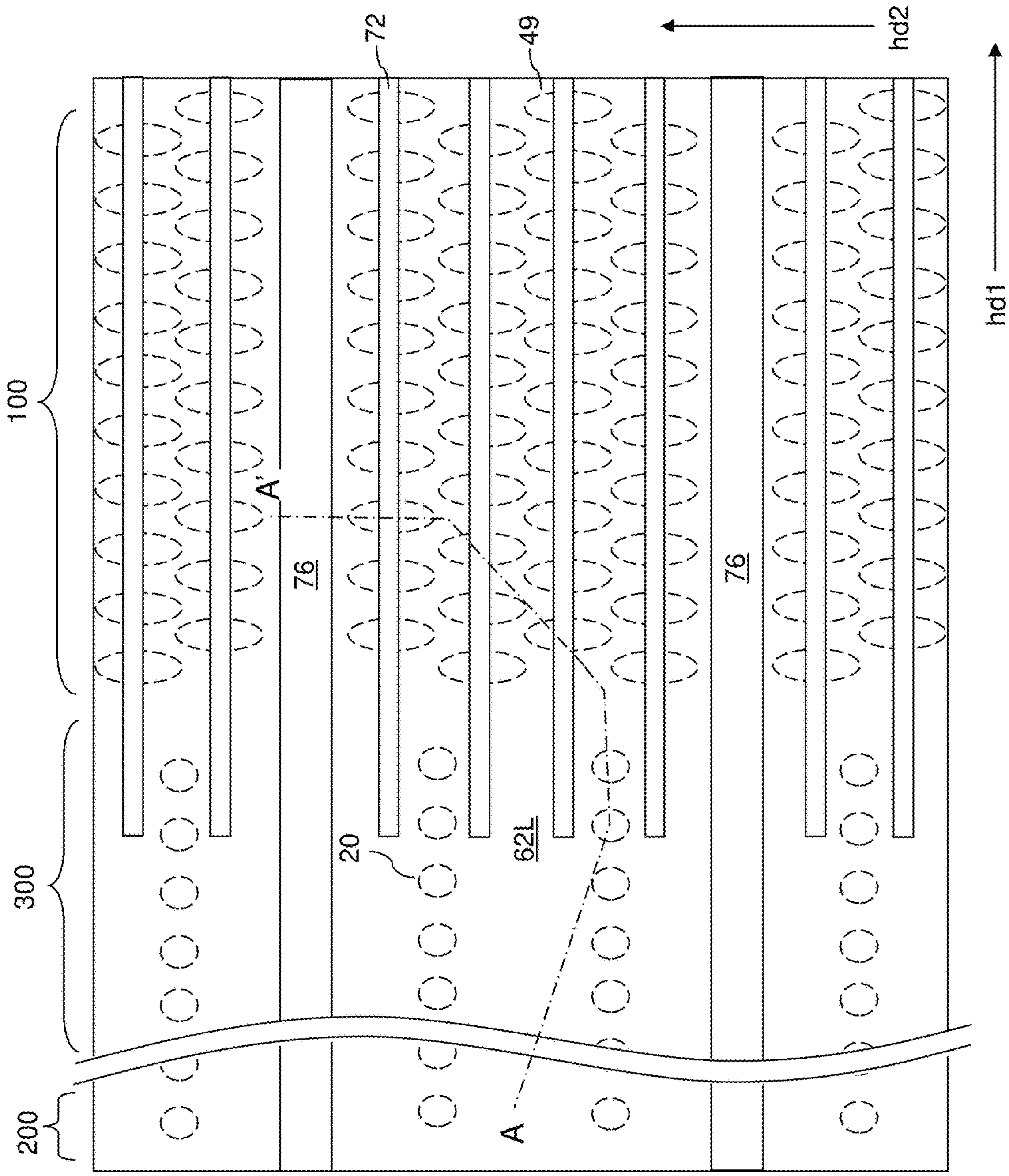
FIG. 12B is a top-down view of the first exemplary structure of FIG. 12A.

Referring to FIGS. 12A and 12B, a dielectric fill material such as silicon oxide can be deposited in the drain-select-level isolation trenches 71 by a conformal deposition process such as a chemical vapor deposition process. Portions of the dielectric fill material that fill the drain-select-level isolation trenches 71 constitute drain-select-level dielectric isolation structures 72 which divide the drain side select gate electrodes but not the underlying word lines.

Figure 13A:
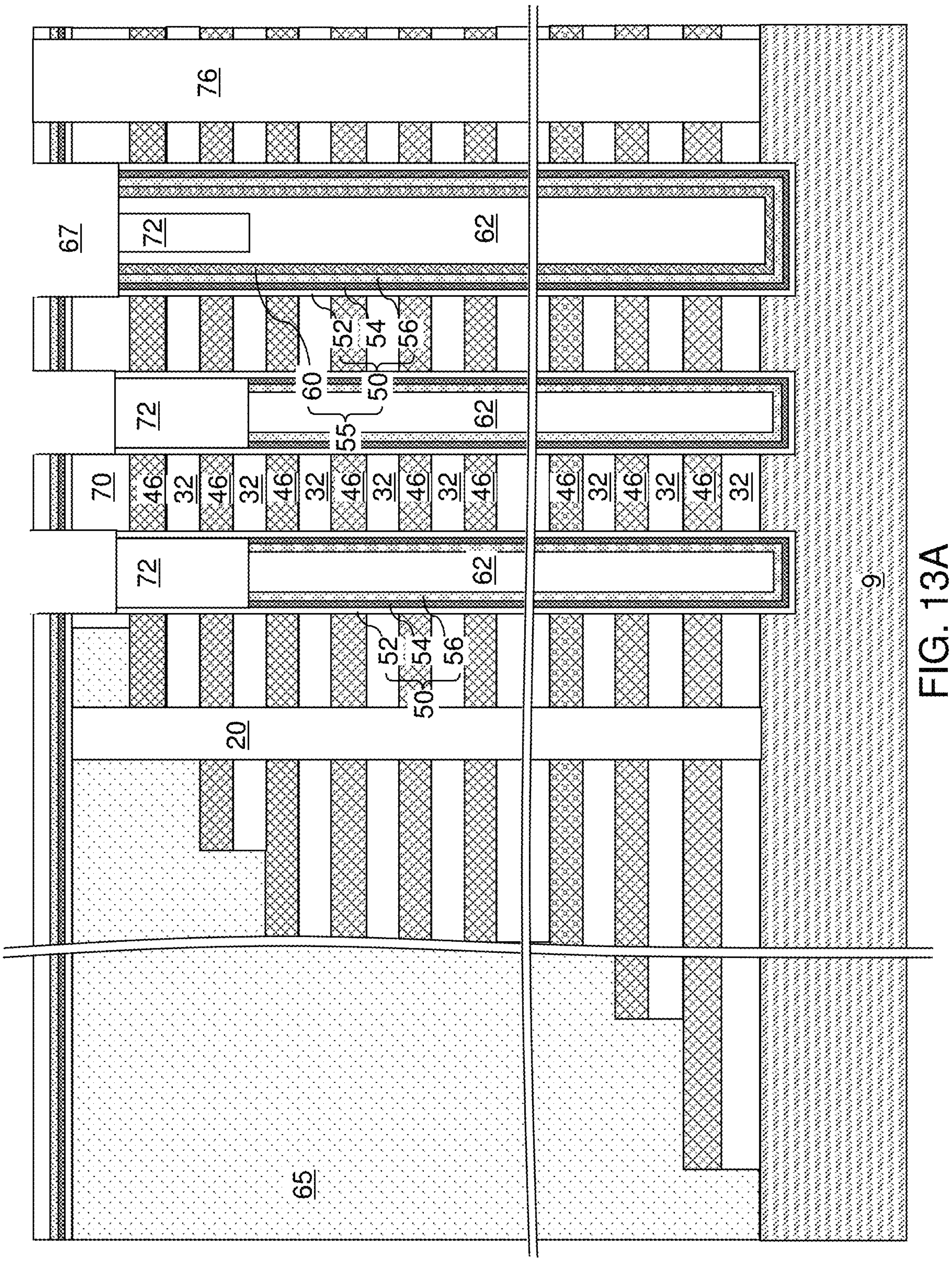
FIG. 13A is a schematic vertical cross-sectional view of the first exemplary structure after formation of drain-level recesses according to the first embodiment of the present disclosure.
Figure 13B:
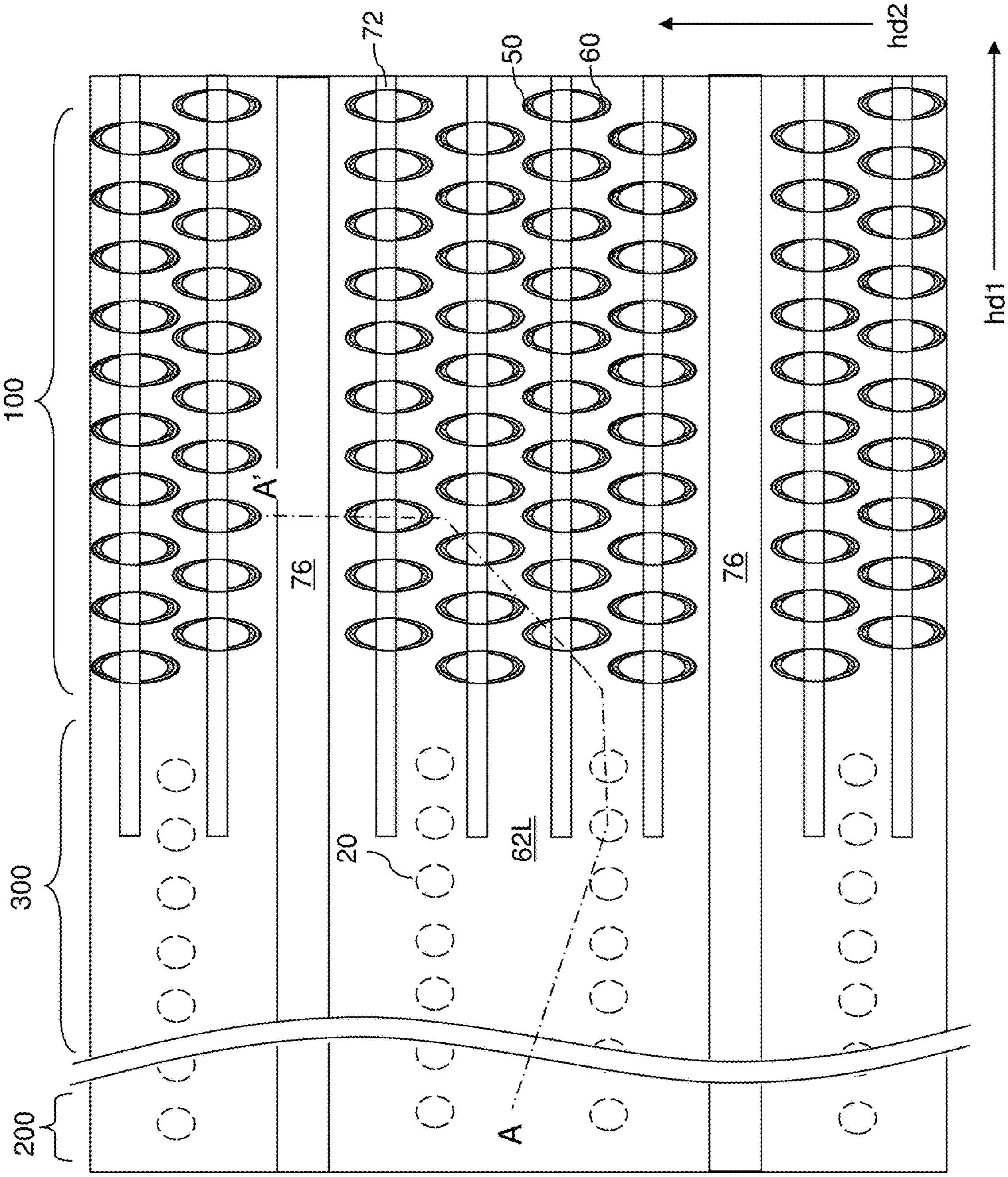
FIG. 13B is a top-down view of the first exemplary structure of FIG. 13A.

Referring to FIGS. 13A and 13B, areas of the memory openings 49 can be vertically recessed to form drain-level recesses 67. For example, a photoresist layer (not shown) can be applied over the dielectric core layer 62L, and can be lithographically patterned with the same pattern as the pattern of the memory openings 49. The pattern in the photoresist layer can be transferred through the horizontally-extending portions of the dielectric core layer 62L and the memory film 50, and through volumes of the memory openings 49 located above the horizontal plane including the bottom surface of the insulating cap layer 70. Volumes of the memory openings 49 that include upper portions of the drain-select-level dielectric isolation structures 72 can be vertically recessed. Specifically, portions of the drain-selectlevel dielectric isolation structures 72, the dielectric core layer 62L, the vertical semiconductor channels 60, and the memory films 50 can be vertically recessed underneath each opening in the photoresist layer. Each remaining portion of a dielectric core layer 62L comprises a dielectric core 62. Surfaces of a pair of vertical semiconductor channels 60 can be exposed within each drain-level recess 67. The photoresist layer can be subsequently removed, for example, by ashing.

Figure 14A:
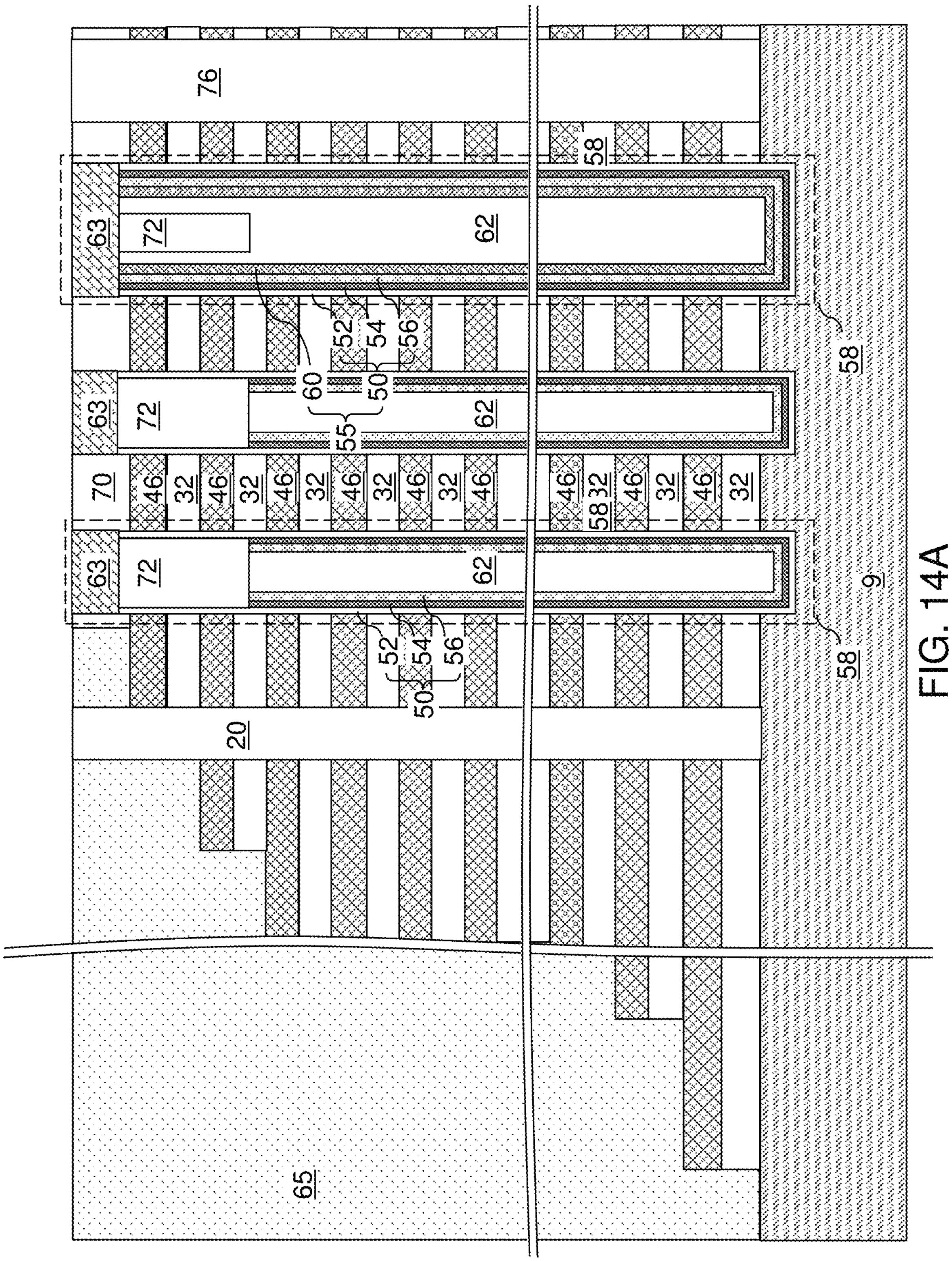
FIG. 14A is a schematic vertical cross-sectional view of the first exemplary structure after formation of drain regions according to the first embodiment of the present disclosure.
Figure 14B:
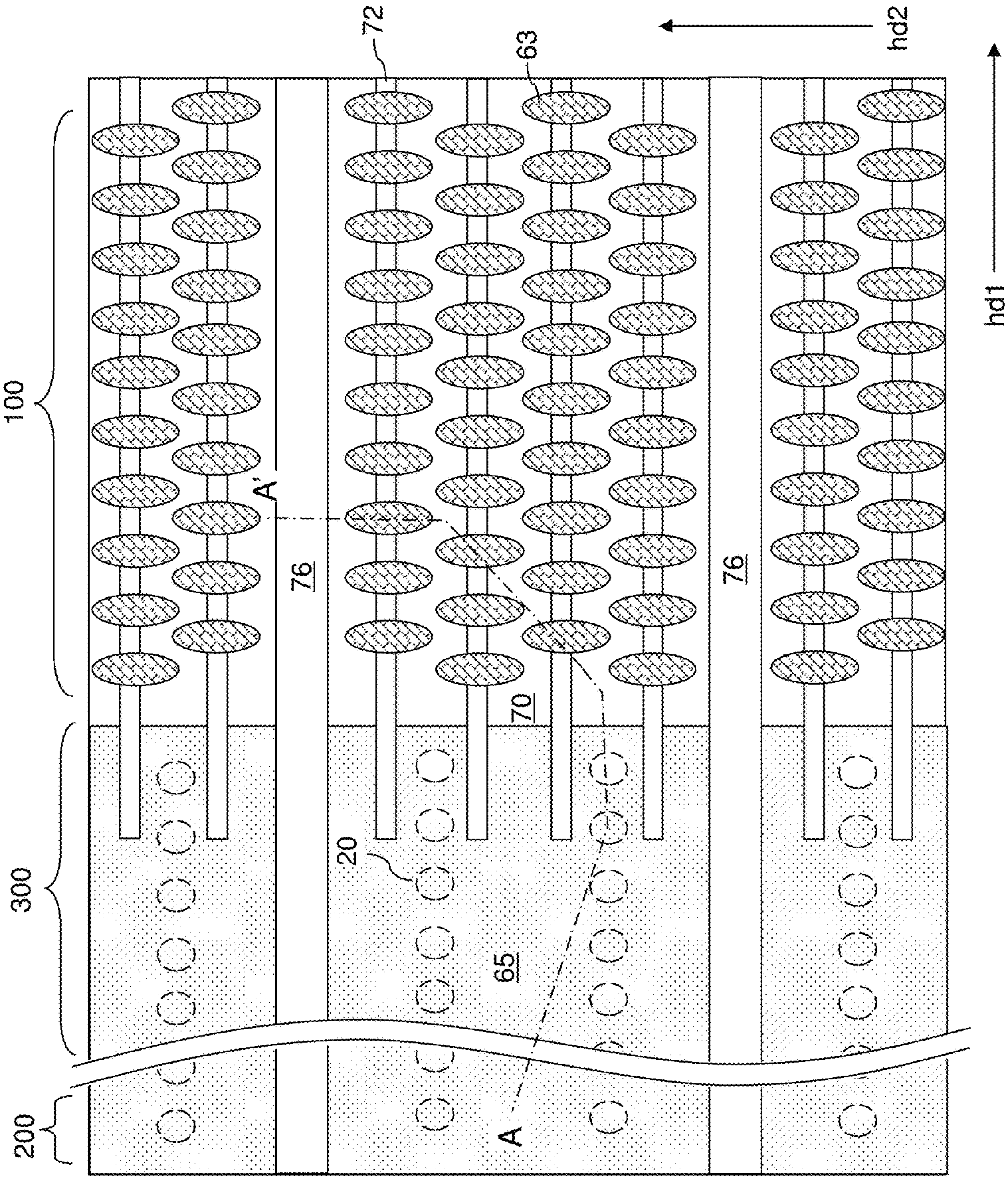
FIG. 14B is a top-down view of the first exemplary structure of FIG. 14A.

Referring to FIGS. 14A and 14B, a doped semiconductor material having a doping of a second conductivity type can be formed in the drain-level recesses 67. The second conductivity type is the opposite of the first conductivity type. For example, if the first conductivity type is p-type, the second conductivity type is n-type, and vice versa. The doped semiconductor material can be, for example, doped polysilicon. The dopant concentration in the doped semiconductor material can be in a range from $5.0\times10^{18}/cm^3$ to $2.0\times10^{21}/cm^3$, although lesser and greater dopant concentrations can also be employed. The doped semiconductor material may be deposited as in-situ doped semiconductor material, such as doped polysilicon or amorphous silicon. Alternatively, the doped semiconductor material may be deposited in an undoped (e.g., intrinsic) state, and subsequently doped by ion implantation.

Portions of the doped semiconductor material, the dielectric core layer 62L, the memory film 50 and optionally the semiconductor channel layer 60L (if any remains at this step) that overlie the horizontal plane including the top surface of the insulating cap layer 70 can be removed by a planarization process, which can employ a chemical mechanical planarization process and/or a recess etch process. Each remaining portion of the doped semiconductor material constitutes a drain region 63. Each drain region 63 can be formed on a respective pair of vertical semiconductor channels 60. A memory opening fill structure 58 can be formed within each memory opening 49. The memory opening fill structure 58 includes the dielectric core 62, the drain region 63 and a memory stack structure comprising a pair of discrete vertical semiconductor channels 60 and a memory film 50 surrounding the pair of discrete vertical semiconductor channels 60.

If the support pillar structures 20 are not formed in the via cavities at the step of FIGS. 2A and 2B, then the support pillar structures 20 are formed at the same time as the memory opening fill structures 58. In this case, the support pillar structures include a dummy drain region 63 (which is not electrically connected to a bit line), a pair of dummy vertical semiconductor channels 60, a dummy memory film 50, and a dummy dielectric core 62.

Figure 15A:
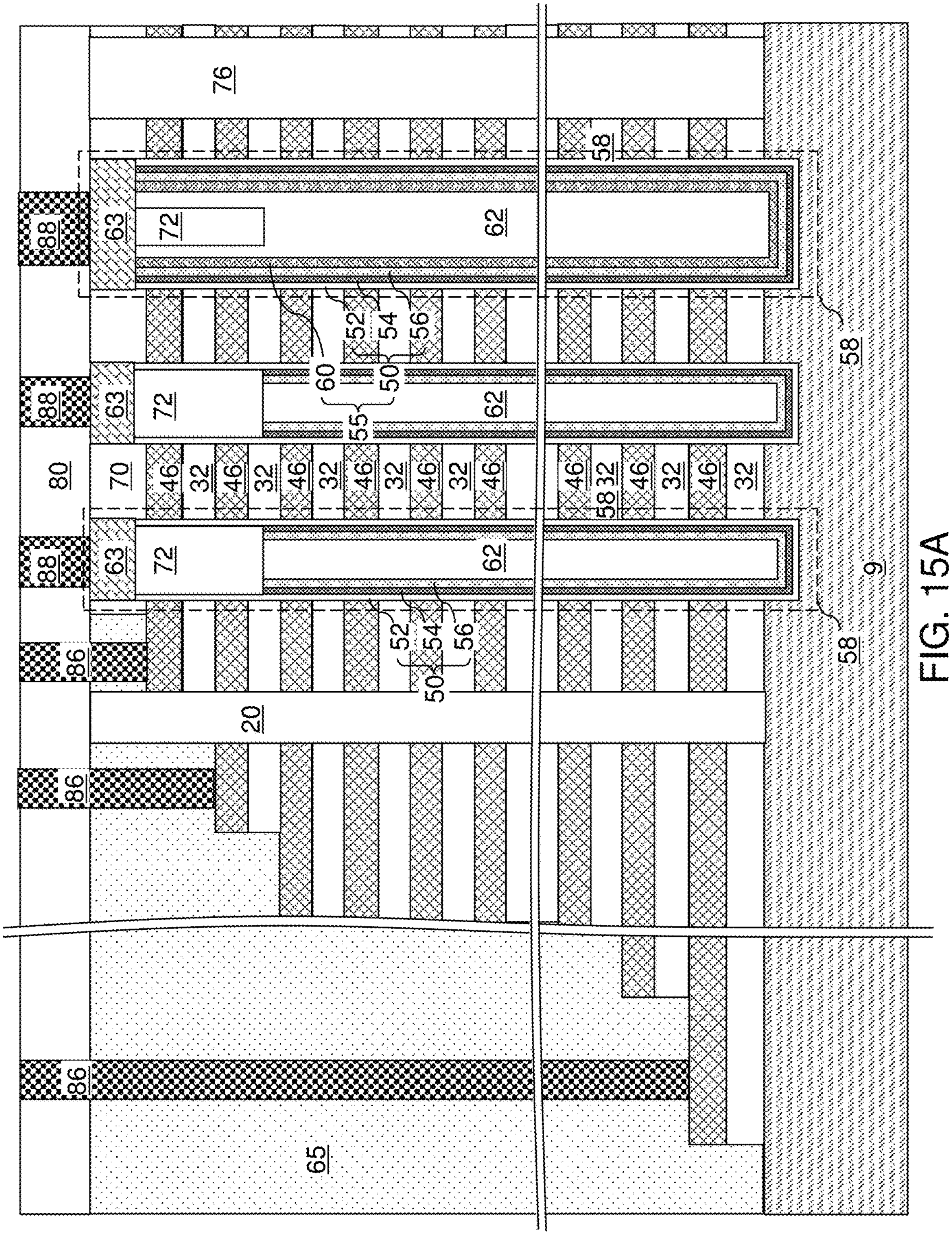
FIG. 15A is a schematic vertical cross-sectional view of the first exemplary structure after formation of contact via structures according to the first embodiment of the present disclosure.
Figure 15B:
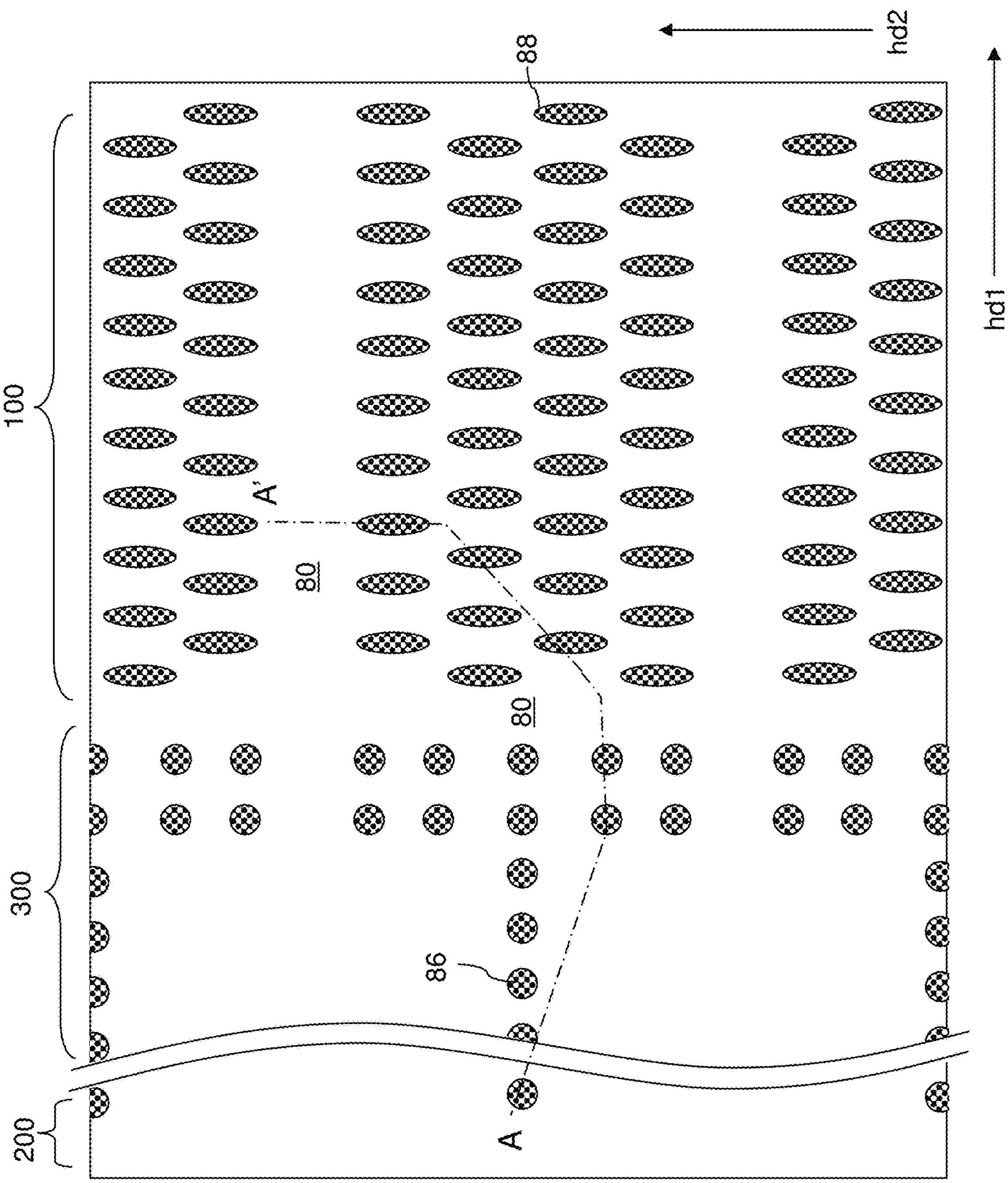
FIG. 15B is a top-down view of the first exemplary structure of FIG. 15A.

Referring to FIGS. 15A and 15B, a contact-level dielectric layer 80 can be formed over the insulating cap layer 70 by deposition of a dielectric material such as silicon oxide. Contact via structures (88, 86) can be formed through the contact-level dielectric layer 80 and optionally through the retro-stepped dielectric material portion 65. For example, layer contact via structures (e.g., word line contact via structures) 86 can be formed directly on a top surface of a respective one of the electrically conductive layers 46. Drain contact via structures 88 can be formed directly on a top surface of a respective one of the drain regions 63.

Figure 16A:
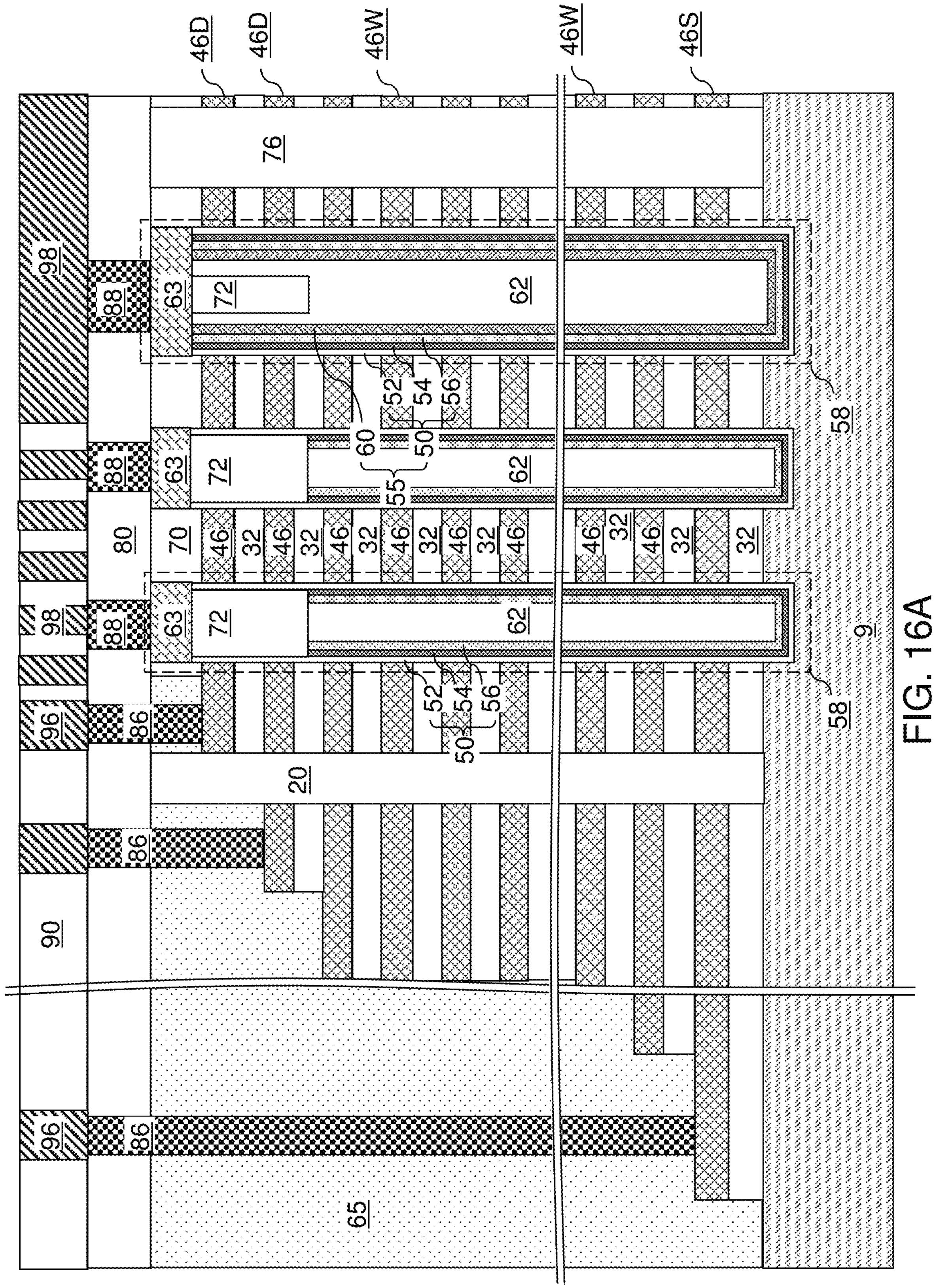
FIG. 16A is a schematic vertical cross-sectional view of the first exemplary structure after formation of bit-line-level metal interconnect structures according to the first embodiment of the present disclosure.
Figure 16B:
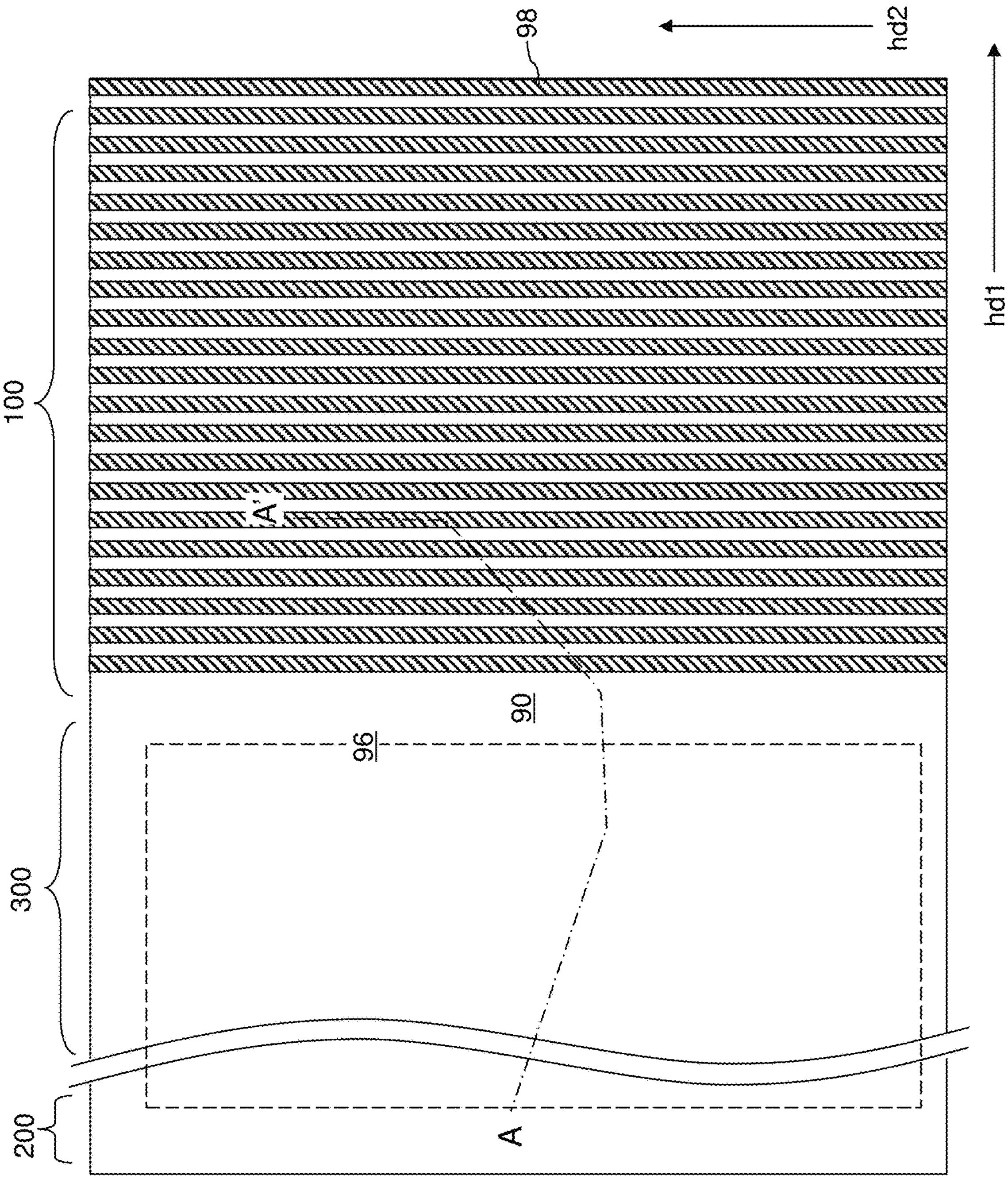
FIG. 16B is a top-down view of the first exemplary structure of FIG. 16A.

Referring to FIGS. 16A-16D, a line-level dielectric layer 90 can be formed above the contact-level dielectric layer 80. Metal lines (98, 96) can be formed in the line-level dielectric layer 90. The metal lines (98, 96) can include bit lines 98 and interconnection metal lines 96. Each of the bit lines 98 can laterally extend along the second horizontal direction hd2, and can be electrically connected to a respective subset of the drain regions 63 through the respective drain contact via structures 88. The interconnection metal lines 96 can contact the layer contact via structures 86 and other contact via structures (not shown) that vertically extend through the retro-stepped dielectric material portion 65. The area of the interconnection metal lines 96 is schematically illustrated in FIG. 16B.

Figure 16C:
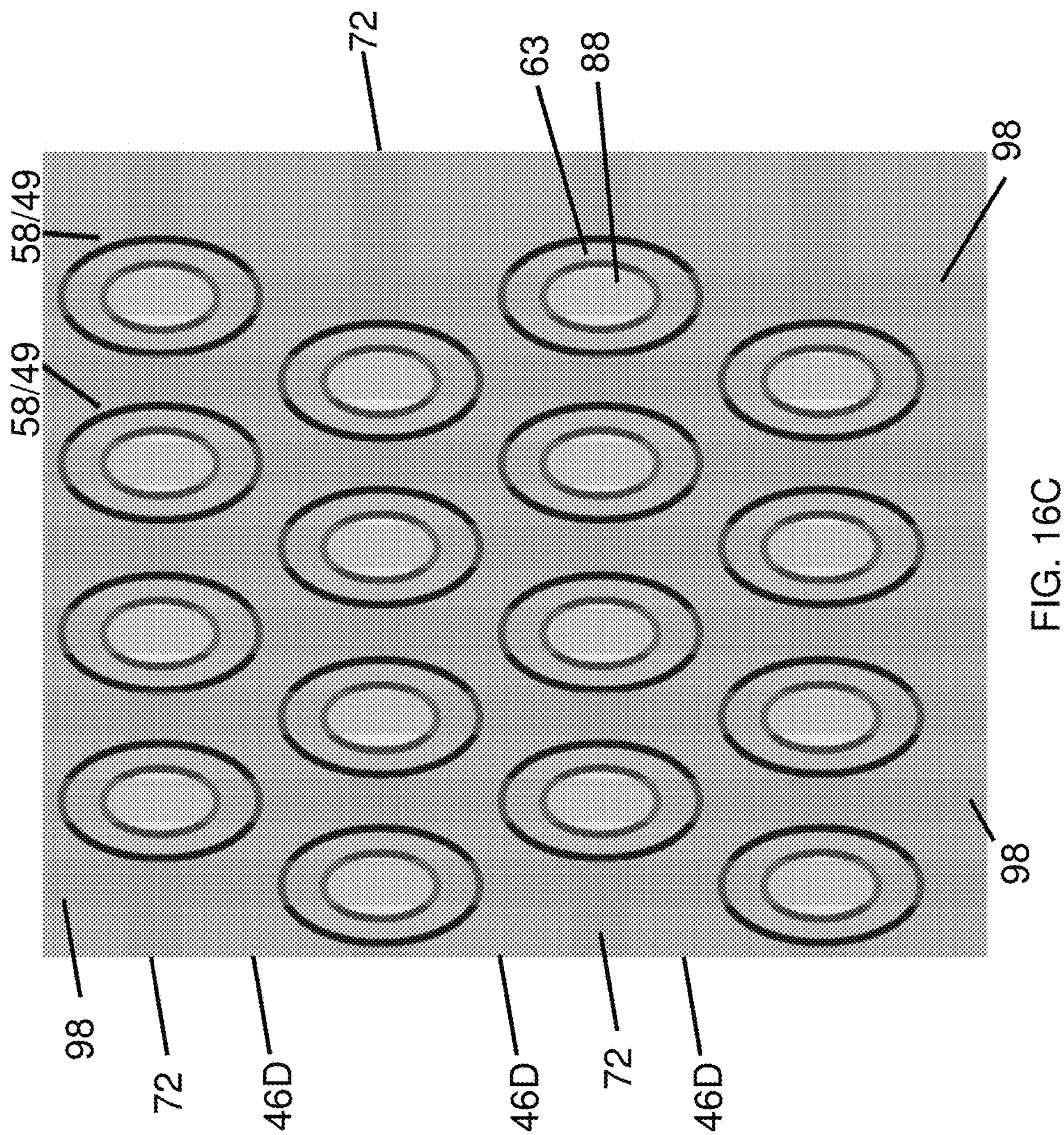
FIG. 16C is a schematic top-down partial see through view of the first exemplary structure of FIG. 16A.
Figure 16D:
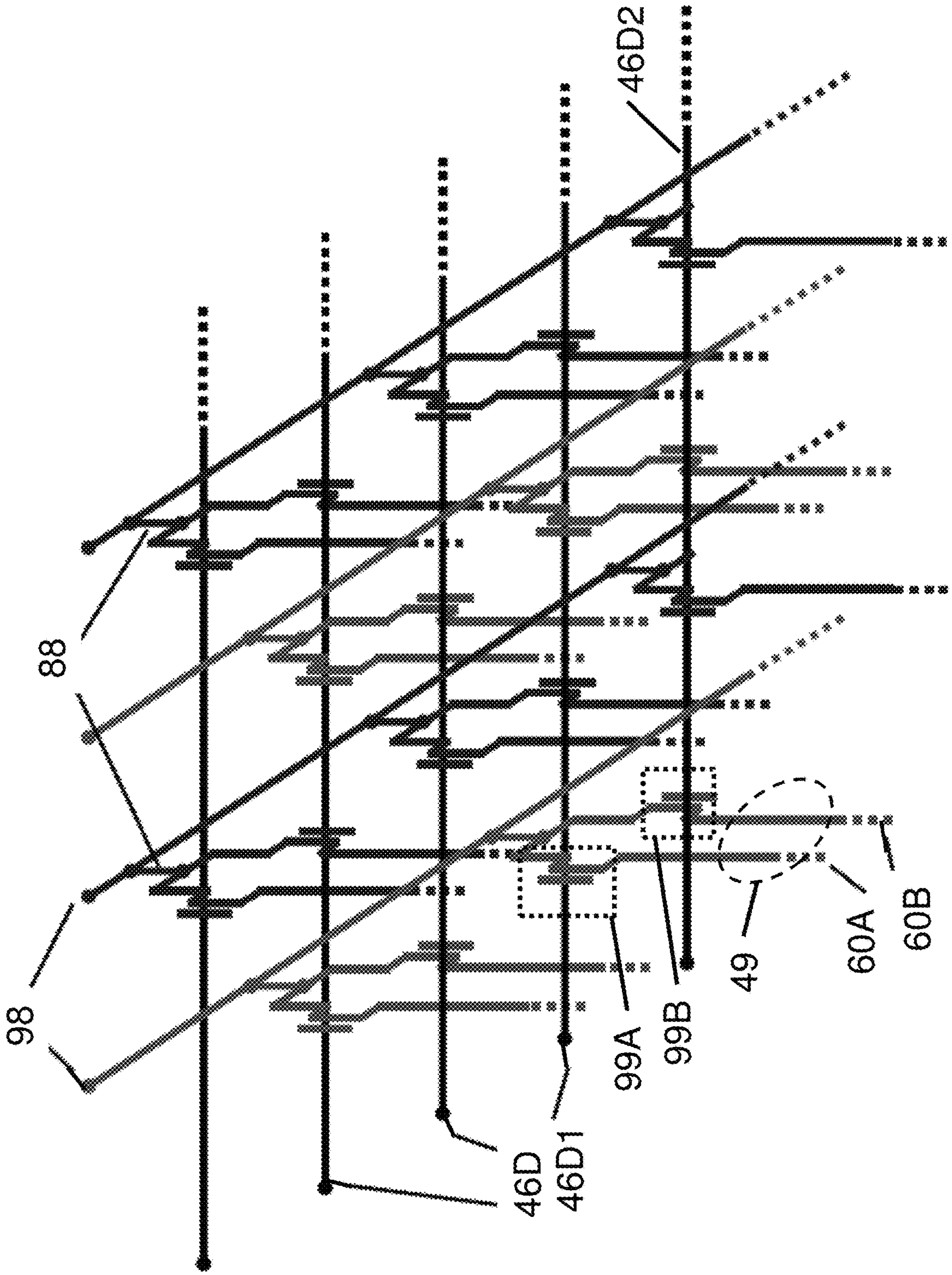
FIG. 16D is a perspective view of a circuit schematic of the first exemplary structure of FIG. 16A.

Referring to FIGS. 16C and 16D, drain-select-level dielectric isolation structures 72 extend through each row of the memory opening fill structures 58. Each drain-select-level dielectric isolation structure 72 extends the space between the discrete pair of vertical semiconductor channels 60 in each memory opening fill structure 58 in each memory opening 49. Referring to FIG. 16D, the two vertical semiconductor channels 60A, 60B located in the memory opening fill structure 58 in the same memory opening 49 are separated by a drain-select-level dielectric isolation structure 72 and controlled by different drain side select transistors 99A, 99B, respectively. Thus, each vertical NAND string comprising the respective vertical semiconductor channel 60A, 60B in the same memory opening 49 is electrically connected to the same bit line 98, but is controlled by a different drain side select transistors 99A, 99B. For example, the first drain side select transistor 99A contains a first drain side select gate electrode 46D1 adjacent to the upper portion of the vertical semiconductor channel 60A. The second drain side select transistor 99B contains a second drain side select gate electrode 46D2 adjacent to the upper portion of the vertical semiconductor channel 60B. The two discrete vertical semiconductor channels 60A, 60B are connected to the same drain region 63, which is electrically connected to the same bit line 98 through the drain contact via structure 88.

Referring to FIG. 16A, the word lines 46W are located below the drain side select gate electrodes 46D. One or more source side select gate electrodes 46S of the source side select transistors are located below the word lines 46. Referring to FIGS. 16A-16C, the drain select transistor channels are located on-pitch with the NAND string vertical semiconductor channels. Therefore, a dummy row of memory opening fill structures located below the drain-select-level dielectric isolation structure 72 that is used in prior art devices is not required. This increases the density of active NAND strings in the device of the first embodiment of the present disclosure.

Figure 17:
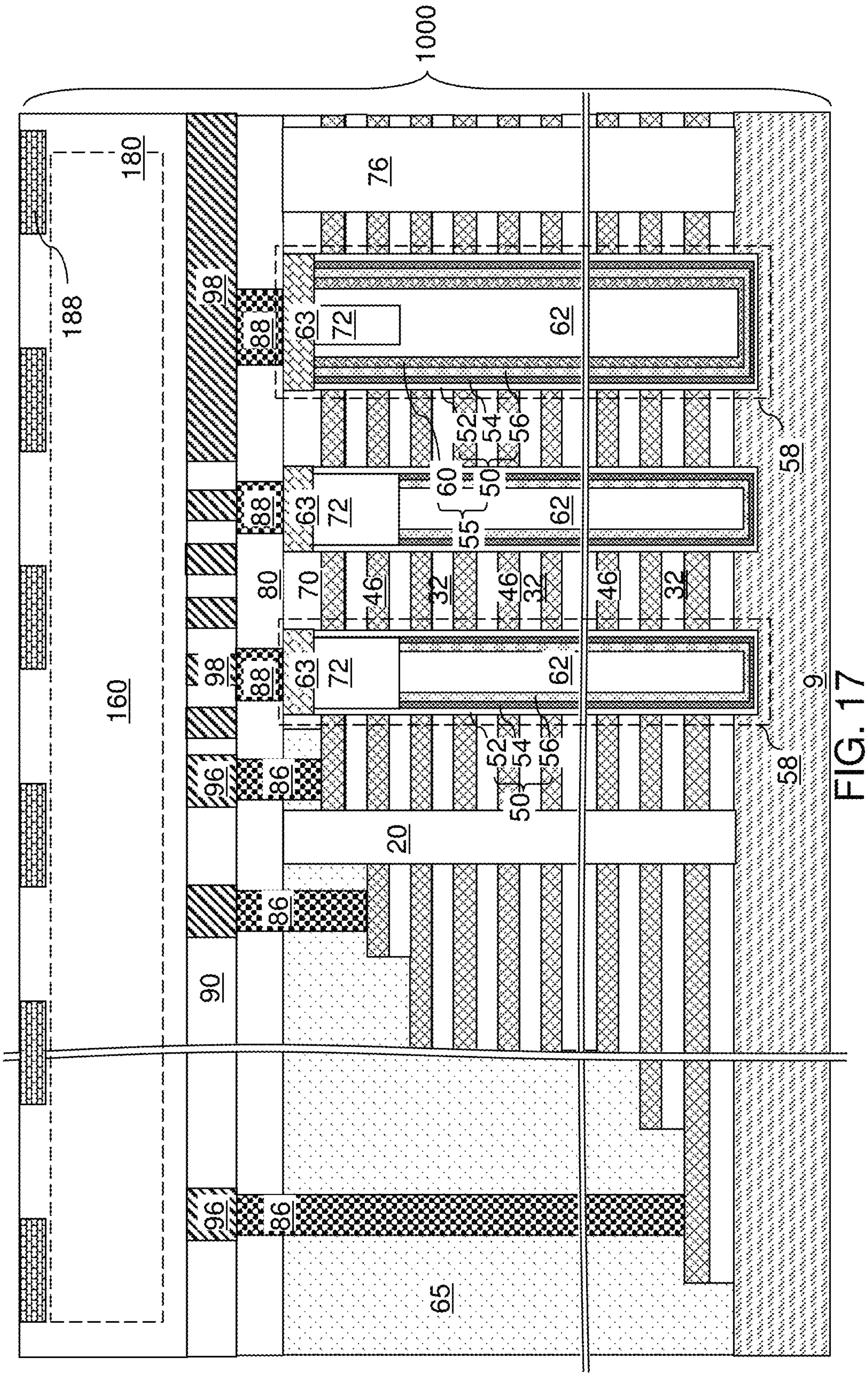
FIG. 17 is a schematic vertical cross-sectional view of the first exemplary structure after formation of additional metal interconnect structures embedded in dielectric material layers according to the first embodiment of the present disclosure.

Referring to FIG. 17, additional metal interconnect structures 180 embedded in dielectric material layers 160 can be formed above the line-level dielectric layer 90. The additional metal interconnect structures 180 may include metal lines and metal via structures. The dielectric material layers 160 may include line-level dielectric material layers and via-level dielectric material layers. Memory-side bonding pads 188 can be formed at the topmost level of the dielectric material layers 160. A memory die 1000 can be provided, which is a first semiconductor die to be employed to form a bonded structure.

Figure 18:
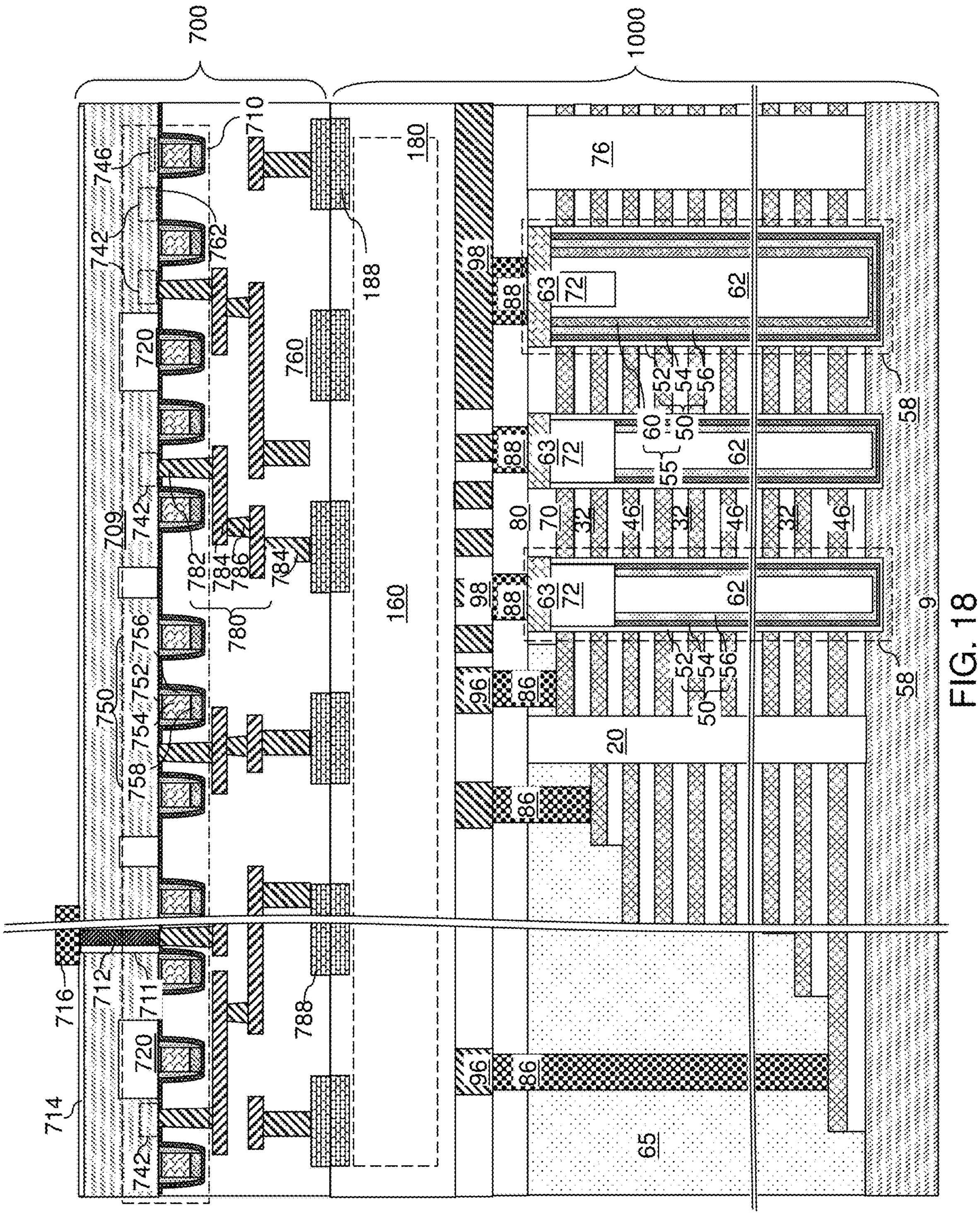
FIG. 18 is a schematic vertical cross-sectional view of the first exemplary structure after attaching a logic die to a memory die according to the first embodiment of the present disclosure.

Referring to FIG. 18, a second semiconductor die can be provided, which can be a logic die 700 including various semiconductor devices 710. The semiconductor devices 710 includes a peripheral (e.g., driver) circuitry for operation of the three-dimensional memory arrays in the memory die 1000. The peripheral circuitry can include a word line driver that drives the electrically conductive layers 46 within the memory die 1000, a bit line driver that drives the bit lines 98 in the memory die 1000, a word line decoder circuitry that decodes the addresses for the electrically conductive layers 46, a bit line decoder circuitry that decodes the addresses for the bit lines 98, a sense amplifier circuitry that senses the states of memory elements within the memory opening fill structures 58 in the memory die 1000, a power supply/distribution circuitry that provides power to the memory die 1000, a data buffer and/or latch, and/or any other semiconductor circuitry that can be used to operate the array of elements in the memory die 1000. The logic die 700 can include a logic-die substrate, which can be a semiconductor substrate. The logic-die substrate can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench dielectric isolation structures 720 can be formed in an upper portion of the substrate semiconductor layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 1000 comprising the electrically conductive layers 46.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and logic-side bonding pads 788.

The logic die 700 can include a backside insulating layer 714 located on the backside surface of the logic-die substrate 708. Laterally-insulated through-substrate via structures (711, 712) can be formed through the logic-die substrate 708 to provide electrical contact to various input nodes and output nodes of the periphery circuitry. Each laterally-insulated through-substrate via structure (711, 712) includes a through-substrate conductive via structure 712 and a tubular insulating liner 711 that laterally surrounds the through-substrate conductive via structure 712. Backside bonding pads 716 can be formed on surface portions of the laterally-insulated through-substrate via structures (711, 712). Generally, a semiconductor logic die is 700 provided, which includes semiconductor devices 710 located on a semiconductor substrate (such as the substrate semiconductor layer 709). The logic-side bonding pads 788 overlie, and are electrically connected to, the semiconductor devices 710, and laterally-insulated through-substrate via structures (711, 712) can extend through the semiconductor substrate.

The memory die 1000 and the logic die 700 are positioned such that the logic-side bonding pads 788 of the logic die 700 face the memory-side bonding pads 188 of the memory die 1000. In one embodiment, the memory die 1000 and the logic die 700 can be designed such that the pattern of the logic-side bonding pads 788 of the logic die 700 is the mirror pattern of the pattern of the memory-side bonding pads 178 of the memory die 1000. The memory die 1000 and the logic die 700 can be bonded to each other by metal-to-metal bonding, dielectric-to-dielectric bonding or hybrid bonding. Alternatively, an array of solder material portions may be used to bond the memory die 1000 and the logic die 700 through the array of solder material portions (such as solder balls).

Subsequently, the backside of the substrate semiconductor layer 709 of the logic die 700 can be thinned, for example, by grinding, polishing, an anisotropic etch process, or an isotropic etch process. A backside surface of each through-substrate conductive via structure 712 can be physically exposed upon thinning the substrate semiconductor layer 709 of the logic die 700. The thickness of the substrate semiconductor layer 709 of the logic die 700 may be in a range from 5 microns to 30 microns, although lesser and greater thicknesses may also be employed. A backside insulating layer 714 can be formed on the backside of the substrate semiconductor layer 709 of the logic die 700. Logic-side external bonding pads 716 can be formed on the laterally-insulated through-substrate via structures (711, 712).

Figure 19:
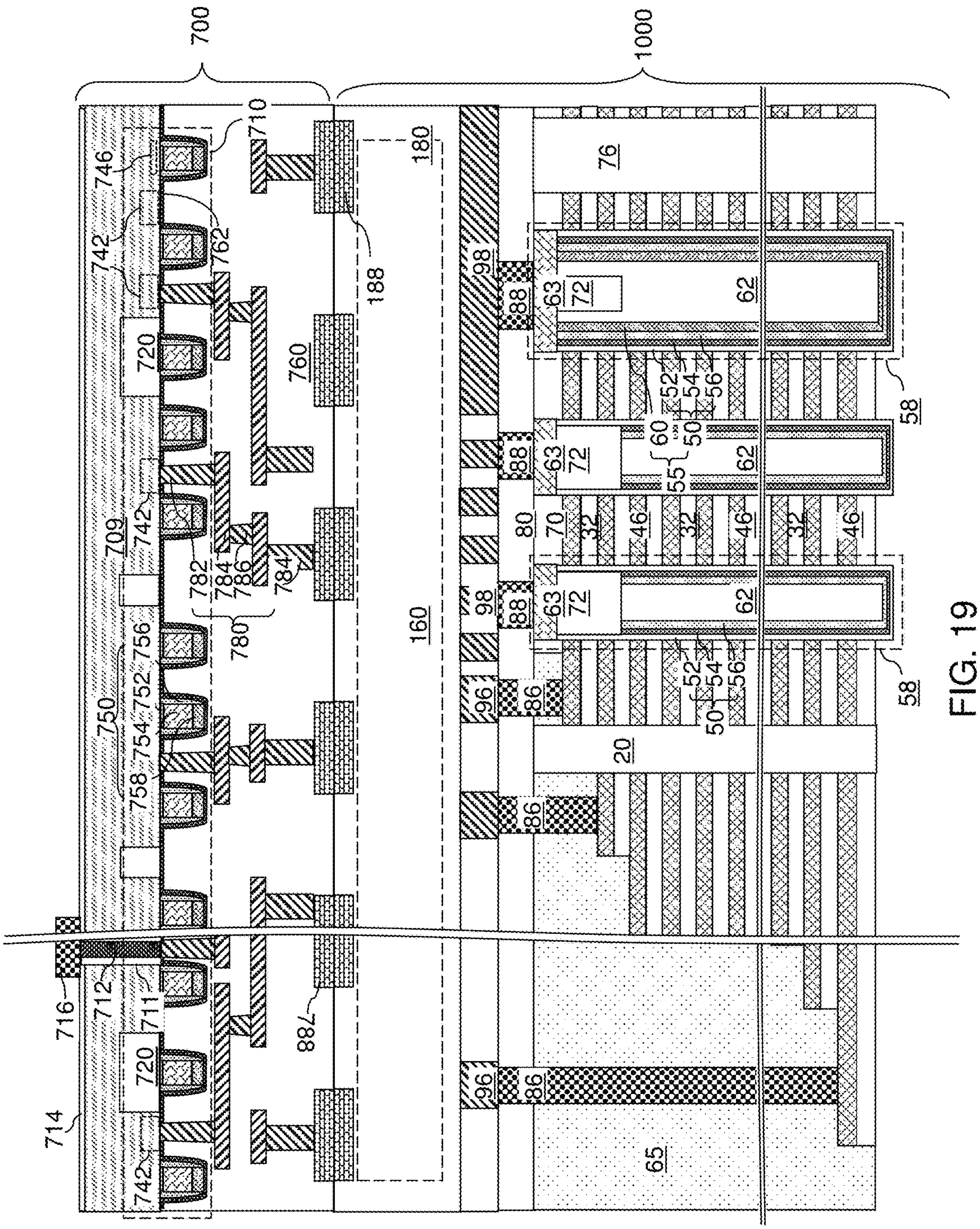
FIG. 19 is a schematic vertical cross-sectional view of the first exemplary structure after removal of a substrate according to the first embodiment of the present disclosure.

Referring to FIG. 19, the substrate semiconductor layer 9 of the memory die 1000 can be removed selective to the materials of the insulating layers 32 and the memory films 50. For example, a backside portion of the substrate semiconductor layer 9 of the memory die 1000 can be removed by grinding, polishing, an anisotropic etch process, and/or an isotropic etch process. Subsequently, a top portion of the substrate semiconductor layer 9 can be removed by an etch process (which may be an isotropic etch process or an anisotropic etch process) that etches the semiconductor material of the substrate semiconductor layer 9 selective to the materials of the insulating layers 32 and the memory films 50. In an illustrative example, a wet etch process employing potassium hydroxide may be employed to remove the substrate semiconductor layer 9.

Figure 20:
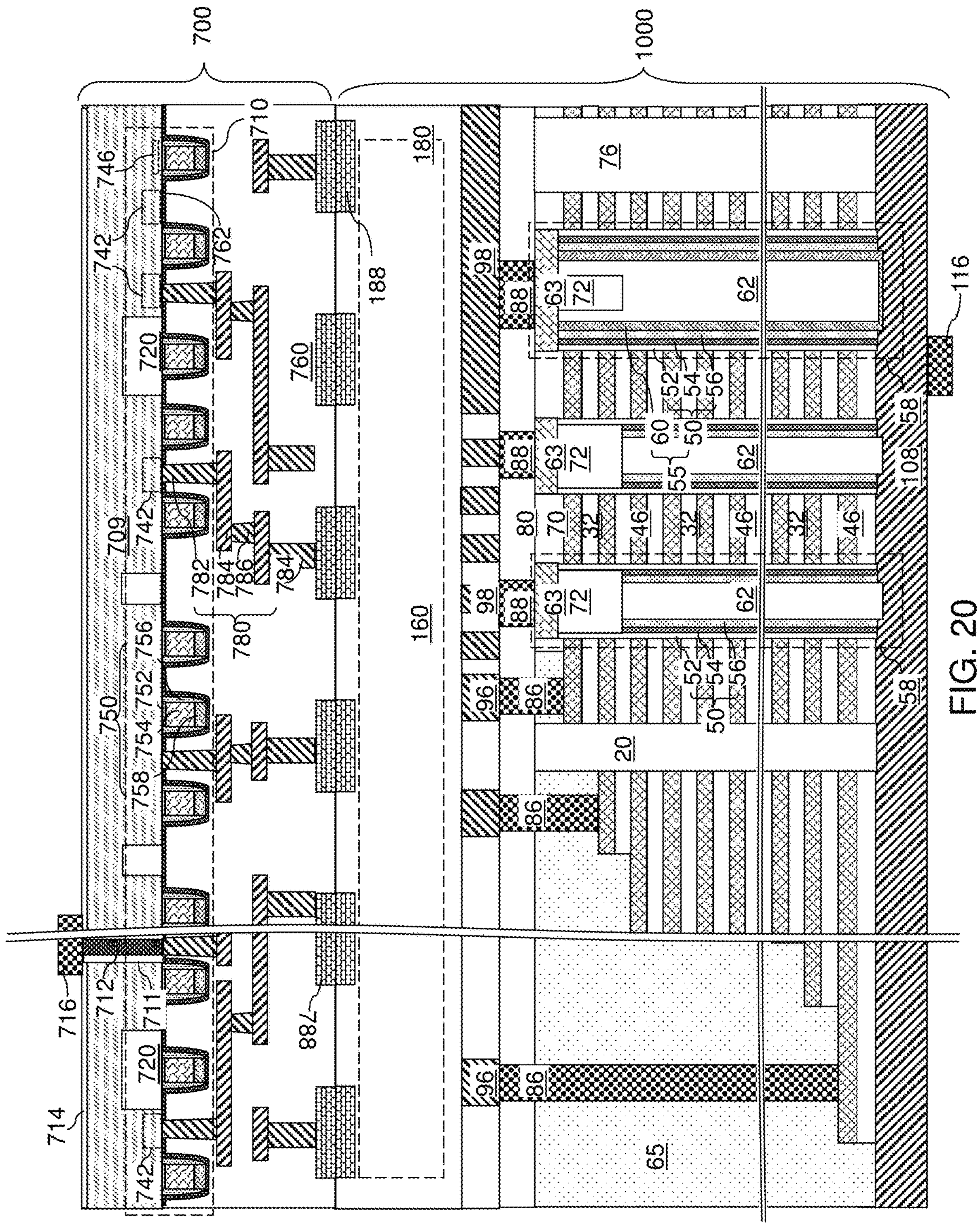
FIG. 20 is a schematic vertical cross-sectional view of the first exemplary structure after formation of a source layer and backside bonding pads according to the first embodiment of the present disclosure.
Figure 21A:
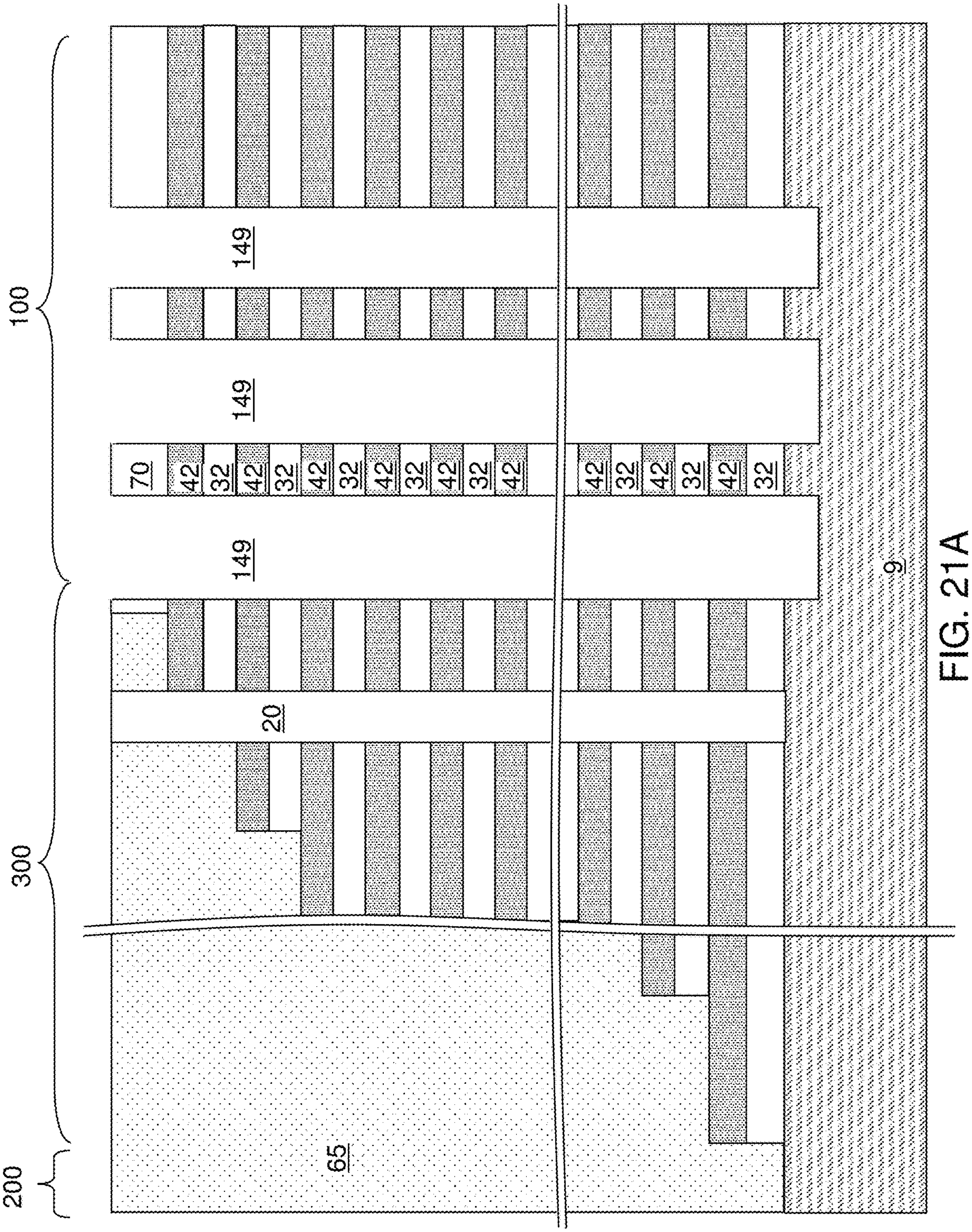
FIG. 21A is a schematic vertical cross-sectional view of a second exemplary structure after formation of elongated trenches according to a second embodiment of the present disclosure.
Figure 21B:
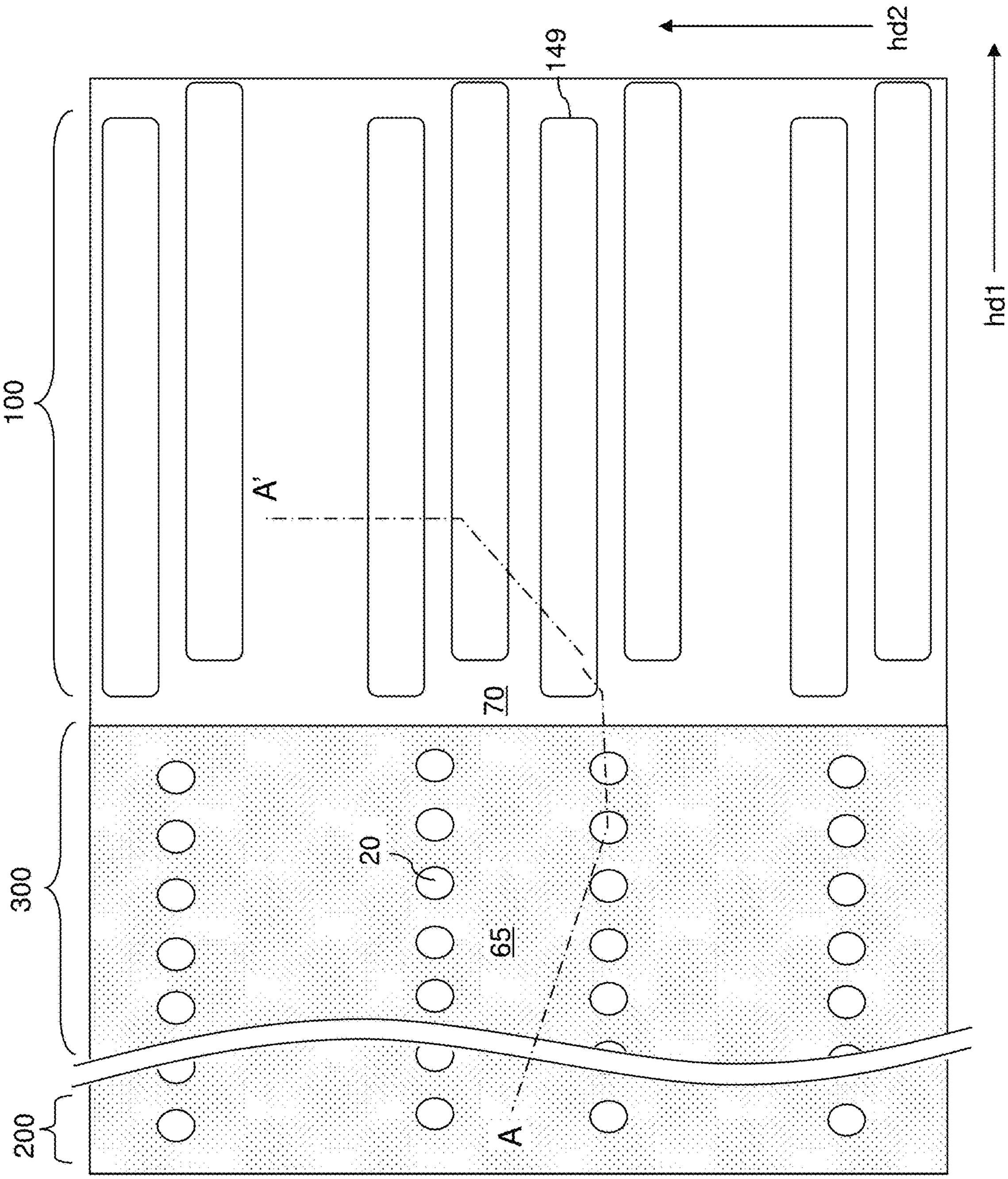
FIG. 21B is a top-down view of the second exemplary structure of FIG. 21A. The vertical plane A-A' is the plane of the cross-section for FIG. 21A.
Figure 22A:
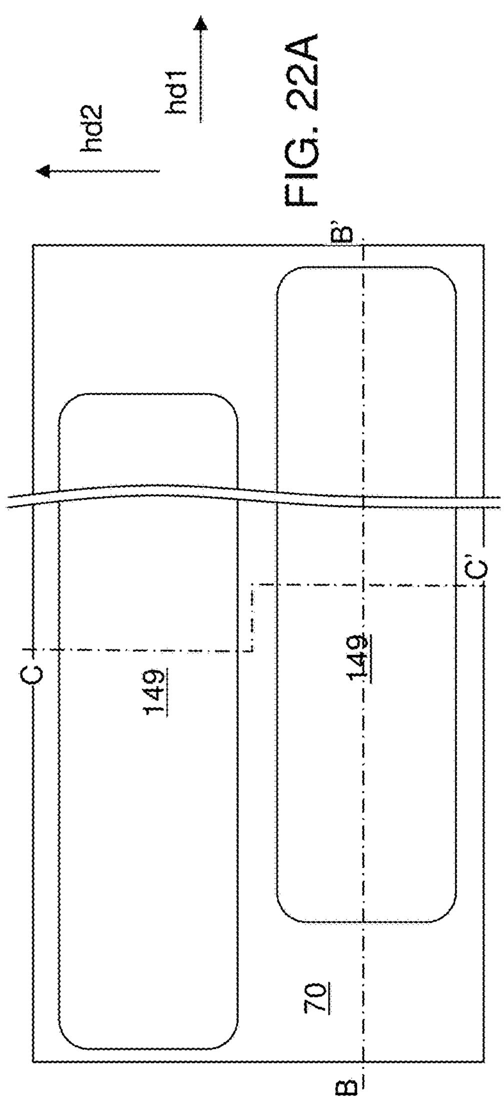
FIG. 22A is a top-down view of a region of the second exemplary structure of FIGS. 21A and 21B.
Figure 22B:
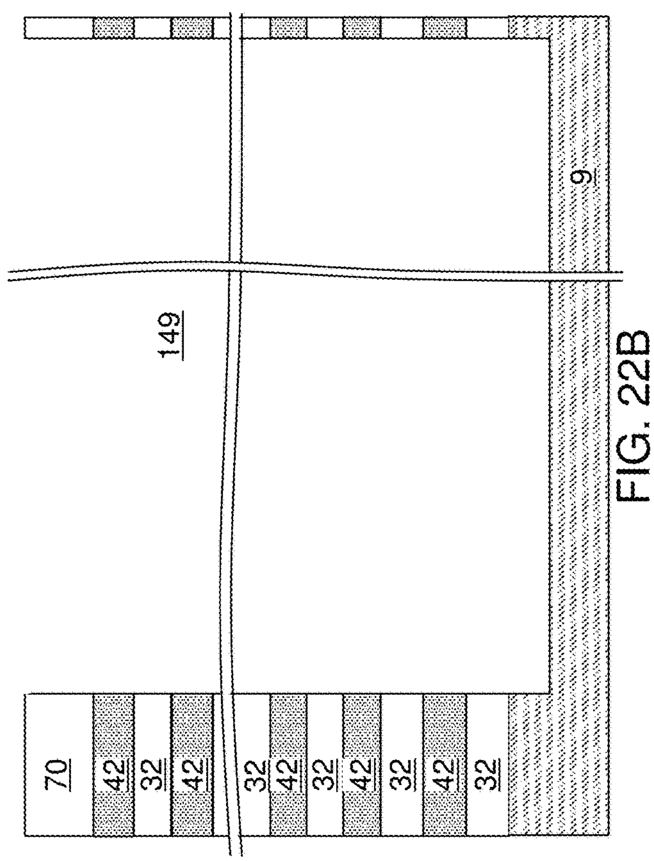
FIG. 22B is a vertical cross-sectional view along the vertical plane B-B' of the region of the second exemplary structure of FIG. 22A.
Figure 22C:
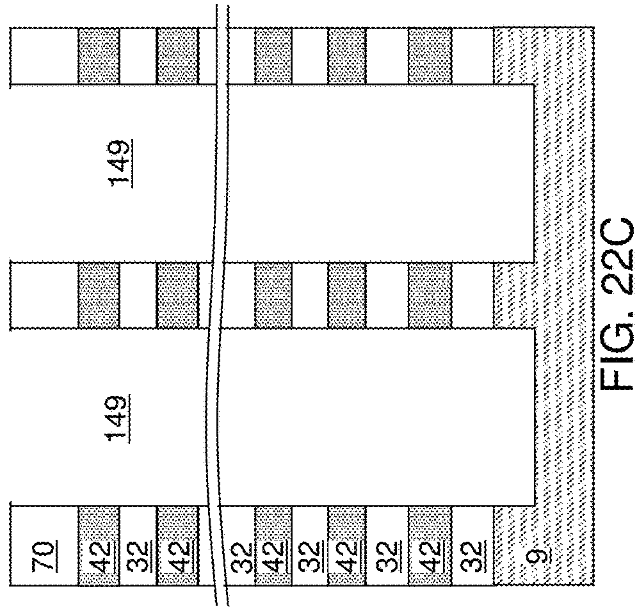
FIG. 22C is a vertical cross-sectional view along the vertical plane C-C' of the region of the second exemplary structure of FIG. 22A.

Referring to FIG. 20, horizontal portions of the memory films 50 can be removed, for example, by performing a sequence of isotropic etch processes that sequentially etch the materials of the blocking dielectric layer 52, the charge storage layer 54, and the tunneling dielectric layer 56. Source side end surfaces of the vertical semiconductor channels 60 can be physically exposed by removing portions of the memory films 50 selective to the vertical semiconductor channels 60. At least one conductive material can be deposited on the physically exposed surfaces of the vertical semiconductor channels 60 to form a source layer 108. The at least one conductive material of the source layer 108 may include a heavily doped semiconductor material having a doping of the second conductivity type and/or at least one metallic material (such as a conductive metallic nitride material (e.g., TaN, TiN, and/or WN)) and a metallic material layer including at least one metal such as W, Co, Ru, Mo, and/or Cu. Optionally, backside bonding pads 116 can be formed on the backside of the source layer 108.

In alternative embodiments, the peripheral (e.g., driver) circuitry may be formed on the same substrate semiconductor layer 9 as the memory devices. In these embodiments, bonding of a separate logic die 700 is omitted. In one alternative embodiment, the peripheral (e.g., driver) circuitry may be formed next to the alternating stack of insulating layers 32 and the electrically conductive layers 46. In this embodiment, the source region is formed in the substrate semiconductor layer 9 by ion implantation followed by forming the source electrode in contact with the source region in the backside trenches 79. In another alternative embodiment, the peripheral (e.g., driver) circuitry may be formed under the alternating stack of insulating layers 32 and the electrically conductive layers 46. In this embodiment, a horizontal source region and/or electrode (e.g., a direct strap contact) is formed between the substrate semiconductor layer 9 and the alternating stack of insulating layers 32 and the electrically conductive layers 46. The horizontal source electrode contacts an exposed side of the vertical semiconductor channels 60.

Referring collectively to FIGS. 1-20 and according to various embodiments of the present disclosure, a three-dimensional memory device comprises a memory die that includes an alternating stack of insulating layers 32 and electrically conductive layers 46; memory openings 49 vertically extending through the alternating stack (32, 46); and memory opening fill structures 58 located in the memory openings 58. Each of the memory opening fill structures 58 located in a respective one of the memory openings 49 comprises a memory film 50 and two vertical semiconductor channels 60 each having a respective crescent-shaped horizontal cross-sectional profile.

In one embodiment, each vertical semiconductor channel 60 may include a concave surface having a pair of vertically-extending edges that coincides with vertically-extending edges of a convex surface. In one embodiment, the two vertical semiconductor channels 60 are laterally spaced from each other by a dielectric core 62. In one embodiment, the memory film 50 comprises a tunneling dielectric layer 56 that contacts an entirety of outer sidewalls of the two vertical semiconductor channels 60.

In one embodiment, each of the memory openings 49 has a laterally-elongated shape having a first lateral dimension along a first horizontal direction hd1 and a second lateral dimension along a second horizontal direction hd2, and wherein the second lateral dimension hd2 is greater than the first lateral dimension. In one embodiment, each of the memory openings 49 has an elliptical shape; and the two vertical semiconductor channels 60 have a maximum lateral thickness along the second horizontal direction hd2, and have a variable lateral thickness t that decreases with an increase in an azimuthal angle $\alpha$ around a vertical axis VA passing through a geometrical center of the elliptical shape as measured from the second horizontal direction hd2.

In one embodiment, the memory openings 49 and the memory opening fill structures 58 are arranged in rows that laterally extend along a first horizontal direction hd1 and are laterally spaced from each other along a second horizontal direction hd2; and drain-select-level dielectric isolation structures 72 which extend through each row of the memory opening fill structures 58 between the two semiconductor channels 60 (e.g., 60A and 60B located in the same memory opening 49) at least at a level of a topmost one of the electrically conductive layers 46 (e.g., the drain side select gate electrode(s) 46D).

In one embodiment, the three-dimensional memory device comprises drain regions 63 contacting top surfaces of both of two vertical semiconductor channels 60 within a respective one of the memory opening fill structures 58, contacting a top surface of a respective one of the drain-select-level dielectric isolation structures 72 and electrically contacting a respective bit line 98.

In one embodiment shown in FIG. 16D, the three-dimensional memory device comprises a plurality of drain side select transistors (99A, 99B). Each of the drain side select transistors comprises a drain side select gate electrode (46D1, 46D2) and an upper portion of the vertical semiconductor channel (60A, 60B). The two vertical semiconductor channels (60A, 60B) in the same memory opening fill structure 58 are controlled by different drain side select transistors (99A, 99B) of the plurality of drain side select transistors.

According to another aspect of the present disclosure, a three-dimensional memory device comprising a memory die 1000 is provided. The memory die 1000 includes an alternating stack of insulating layers 32 and electrically conductive layers 46; memory openings 49 vertically extending through the alternating stack (32, 46); memory opening fill structures 58 located in the memory openings 49, wherein each of the memory opening fill structures 58 comprises a memory film 50 and two vertical semiconductor channels 60, and the memory openings 49 and the memory opening fill structures 58 are arranged in rows that laterally extend along a first horizontal direction hd1 and laterally spaced from each other along a second horizontal direction hd2; and drain-select-level dielectric isolation structures 72 extending through each row of the memory opening fill structures 58 at least at a level of a topmost one of the electrically conductive layers 46 (e.g., 46D).

In one embodiment, each of the memory opening fill structures 58 comprises a drain region 63 contacting top surfaces of the two vertical semiconductor channels 60 and located over a respective one of the drain-select-level dielectric isolation structures 72.

In one embodiment shown in FIG. 16D, the three-dimensional memory device comprises a plurality of drain side select transistors (99A, 99B). Each of the drain side select transistors comprises a drain side select gate electrode (46D1, 46D2) and an upper portion of the vertical semiconductor channel (60A, 60B). The two vertical semiconductor channels (60A, 60B) in the same memory opening fill structure 58 are controlled by different drain side select transistors (99A, 99B) of the plurality of drain side select transistors.

In one embodiment, each of the drain-select-level dielectric isolation structures 72 has a uniform width along the second horizontal direction hd2 and contacts bottom surfaces of a respective row of the drain regions 63 that is arranged along the first horizontal direction hd1. In one embodiment, the two vertical semiconductor channels 60 within each of the memory opening fill structures 58 have a respective crescent-shaped horizontal cross-sectional profile.

In one embodiment, each of the memory opening fill structures 58 comprises a dielectric core 62 contacting inner sidewalls of the two vertical semiconductor channels 60 and contacting a pair of lengthwise sidewalls and a bottom surface of a respective one of the drain-select-level dielectric isolation structures 72. In one embodiment, the three-dimensional memory device comprises: a source layer 108 electrically connected to bottom ends of the vertical semiconductor channels 60; and a logic die 700 bonded to the memory die 1000.

Referring to FIGS. 21A and 21B and 22A-22C, a second exemplary structure according to a second embodiment of the present disclosure can be derived from the first exemplary structure of FIGS. 2A and 2B by forming elongated trenches 149 through the alternating stack (32, 42). The processing steps of FIGS. 3A and 3B can be performed with a modification the in the pattern of the openings in the photoresist layer over the insulating cap layer 70. In one embodiment, each elongated trench 149 can be formed in lieu of a respective row of memory openings 49 in the first exemplary structure of FIGS. 3A and 3B. Each of the elongated trenches 149 laterally extends along a first horizontal direction (e.g., word line direction) hd1. Each elongated trench 149 may have a horizontal cross-sectional shape of a rectangle or a rounded rectangle. In this case, the elongated trenches 149 may have a uniform width along a second horizontal direction (e.g., bit line direction) hd2 that is perpendicular to the first horizontal direction hd1. Alternatively, the elongated trenches 149 may have a periodic undulation of a width along the second horizontal direction hd2.

Figures 23A, 23B, 23C:
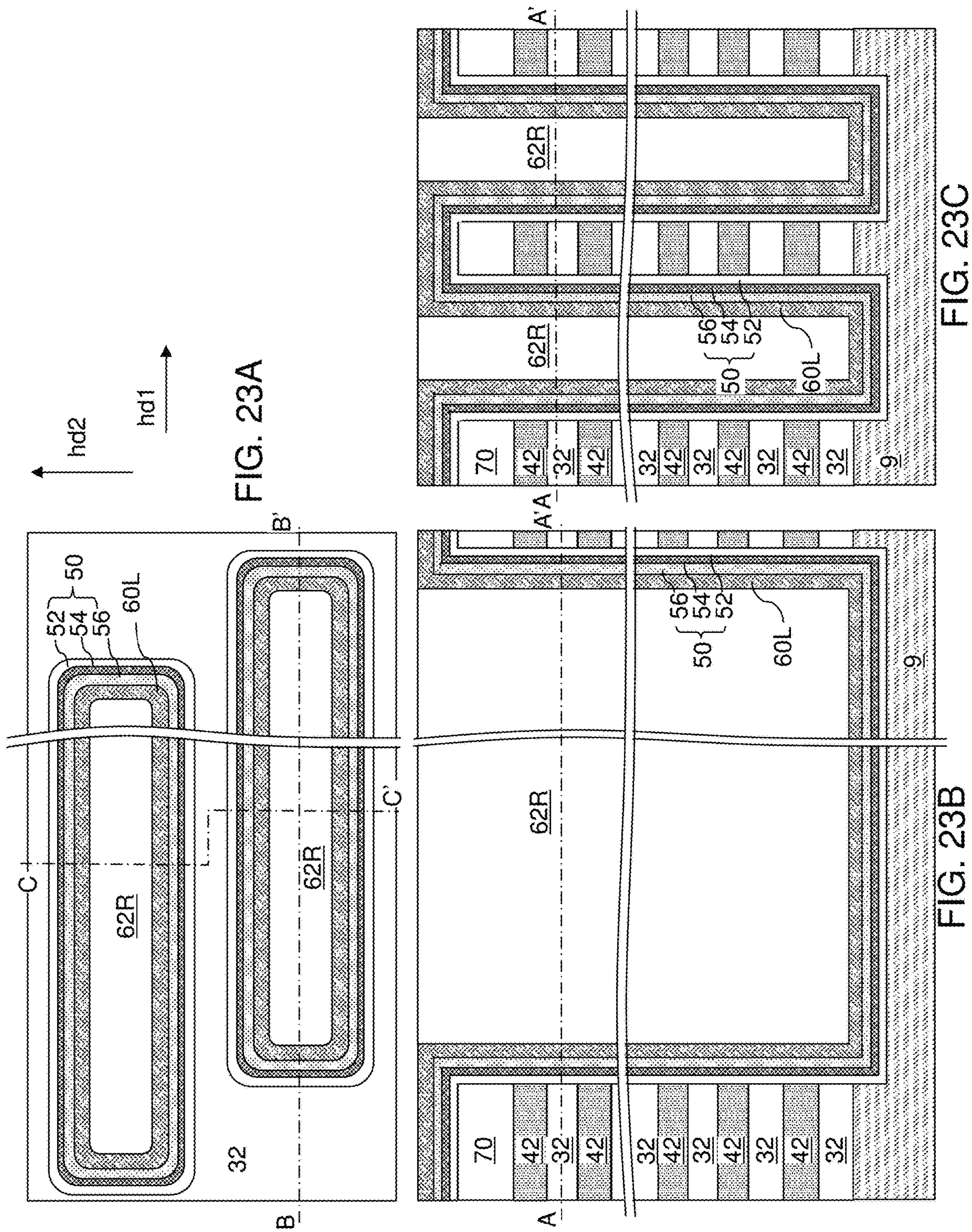
FIG. 23A is a top-down view of a region of the second exemplary structure after formation of a memory film, a semiconductor channel layer, and dielectric core rails according to a second embodiment of the present disclosure.
FIG. 23B is a vertical cross-sectional view along the vertical plane B-B' of the region of the second exemplary structure of FIG. 23A.
FIG. 23C is a vertical cross-sectional view along the vertical plane C-C' of the region of the second exemplary structure of FIG. 23A.

Referring to FIGS. 23A-23C, the processing steps of FIGS. 4A-4D can be performed to form a memory film 50 and a semiconductor channel layer 60L. A dielectric fill material such as silicon oxide can be deposited in remaining volumes of the elongated trenches 149, for example, by a conformal deposition process. Excess portions of the dielectric fill material can be removed from above the topmost surface of the semiconductor channel layer 60L by a planarization process such as a recess etch process and/or a chemical mechanical planarization process. Each remaining portion of the dielectric fill material in the elongated trenches 149 comprise a dielectric core rail 62R.

Figure 24A:
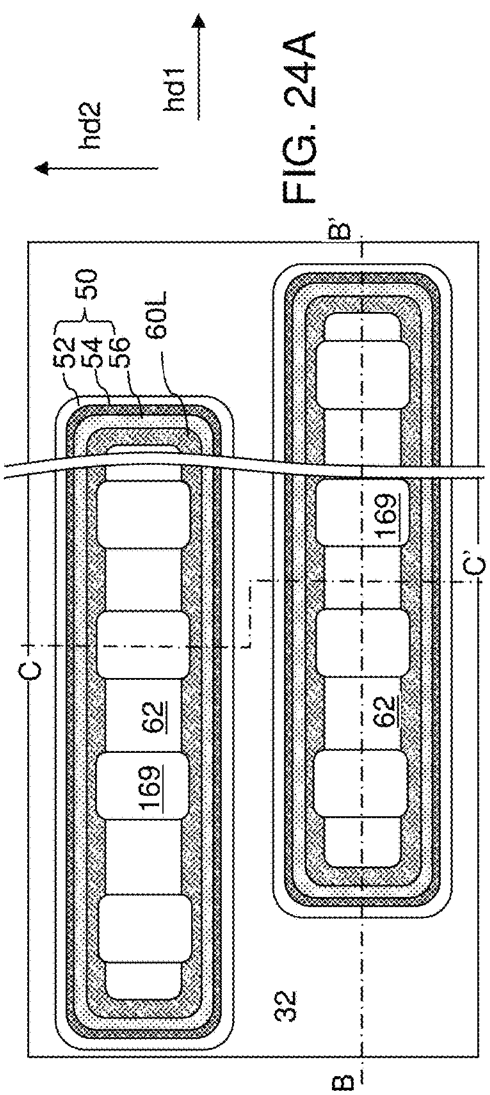
FIG. 24A is a top-down view of a region of the second exemplary structure after formation of pillar cavities according to a second embodiment of the present disclosure.
Figure 24B:
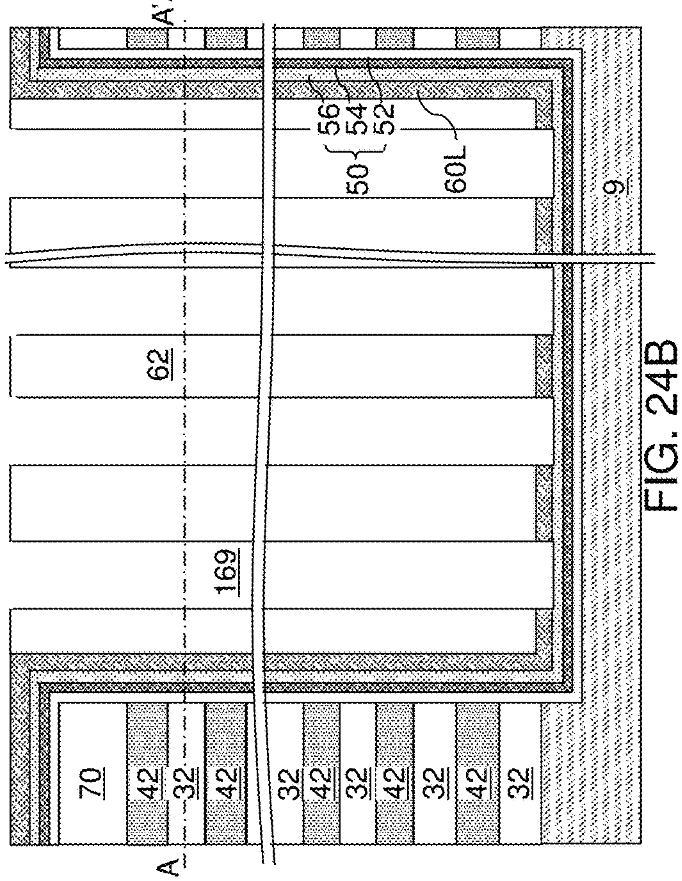
FIG. 24B is a vertical cross-sectional view along the vertical plane B-B' of the region of the second exemplary structure of FIG. 24A.
Figure 24C:
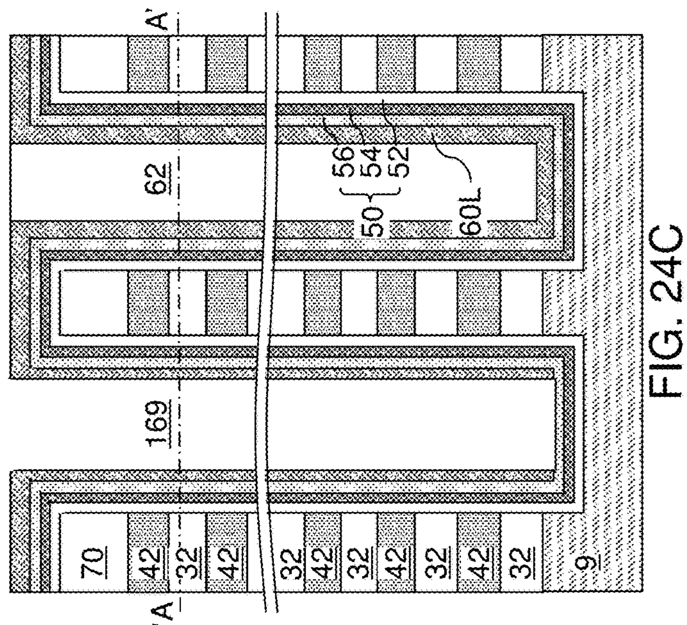
FIG. 24C is a vertical cross-sectional view along the vertical plane C-C' of the region of the second exemplary structure of FIG. 24A.

Referring to FIGS. 24A-24C, a photoresist layer (not shown) can be formed over the second exemplary structure, and can be lithographically patterned to form discrete openings over areas of the dielectric core rails 62R. Specifically, a row of discrete openings can be formed over each dielectric core rail 62R. An anisotropic etch process can be performed to transfer the pattern of openings in the photoresist layer through the dielectric core rails 62R and the semiconductor channel layer 60L. Pillar cavities 169 are formed in volumes from which the materials of the dielectric core rails 62R and the semiconductor channel layer 60R are removed. A row of pillar cavities 169 can be formed through each dielectric core rail 62R. Remaining portions of each dielectric core rail 62R constitute a row of dielectric cores 62 that are arranged along the first horizontal direction hd1 within a respective elongated trench 149. Generally, a row of dielectric cores 62 is interlaced with a row of pillar cavities 169 within each elongated trench 149. Each pillar cavity 169 can be shaped such that two surface portions of the semiconductor channel layer 60L that laterally extend along the first horizontal direction hd1 are physically exposed around each pillar cavity 169. A row of pillar cavities 169 can be formed through each dielectric core rail 62R. Sidewalls of the semiconductor channel layer 60L are physically exposed and each dielectric core rail 62R is divided into a plurality of dielectric cores 62. The photoresist layer can be subsequently removed, for example, by ashing.

Figures 25A, 25B, 25C:
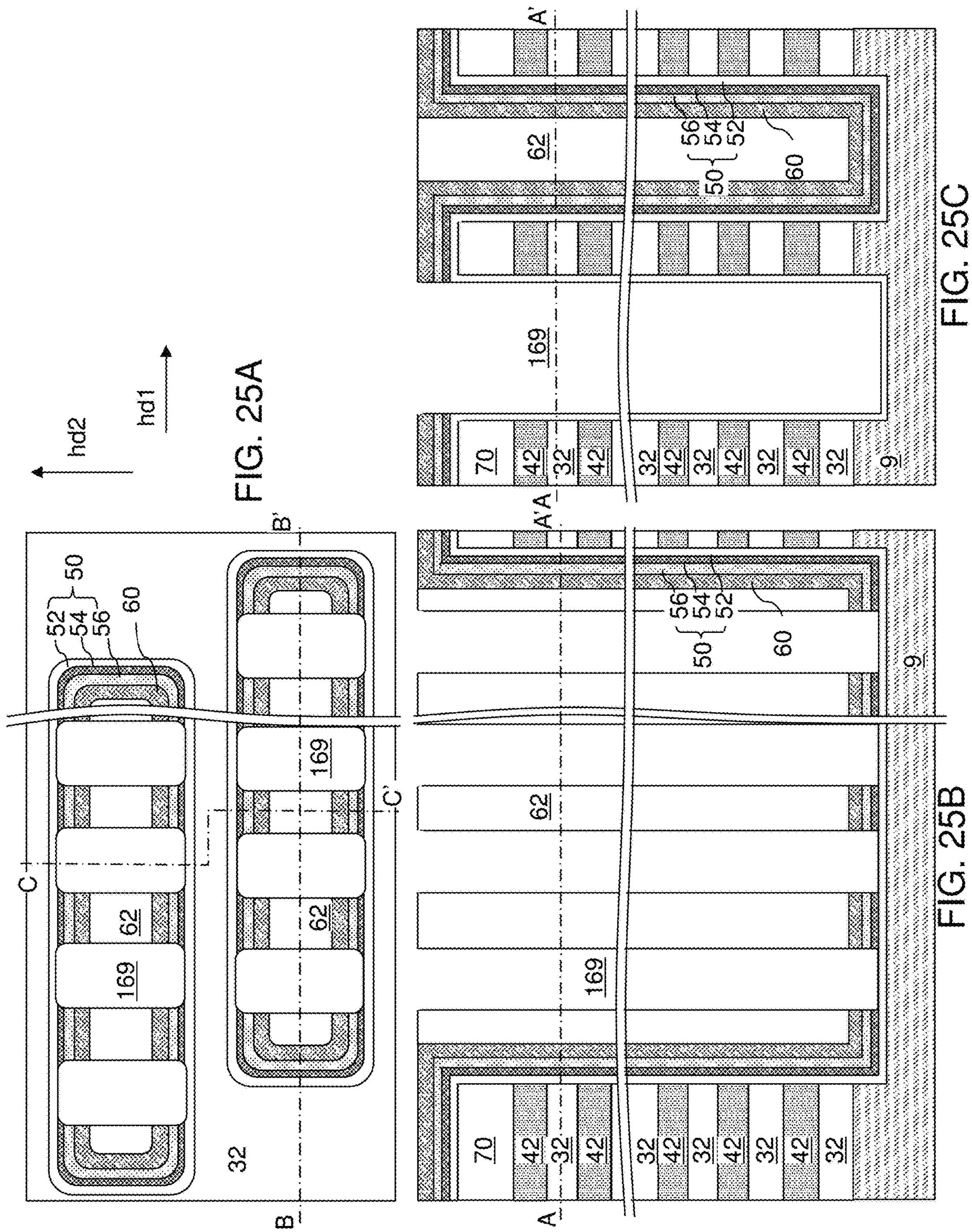
FIG. 25A is a top-down view of a region of the second exemplary structure after expanding the pillar cavities by isotropically etching the semiconductor channel layer according to a second embodiment of the present disclosure.
FIG. 25B is a vertical cross-sectional view along the vertical plane B-B' of the region of the second exemplary structure of FIG. 25A.
FIG. 25C is a vertical cross-sectional view along the vertical plane C-C' of the region of the second exemplary structure of FIG. 25A.

Referring to FIGS. 25A-25C, the pillar cavities 169 can be expanded by isotropically etching the semiconductor channel layer 60L. The isotropic etch process may include a wet etch step that isotropically etches the semiconductor material of the semiconductor channel layer 60L. For example, a wet etch process employing hot trimethyl-2 hydroxyethyl ammonium hydroxide ("hot TMY") or tetramethyl ammonium hydroxide (TMAH) may be employed to etch the semiconductor channel layer 60L. Remaining portions of the semiconductor channel layer 60L comprise vertical semiconductor channels 60.

Optionally, the isotropic etch process may include an additional processing step that etches the materials of the tunneling dielectric layer 56 and/or the charge storage layer 54. In this case, the tunneling dielectric layer 56 and/or the charge storage layer 54 may be removed around each pillar cavity 169.

Figures 26A, 26B, 26C:
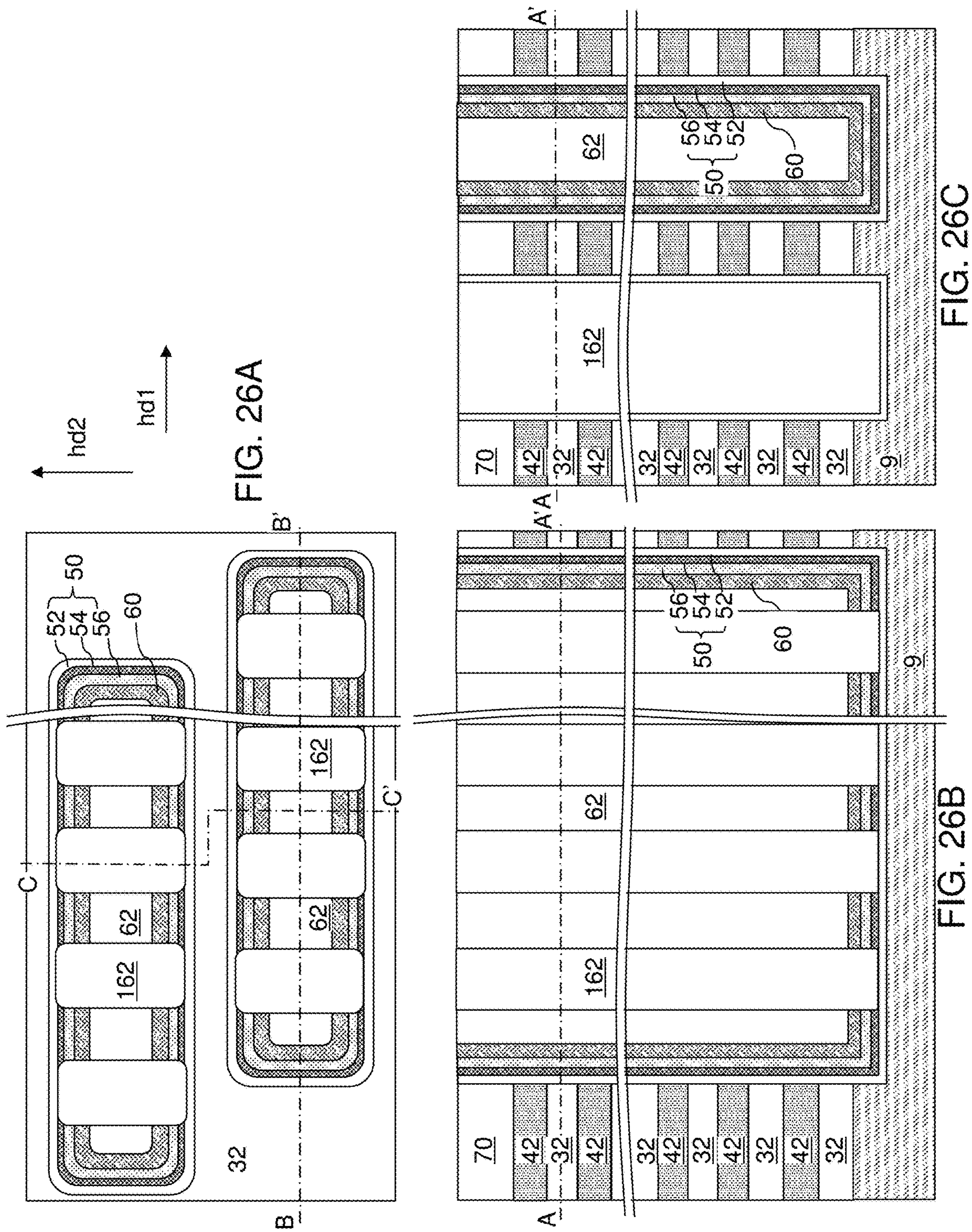
FIG. 26A is a top-down view of a region of the second exemplary structure after forming dielectric pillar structures according to a second embodiment of the present disclosure.
FIG. 26B is a vertical cross-sectional view along the vertical plane B-B' of the region of the second exemplary structure of FIG. 26A.
FIG. 26C is a vertical cross-sectional view along the vertical plane C-C' of the region of the second exemplary structure of FIG. 26A.
Figure 27A:
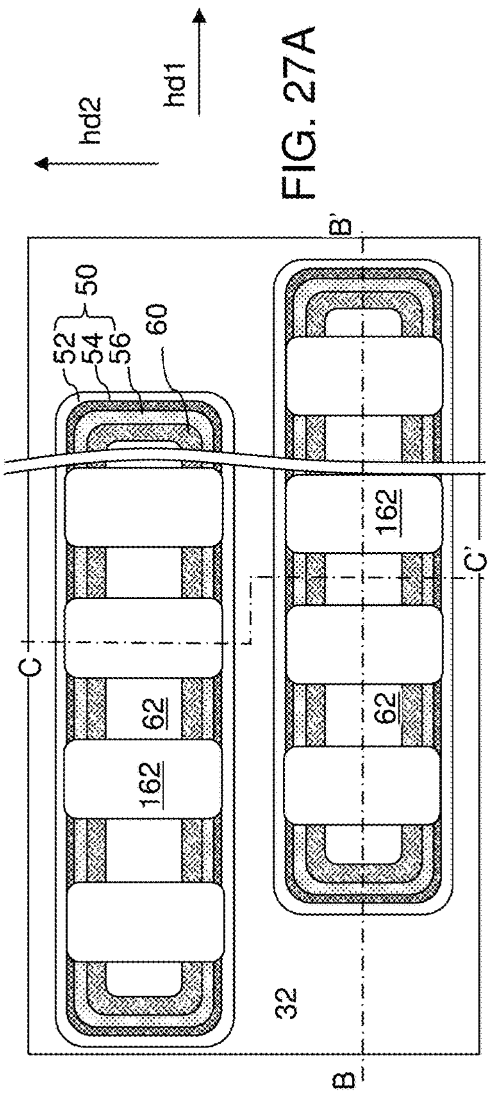
FIG. 27A is a top-down view of a region of the second exemplary structure after formation of drain regions according to a second embodiment of the present disclosure.
Figure 27B:
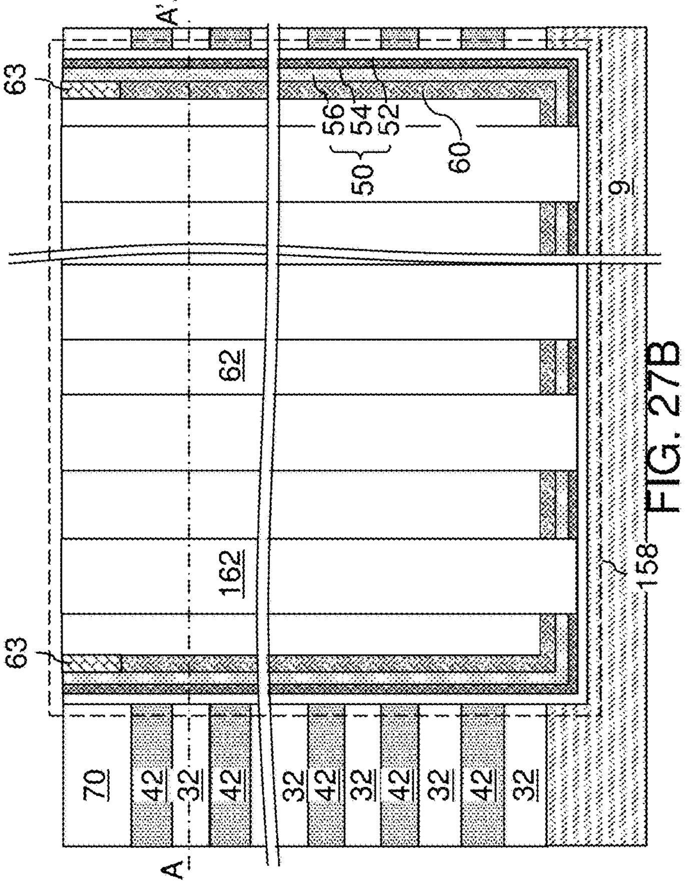
FIG. 27B is a vertical cross-sectional view along the vertical plane B-B' of the region of the second exemplary structure of FIG. 27A.
Figure 27C:
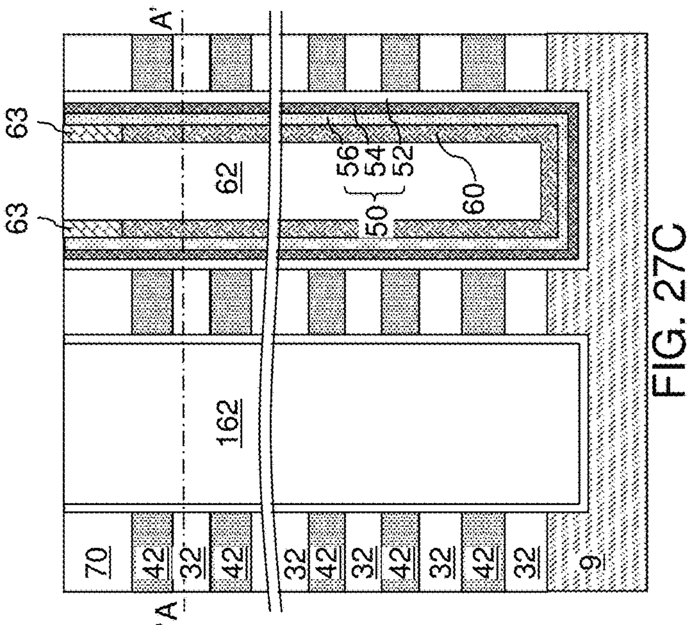
FIG. 27C is a vertical cross-sectional view along the vertical plane C-C' of the region of the second exemplary structure of FIG. 27A.

Referring to FIGS. 26A-26C, a dielectric fill material such as undoped silicate glass or a doped silicate glass can be deposited in the pillar cavities 169 by a conformal deposition process. Portions of the dielectric fill material, the memory film 50, and the semiconductor channel layer 60L located above the horizontal plane including the top surface of the insulating cap layer 70 can be removed by a planarization process such as a chemical mechanical planarization process. Each remaining portion of the dielectric fill material constitutes a dielectric pillar structure 162. A row of dielectric pillar structures 162 interlaced with a row of dielectric cores 62 can be formed within each elongated trench 149. Each remaining discrete portion of the semiconductor channel layer 60L comprises a vertical semiconductor channel 60. The memory film 50 is divided into a plurality of discrete memory films 50 located within a respective one of the elongated trenches 149.

Referring to FIGS. 27A-27C and 28A and 28B, dopants of the second conductivity type can be implanted into upper portions of the vertical semiconductor channels 60 to form drain regions 63. The drain regions 63 can have a doping of the second conductivity type, and can include dopants of the second conductivity type at an atomic concentration in a range from $5.0\times10^{18}/cm^3$ to $2.0\times10^{21}/cm^3$, although lesser and greater dopant concentrations can also be employed.

Figure 28A:
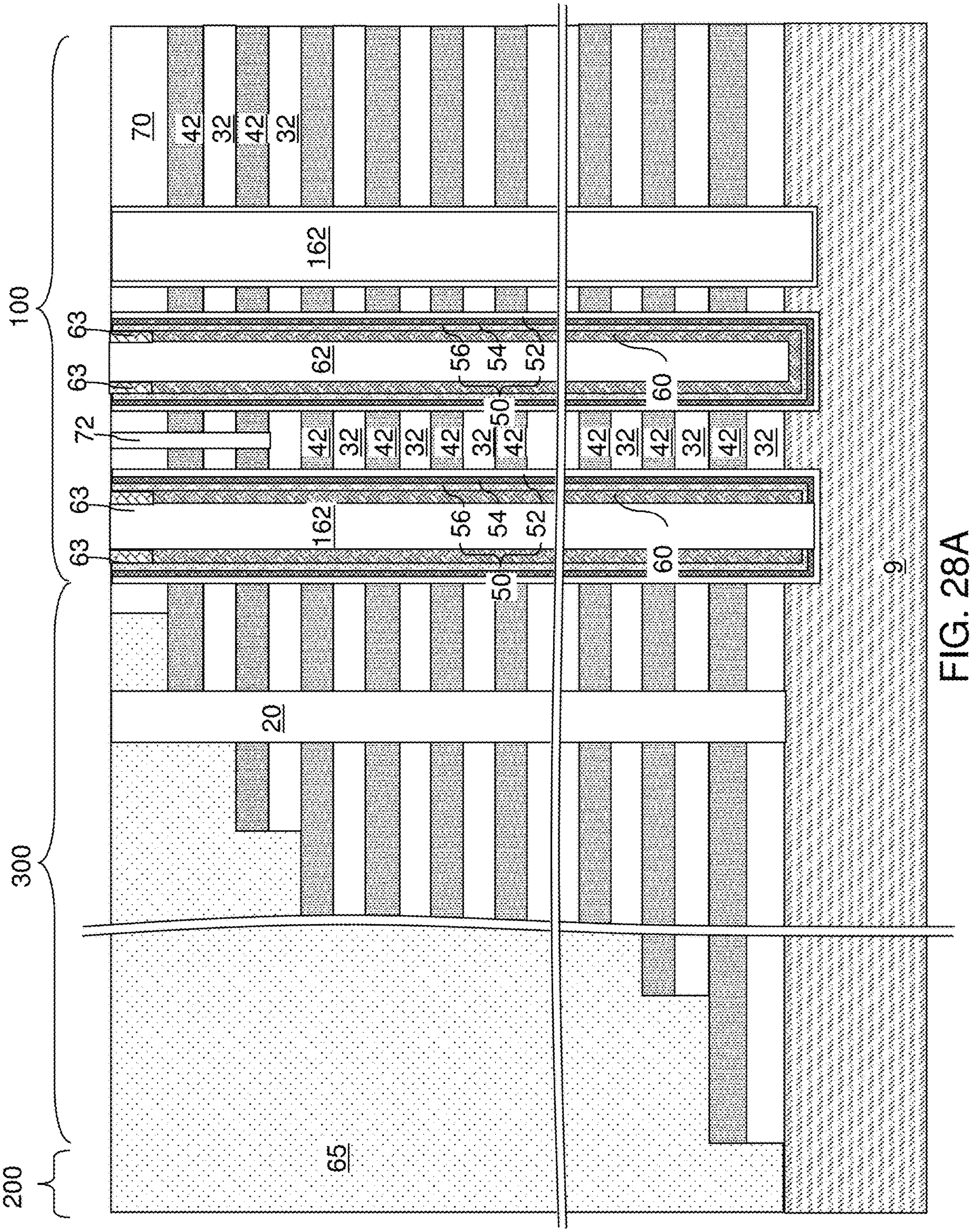
FIG. 28A is a vertical cross-sectional view of the second exemplary structure at the processing steps of FIGS. 27A-27C.
Figure 28B:
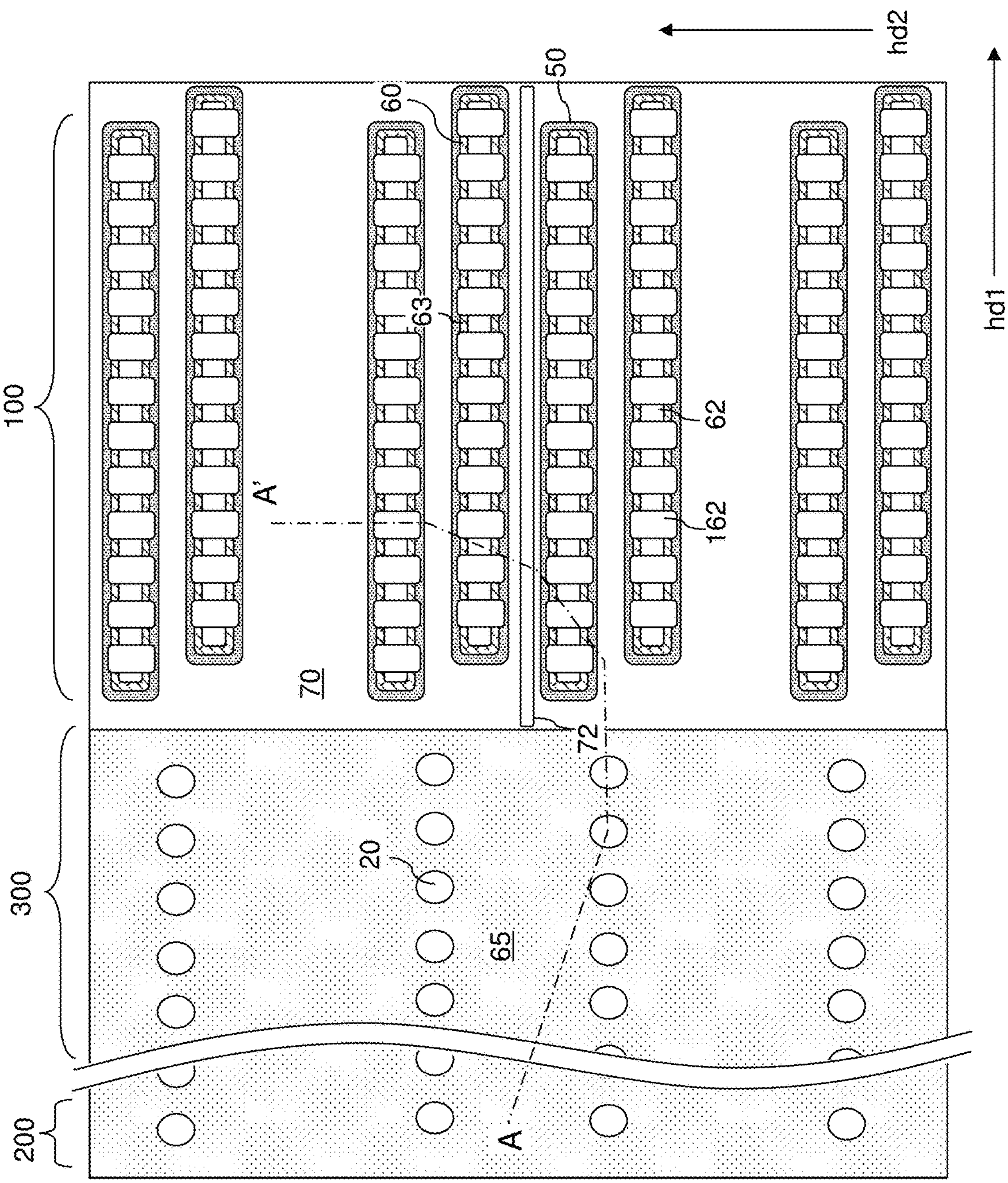
FIG. 28B is a top-down view of the second exemplary structure of FIG. 28A. The vertical plane A-A' is the plane of the vertical cross-section of FIG. 28A.

Each contiguous set of a memory film 50 and a vertical semiconductor channel 60 constitutes a memory stack structure (50, 60). Generally, two rows of memory stack structures (50, 60) may be formed within each of the elongated trenches 149 by patterning the semiconductor channel layer 60L and the memory film 50. The two rows of memory stack structures (50, 60) can be arranged along the first horizontal direction hd1, and can be laterally spaced apart from each other along the second horizontal direction hd2. Each of the memory stack structures (50, 60) comprises a vertical semiconductor channel 60 that is a patterned portion of the semiconductor channel layer 60L and a patterned portion of the memory film 50 as formed at the processing steps of FIGS. 23A-23C. A trench fill structure 158 can be formed within each elongated trench 149. Drain-select-level dielectric isolation structures 72 may be formed between sets of elongated trenches 149, as shown in FIGS. 28A and 28B. The drain-select-level dielectric isolation structures 72 are omitted in subsequent figures for clarity.

FIGS. 29A-29E illustrate sequential top-down view of an alternative configuration for the elongated trench 149 according to the second embodiment of the present disclosure.

Figure 29A:
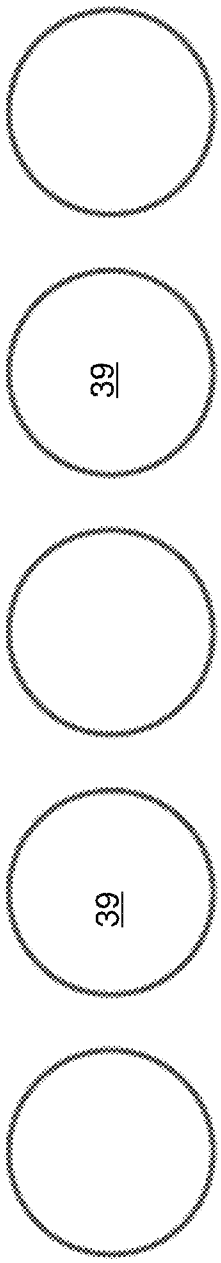
FIGS. 29A-29E are sequential top-down view of an alternative configuration for a line trench according to the second embodiment of the present disclosure.

Referring to FIG. 29A, the alternative configuration of the second exemplary structure can be derived from the first exemplary structure of FIGS. 2A and 2B by forming rows of discrete openings 39 through the alternating stack (32, 42) in lieu of the elongated trenches 149 that are formed at the processing steps of FIGS. 21A and 21B and 22A-22C. In one embodiment, each of the discrete openings 39 may have a generally circular horizontal cross-sectional shape.

Figure 29B:
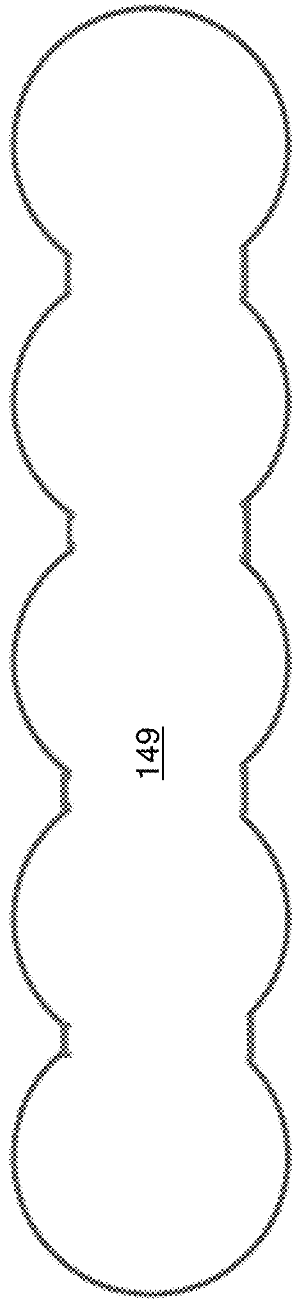

Referring to FIG. 29B, the discrete openings 39 can be isotropically expanded such that each row of discrete openings 39 merge to form a respective elongated trench 149. For example, the discrete openings 39 can be isotropically laterally recessed by isotropic etching such that each row of discrete openings 39 merges to form an elongated trench 149. In this case, each elongated trench 149 may laterally extend along the first horizontal direction, and may have a modulated width along the second horizontal direction.

Figure 29C:
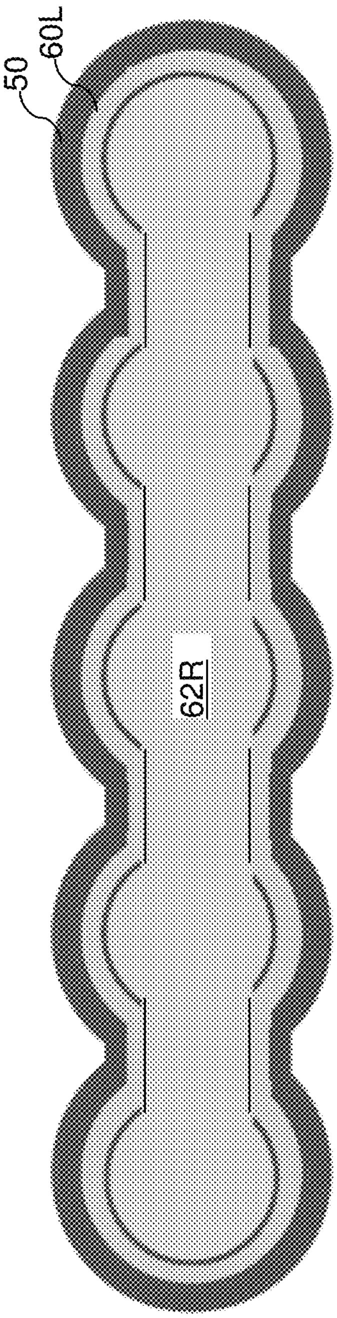

Referring to FIG. 29C, the processing steps of FIGS. 23A-23C can be performed to form a memory film 50 and a semiconductor channel layer 60L. A dielectric fill material such as silicon oxide can be deposited in remaining volumes of the elongated trenches 149, for example, by a conformal deposition process. Excess portions of the dielectric fill material can be removed from above the topmost surface of the semiconductor channel layer 60L by a planarization process such as a recess etch process and/or a chemical mechanical planarization process. Each remaining portion of the dielectric fill material in the elongated trenches 149 comprises a dielectric core rail 62R.

Figure 29D:
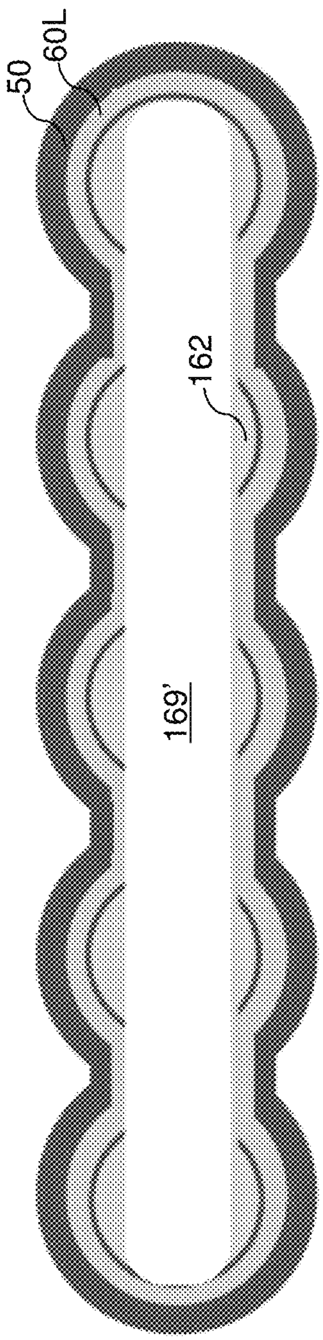

Referring to FIG. 29D, a pillar cavity 169' can be formed through each dielectric core rail 62R. In one embodiment, each pillar cavity 169' can laterally extend through each laterally bulging portion of a respective one of the elongated trenches 149. Sidewalls of the semiconductor channel layer 60L can be physically exposed after formation of the pillar cavities 169'. Specifically, two rows of vertically-extending surfaces of the semiconductor channel layer 60L can be physically exposed within each elongated trench 149.

Figure 29E:
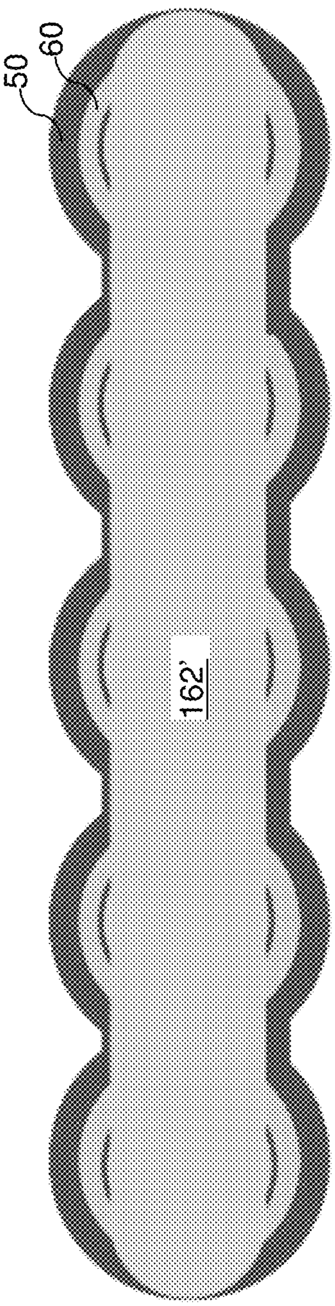

Referring to FIG. 29E, physically exposed portions of the semiconductor channel layer 60L can be isotropically etched, for example, by an isotropic wet etch process. Optionally, physically exposed portions of the memory film 50 can be etched so that portions of the charge storage layer 54 located between remaining portions of the semiconductor channel layer 60L (which comprise vertical semiconductor channels 60) are removed.

Subsequently, the processing steps of FIGS. 26A-26C can be performed to form a dielectric pillar structure 162' within each pillar cavity 169'. Remaining portions of the semiconductor channel layer 60L comprise the vertical semiconductor channels 60. The memory film 50 is divided into a plurality of memory films 50. Each contiguous combination of a vertical semiconductor channel 60 and a memory film 50 constitutes a memory stack structure (50, 60). The processing steps of FIGS. 27A-27A, 28A, and 28B can be performed to form drain regions 63.

Generally, two rows of memory stack structures (50, 60) can be formed within each of the elongated trenches 149 by patterning the semiconductor channel layer 60L and the memory film 50. The two rows of memory stack structures (50, 60) can be arranged along the first horizontal direction hd1, and can be laterally spaced apart from each other along the second horizontal direction hd2. Each of the memory stack structures (50, 60) comprises a vertical semiconductor channel 60 that is a patterned portion of the semiconductor channel layer 60L and a patterned portion of the memory film 50 as formed at the processing steps of FIG. 29E.

Figure 30A:
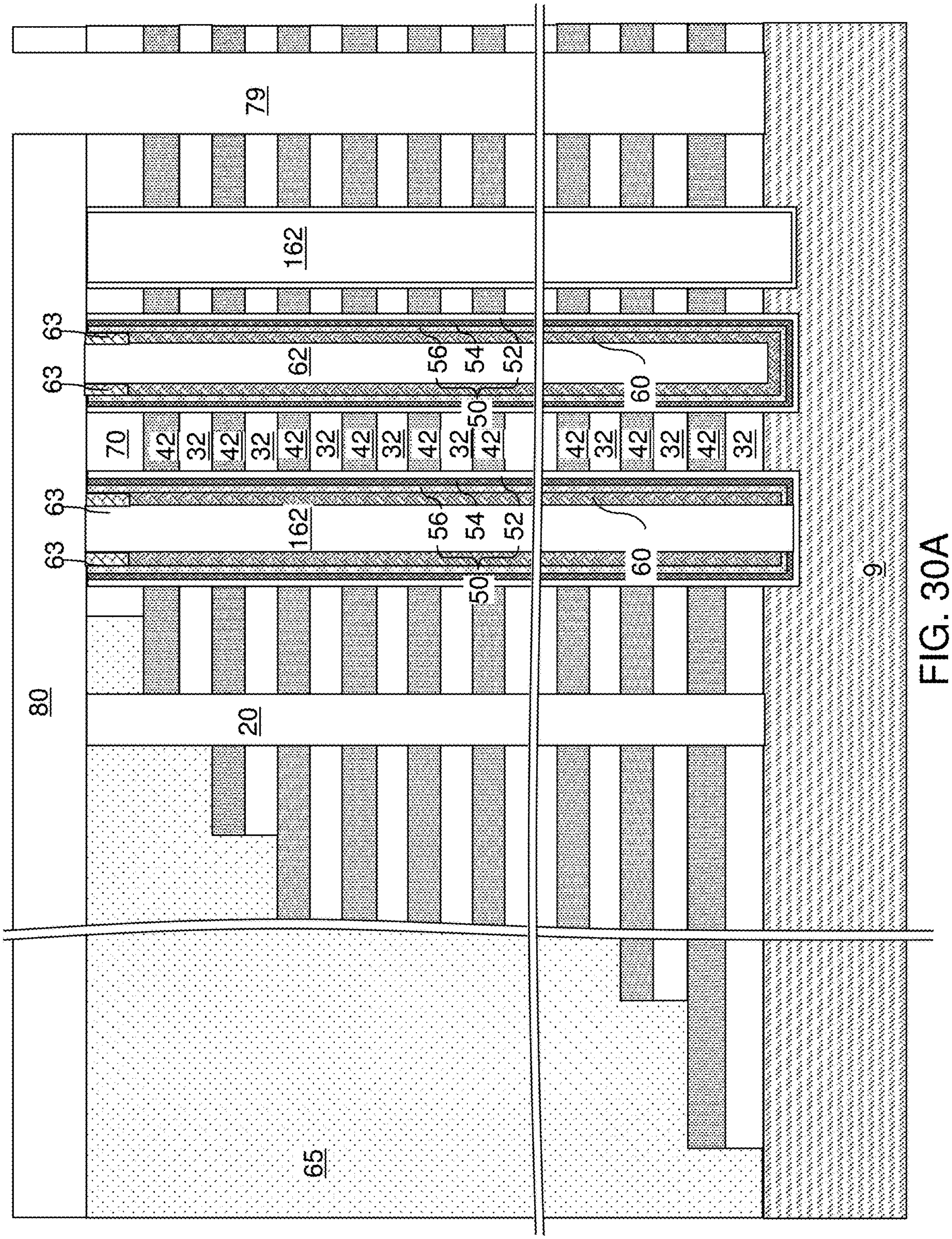
FIG. 30A is a schematic vertical cross-sectional view of the second exemplary structure after formation of backside trenches according to the second embodiment of the present disclosure.
Figure 30B:
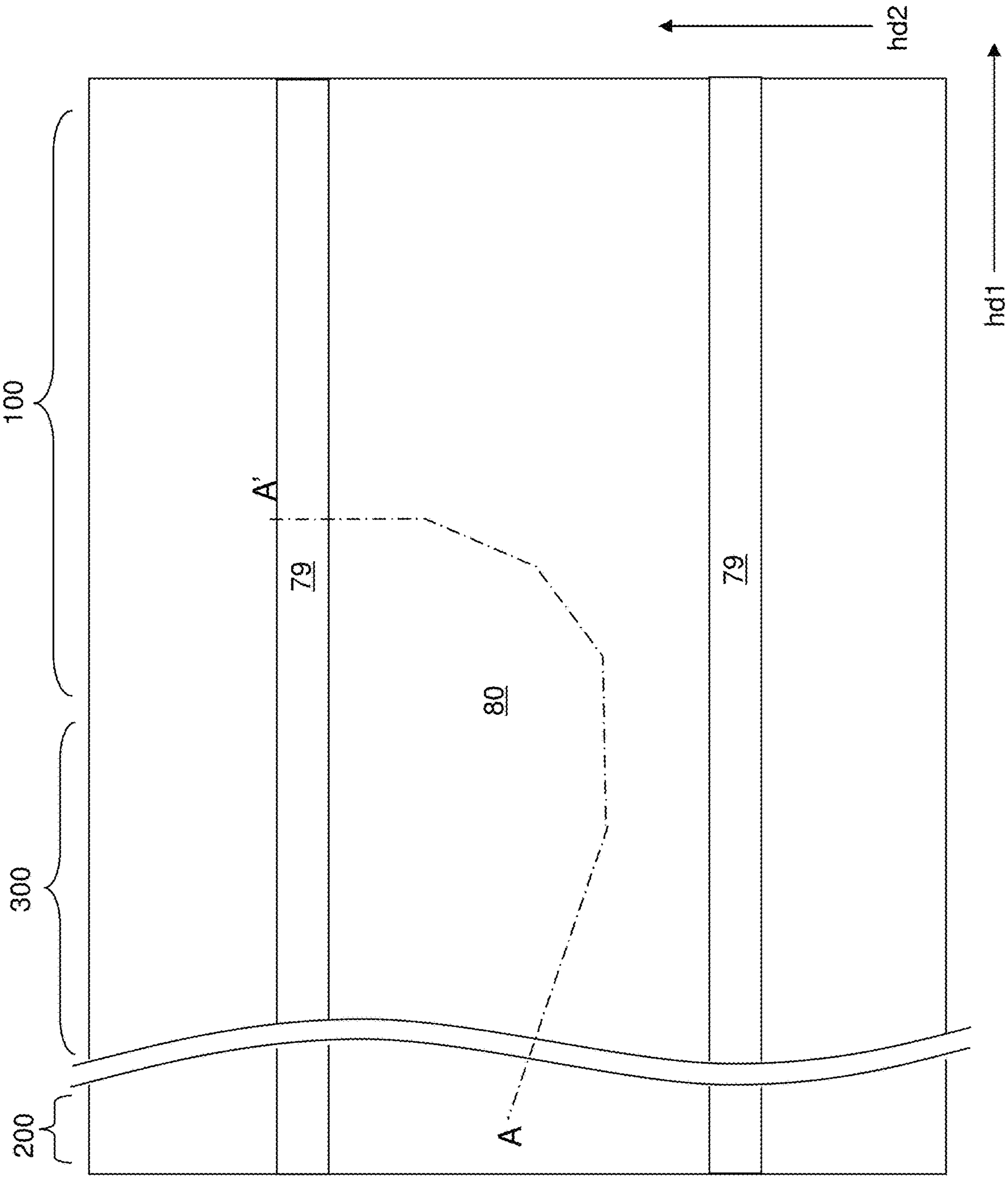
FIG. 30B is a top-down view of the second exemplary structure of FIG. 30A.

Referring to FIGS. 30A and 30B, a contact-level dielectric layer 80 can be formed over the insulating cap layer. Backside trenches 79 can be formed through the contact-level dielectric layer 80, the insulating cap layer 70, and the alternating stack (32, 42). For example, the processing steps of FIGS. 7A and 7B can be performed with any needed modifications to form the backside trenches 79. The pattern of the backside trenches 79 in a top-down view can be the same as the pattern of the backside trenches 79 in the first exemplary structure of FIGS. 7A and 7B.

Figure 31:
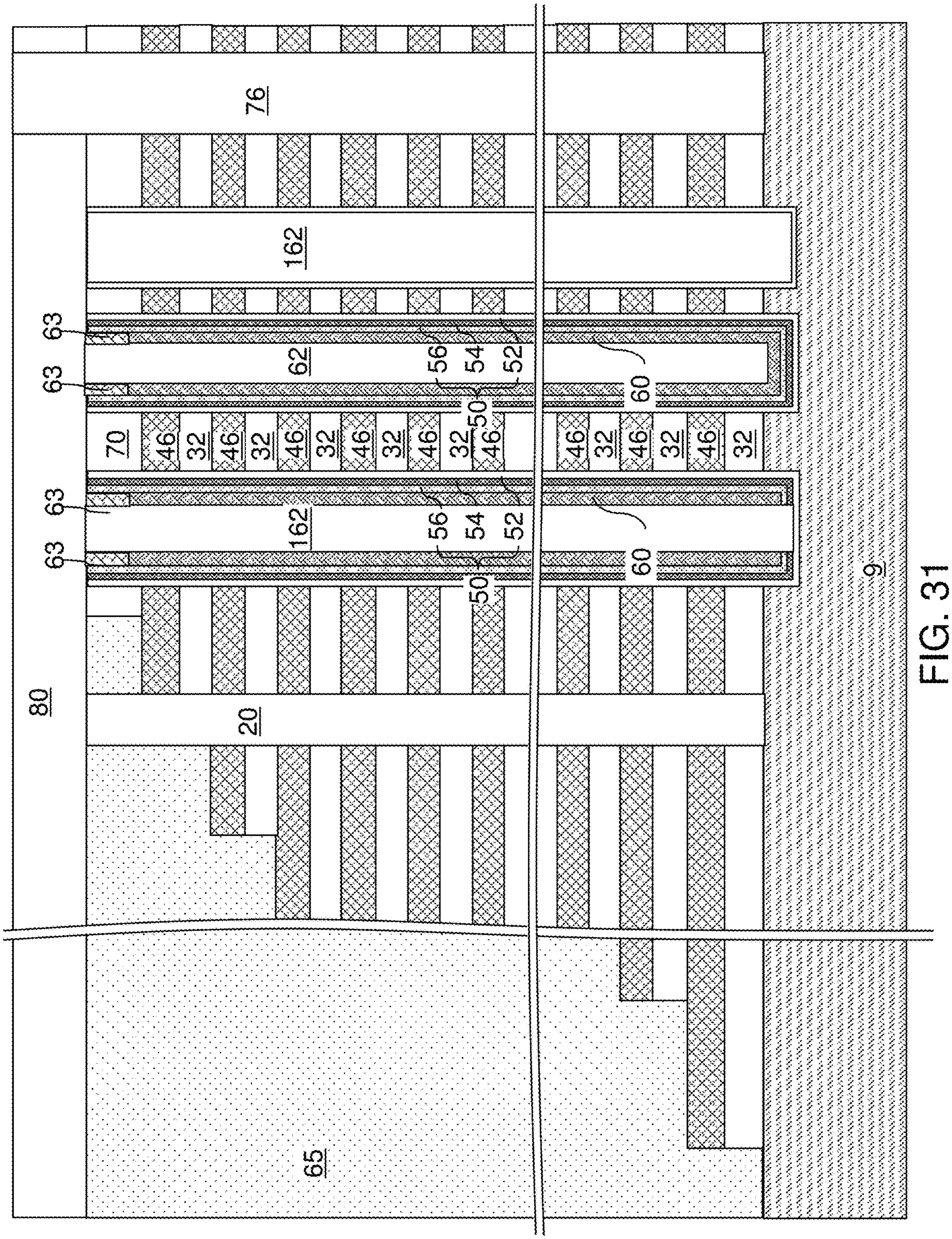
FIG. 31 is a schematic vertical cross-sectional view of the second exemplary structure after replacement of the sacrificial material layers with electrically conductive layers and after formation of backside trench fill structures according to the second embodiment of the present disclosure.

Referring to FIG. 31, the processing steps of FIGS. 8, 9, and 10 can be performed with any needed modifications to replace the sacrificial material layers 42 with electrically conductive layers 46, and to form backside trench fill structures 76.

Figure 32A:
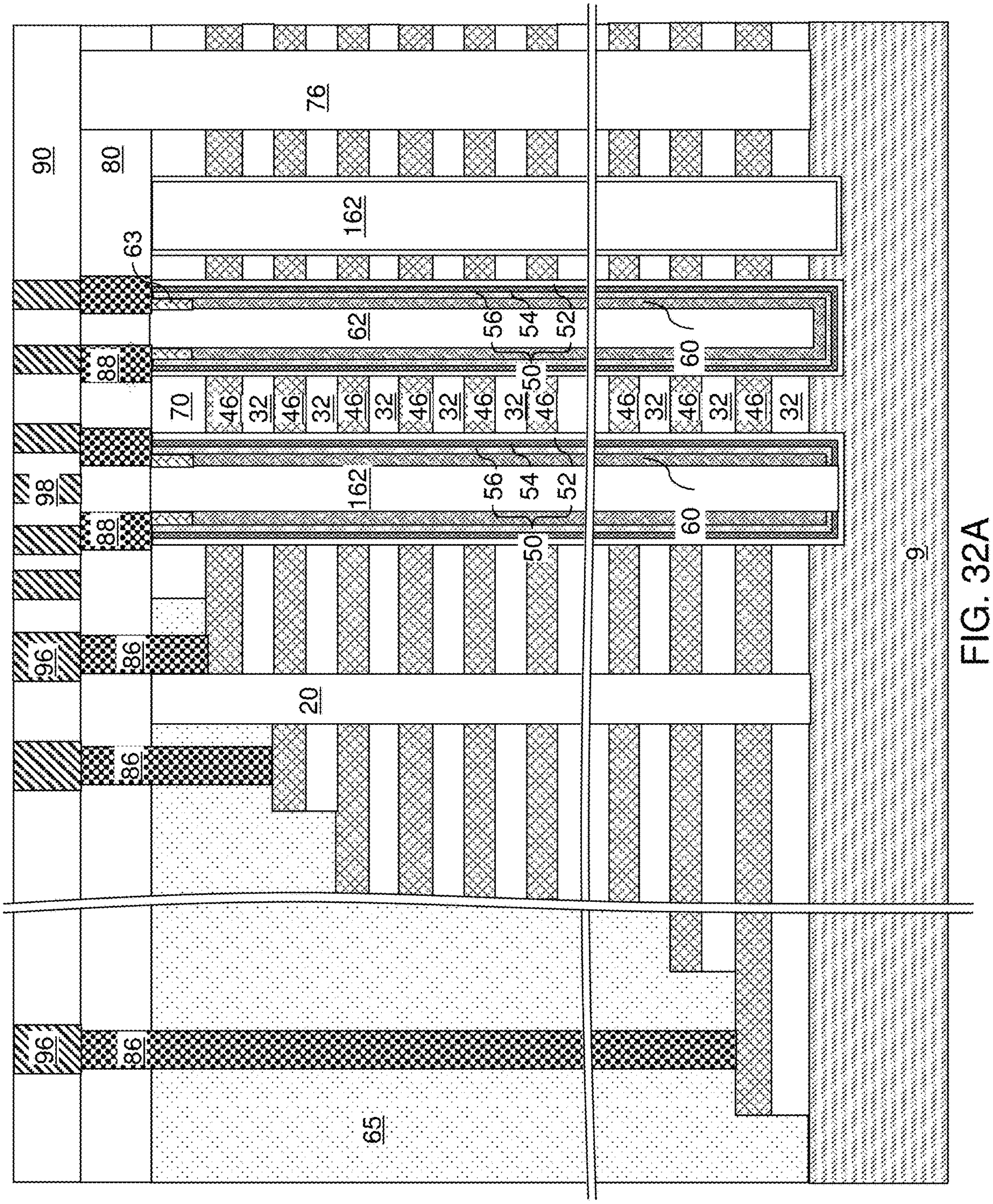
FIG. 32A is a schematic vertical cross-sectional view of the second exemplary structure after formation of bit-line-level metal interconnect structures according to the second embodiment of the present disclosure.
Figure 32B:
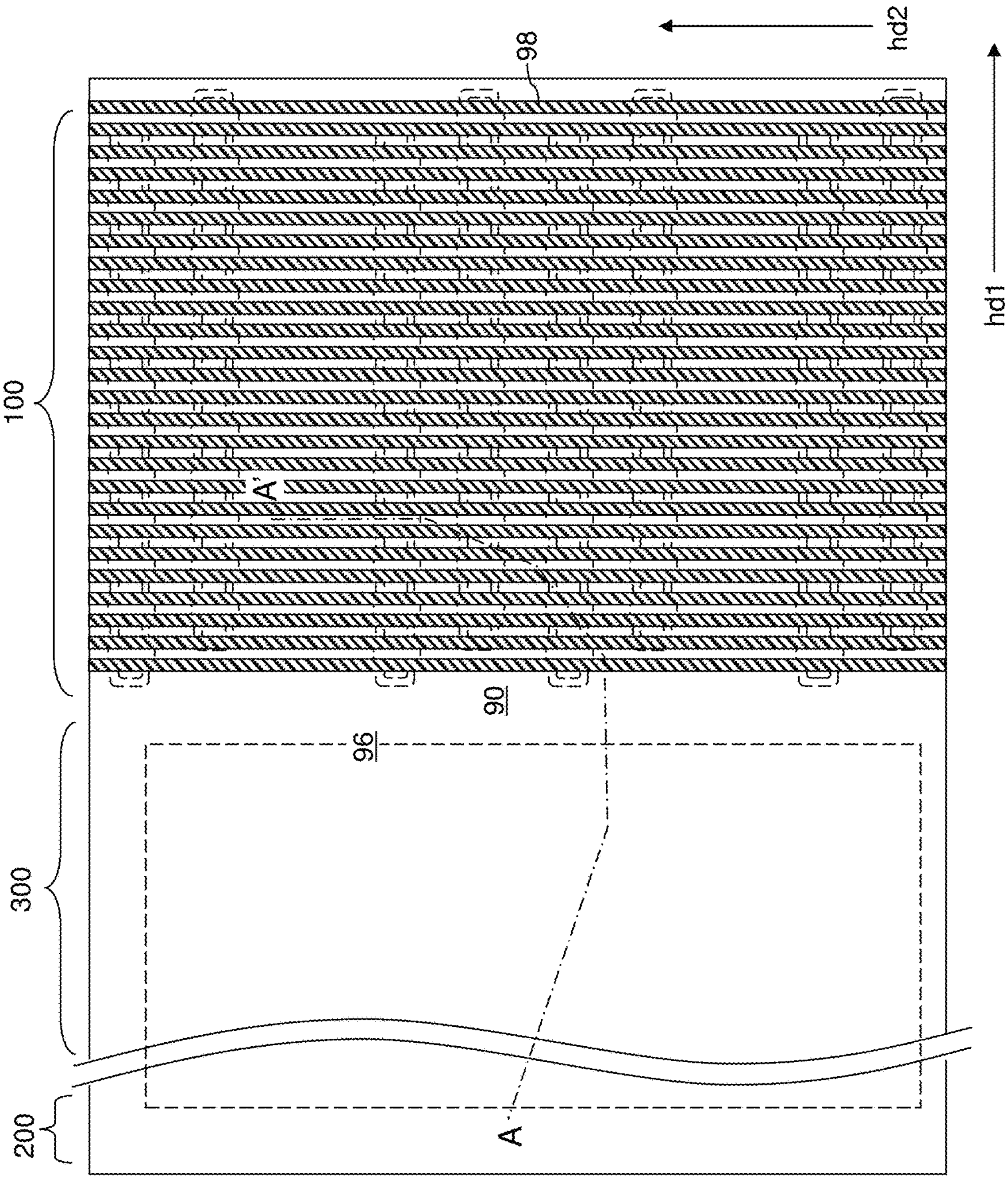
FIG. 32B is a top-down view of the second exemplary structure of FIG. 32A.

Referring to FIGS. 32A and 32B, the processing steps of FIGS. 15A, 15B, 16A, and 16B can be performed to form various contact via structures (86, 88), a line-level dielectric layer 90, and metal lines (98, 96), including the bit lines 98. The pattern of the various contact via structures (86, 88) and the metal lines (98, 96) may be modified as needed.

Figure 33:
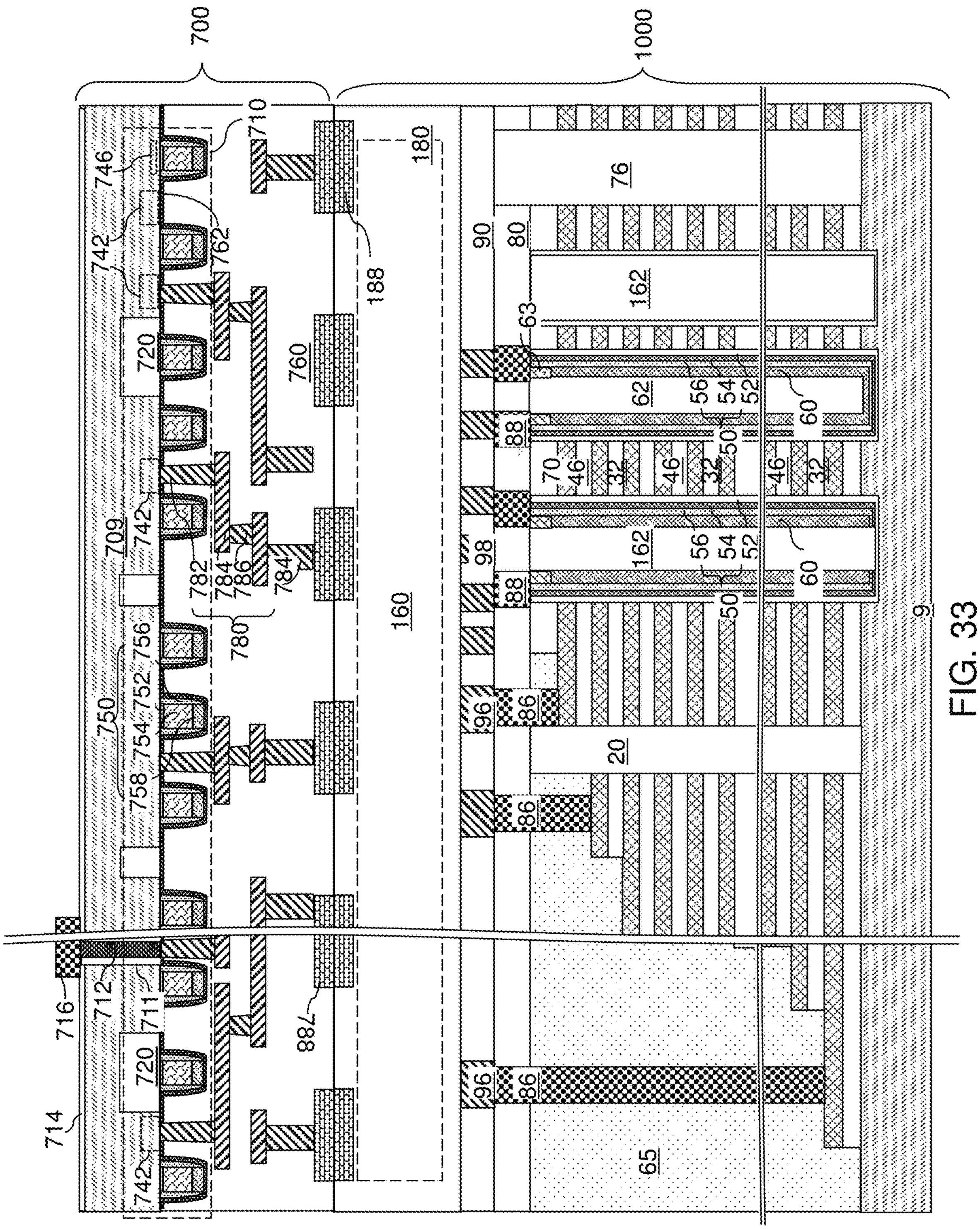
FIG. 33 is a schematic vertical cross-sectional view of the second exemplary structure after attaching a logic die to a memory die according to the second embodiment of the present disclosure.

Referring to FIG. 33, the processing steps of FIG. 17 can be performed with any needed modifications to form metal interconnect structures 180 and memory-side bonding pads 188 that are embedded within dielectric material layers 160. A memory die 1000 can be provided as a first semiconductor die. The processing steps of FIG. 18 can be performed with any needed modifications to provide a logic die 700, and to bond the logic die to the memory die 1000 of the second embodiment.

Figure 34:
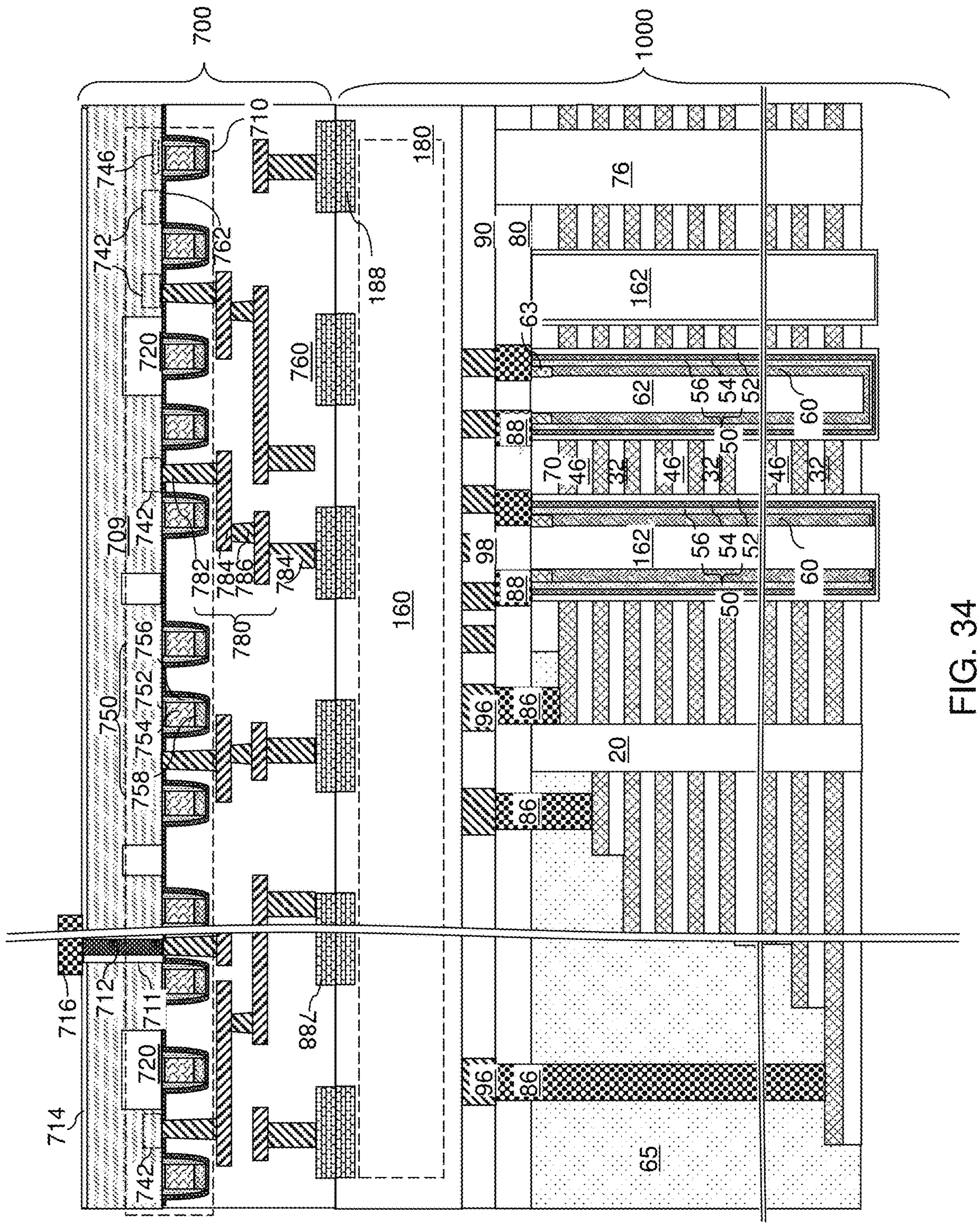
FIG. 34 is a schematic vertical cross-sectional view of the second exemplary structure after removal of a substrate according to the second embodiment of the present disclosure.
Figure 35:
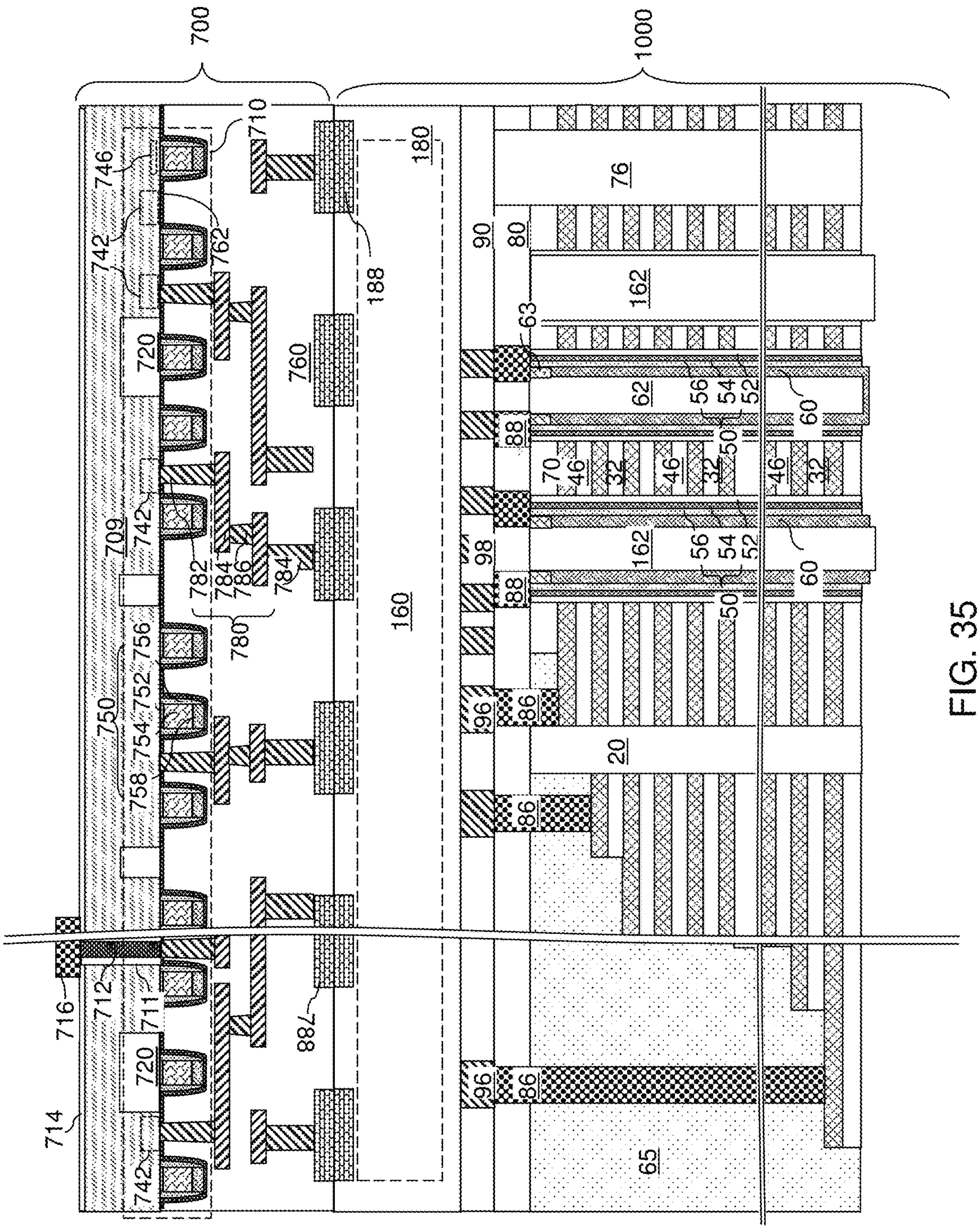
FIG. 35 is a schematic vertical cross-sectional view of the second exemplary structure after removal of physically exposed portions of the memory films according to the second embodiment of the present disclosure.
Figure 36A:
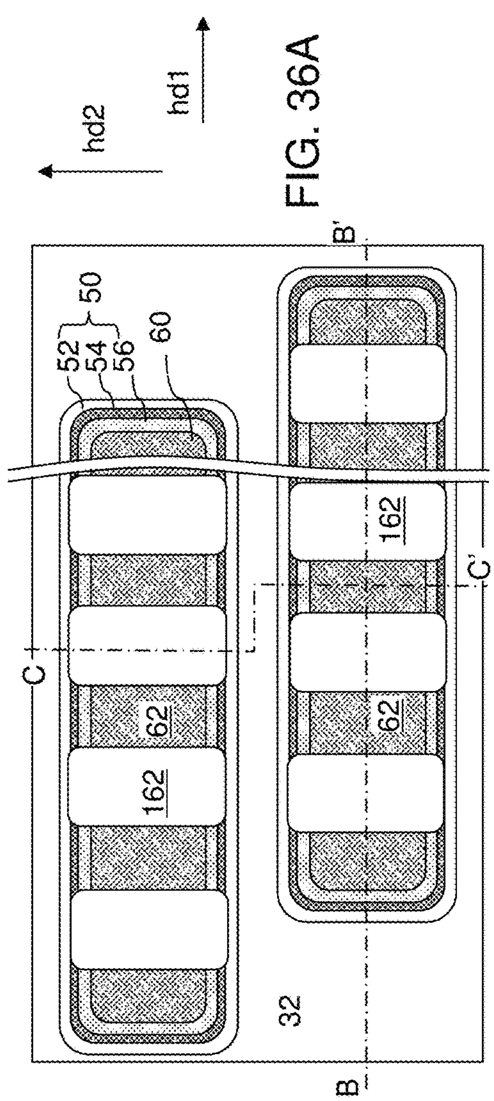
FIG. 36A is a bottom-up view of a region of the second exemplary structure of FIG. 35.
Figure 36B:
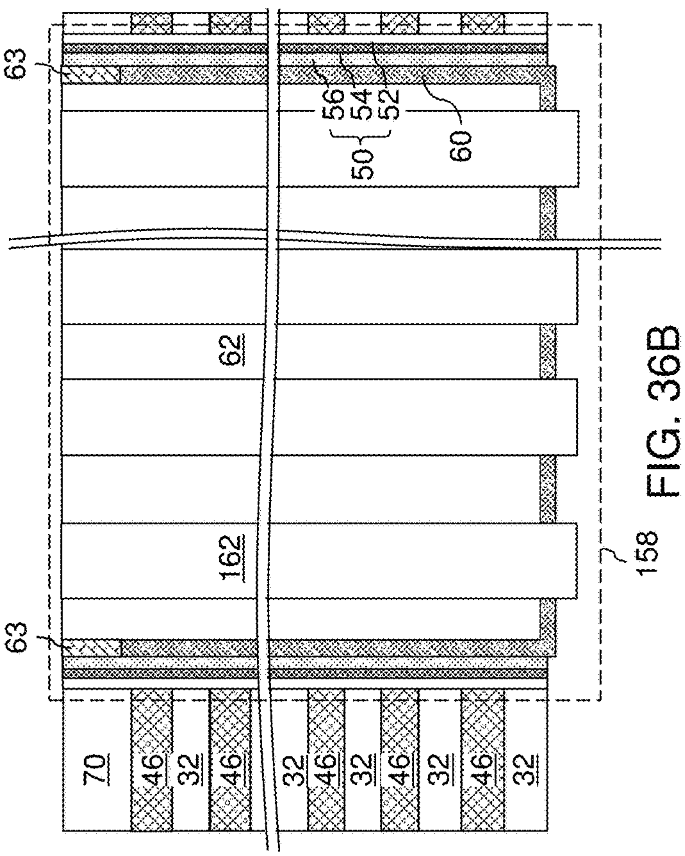
FIG. 36B is a vertical cross-sectional view along the vertical plane B-B' of the region of the second exemplary structure of FIG. 36A.
Figure 36C:
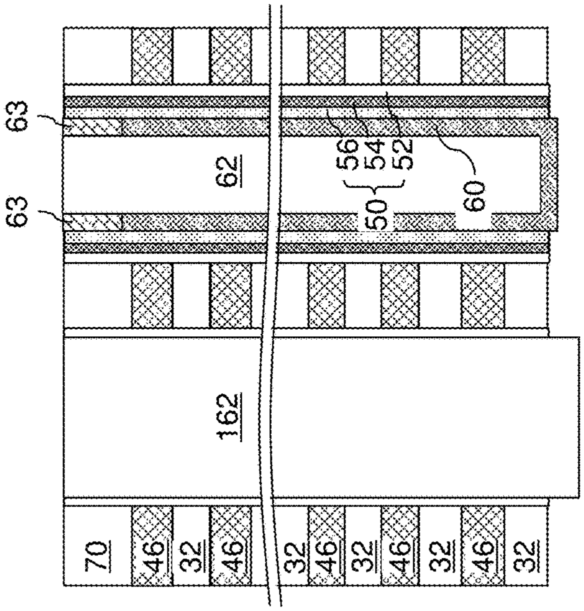
FIG. 36C is a vertical cross-sectional view along the vertical plane C-C' of the region of the second exemplary structure of FIG. 36A.

Referring to FIG. 34, the processing steps of FIG. 19 can be performed with any needed modifications to remove the substrate semiconductor layer 9 of the memory die 1000.

Referring to FIGS. 35 and 36A-36C, a sequence of isotropic etch processes can be performed to remove physically exposed portions of the various layers of the memory films 50. For example, a first wet etch process can be performed to remove physically exposed end portions of each blocking dielectric layer 52, a second wet etch process can be performed to remove physically exposed end portions of each charge storage layer 54, and a third wet etch process can be performed to remove physically exposed end portions of each tunneling dielectric layer 56. Surfaces of end portions of the vertical semiconductor channels 60 can be physically exposed.

Figure 37A:
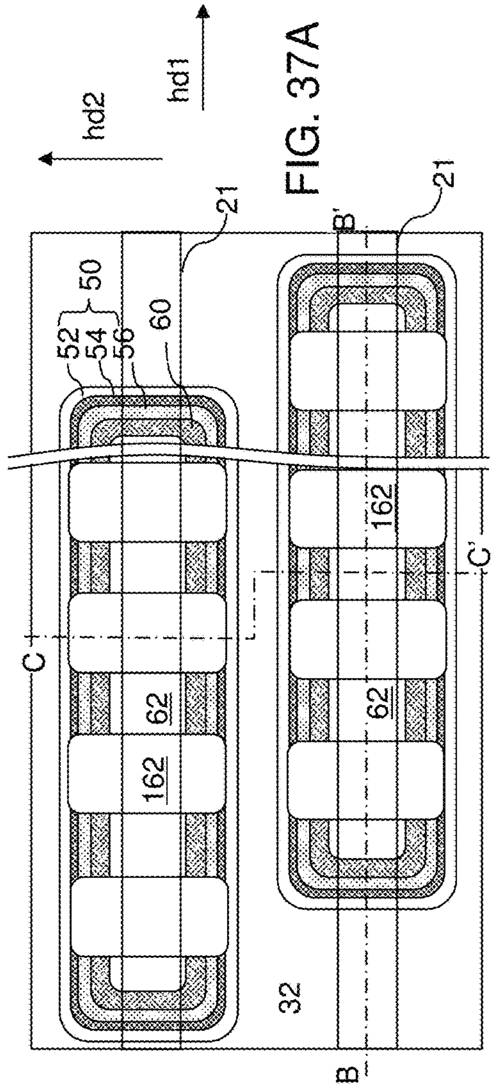
FIG. 37A is a bottom-up view of a region of the second exemplary structure after formation of source-select-level isolation trenches according to the second embodiment of the present disclosure.
Figure 37B:
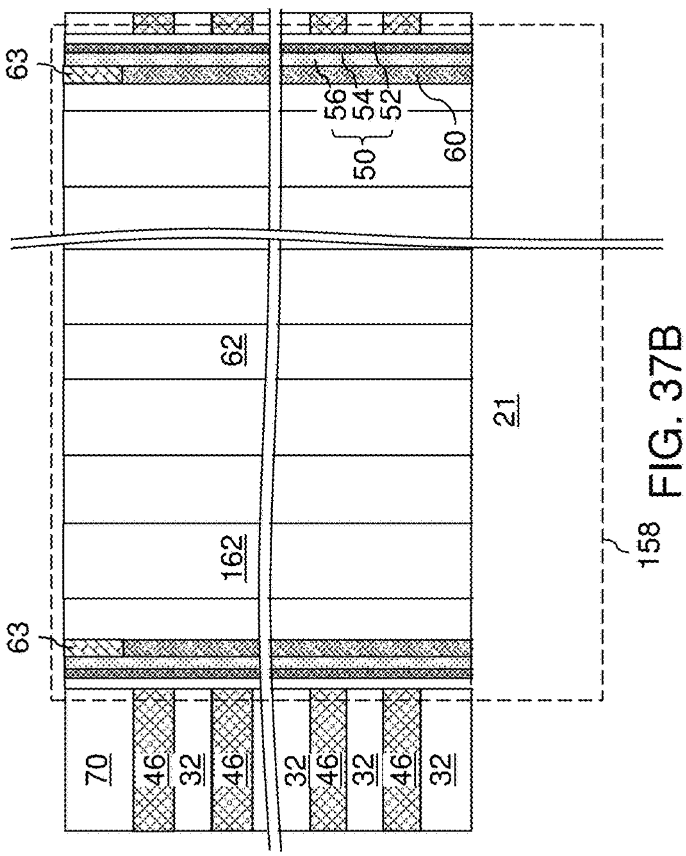
FIG. 37B is a vertical cross-sectional view along the vertical plane B-B' of the region of the second exemplary structure of FIG. 37A.
Figure 37C:
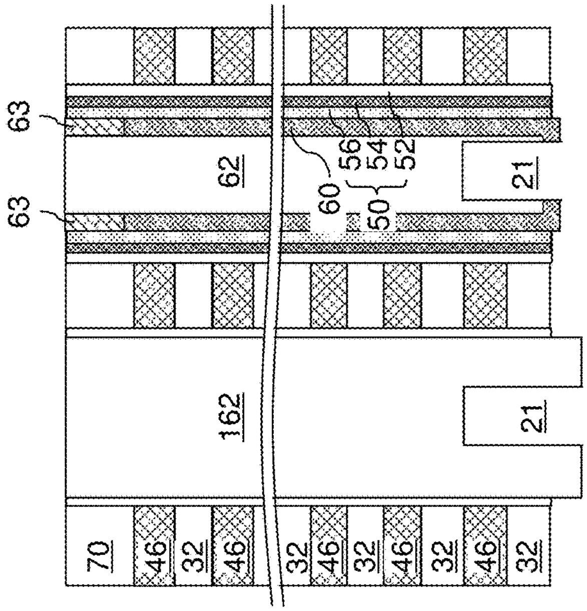
FIG. 37C is a vertical cross-sectional view along the vertical plane C-C' of the region of the second exemplary structure of FIG. 37A.

Referring to FIGS. 37A-37C, the bonded assembly of the second exemplary structure may be disposed upside down, and a photoresist layer (not shown) can optionally be applied over the physically exposed surface of an insulating layer 32 and the end surfaces of the vertical semiconductor channels 60. The photoresist layer can be lithographically patterned to form elongated openings (such as rectangular openings) that extend over center regions of a respective trench fill structure 158 along the first horizontal direction hd1. In one embodiment, each elongated opening in the photoresist layer may have a uniform width along the second horizontal direction hd2 that is less than the separation distance along the second horizontal direction hd2 between vertically-extending portions of the vertical semiconductor channels 60 within two rows of vertical semiconductor channels 60 within the trench fill structure 158.

An optional anisotropic etch process can be performed to transfer the pattern of the elongated openings through the horizontally-extending end portions of the vertical semiconductor channels 60. This etching step splits the source-side ends of the vertical semiconductor channels 60. In one embodiment, the duration of the anisotropic etch process can be selected such that source-select-level isolation trenches 21 can be formed underneath the elongated openings in the photoresist layer. In one embodiment, the source-select-level isolation trenches 21 can divide at least one electrically conductive layer 46 into a plurality of electrically conductive layers 46 that are laterally spaced apart among one another by the source-select-level isolation trenches 21. The source-select-level isolation trenches 21 may vertically extend through one electrically conductive layer 46, or may vertically extend through a plurality of electrically conductive layers 46 (which may be 2~8 electrically conductive layers 46, for example). The electrically conductive layers 46 that are divided by the source-select-level isolation trenches 21 may be employed to activate or deactivate a respective row of vertical semiconductor channels 60 from the source side, and thus, are herein referred to as source-select-level electrically conductive layers 46 (i.e., source-side select gate electrodes). The photoresist layer can be subsequently removed, for example, by ashing.

Generally, source-select-level isolation trenches 21 can laterally extend along the first horizontal direction hd1. Each of the source-select-level isolation trenches 21 laterally extends through a respective one of the elongated trenches 149. At least a most proximal one of the electrically conductive layers 46 may be divided into a plurality of source-select-level electrically conductive layers. The source-select-level electrically conductive layers are laterally spaced apart from each other by the source-select-level isolation trenches 21.

Figures 38A, 38B, 38C:
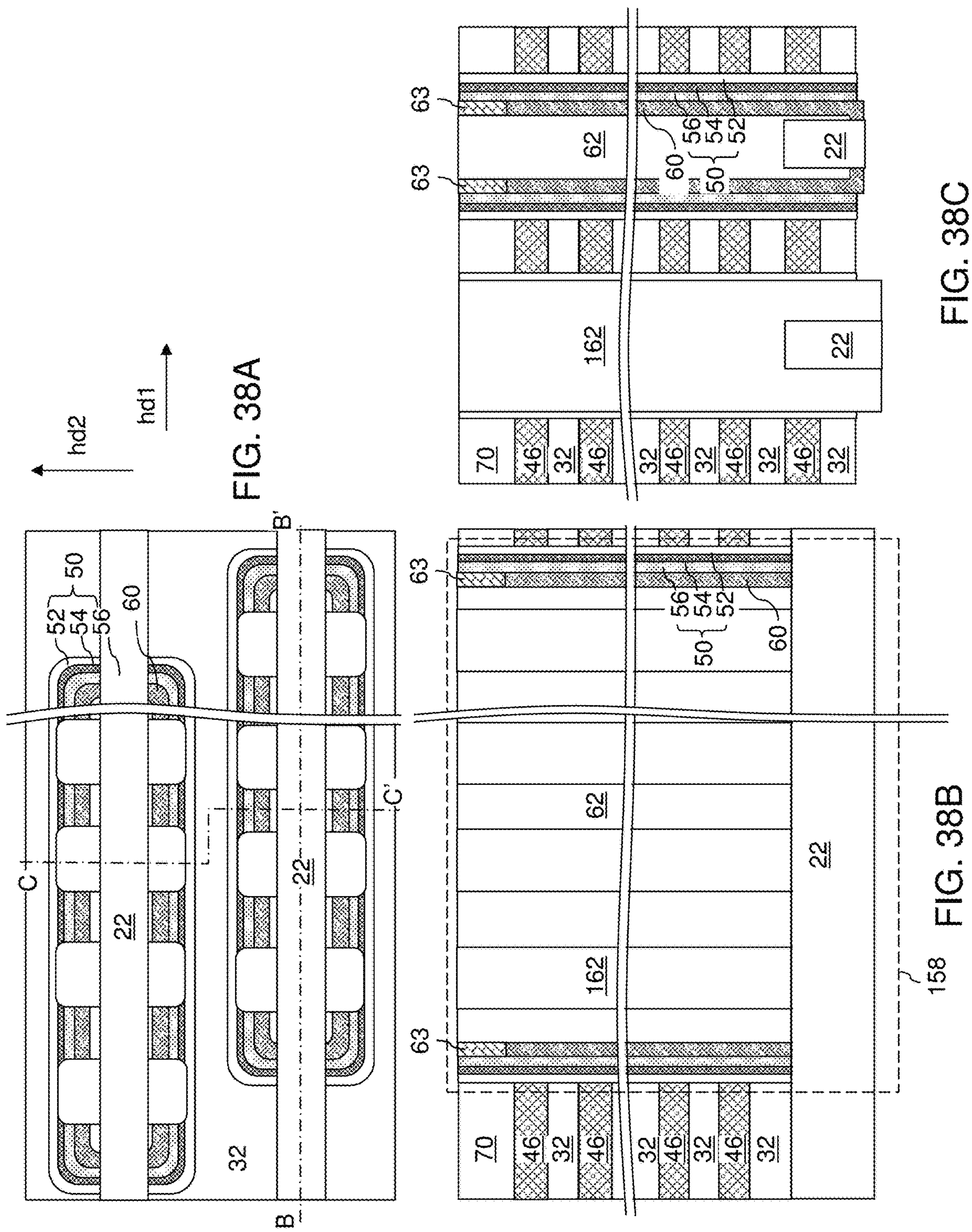
FIG. 38A is a bottom-up view of a region of the second exemplary structure after formation of source-select-level dielectric isolation structures according to the second embodiment of the present disclosure.
FIG. 38B is a vertical cross-sectional view along the vertical plane B-B' of the region of the second exemplary structure of FIG. 38A.
FIG. 38C is a vertical cross-sectional view along the vertical plane C-C' of the region of the second exemplary structure of FIG. 38A.

Referring to FIGS. 38A-38C, an optional dielectric fill material such as undoped silicate glass or a doped silicate glass can be deposited in the source-select-level isolation trenches 21, for example, by a conformal deposition process. Portions of the dielectric fill material located outside the source-select-level isolation trenches 21 can be removed, for example, by a recess etch process and/or a chemical mechanical planarization process. Remaining portions of the dielectric fill material in the source-select-level isolation trenches 21 comprise source-select-level dielectric isolation structures 22 which electrically isolate the split source-side ends of the vertical semiconductor channels 60. In an alternative embodiment, the source-select-level isolation trenches 21 and the source-select-level dielectric isolation structures 22 may be omitted.

Figure 39:
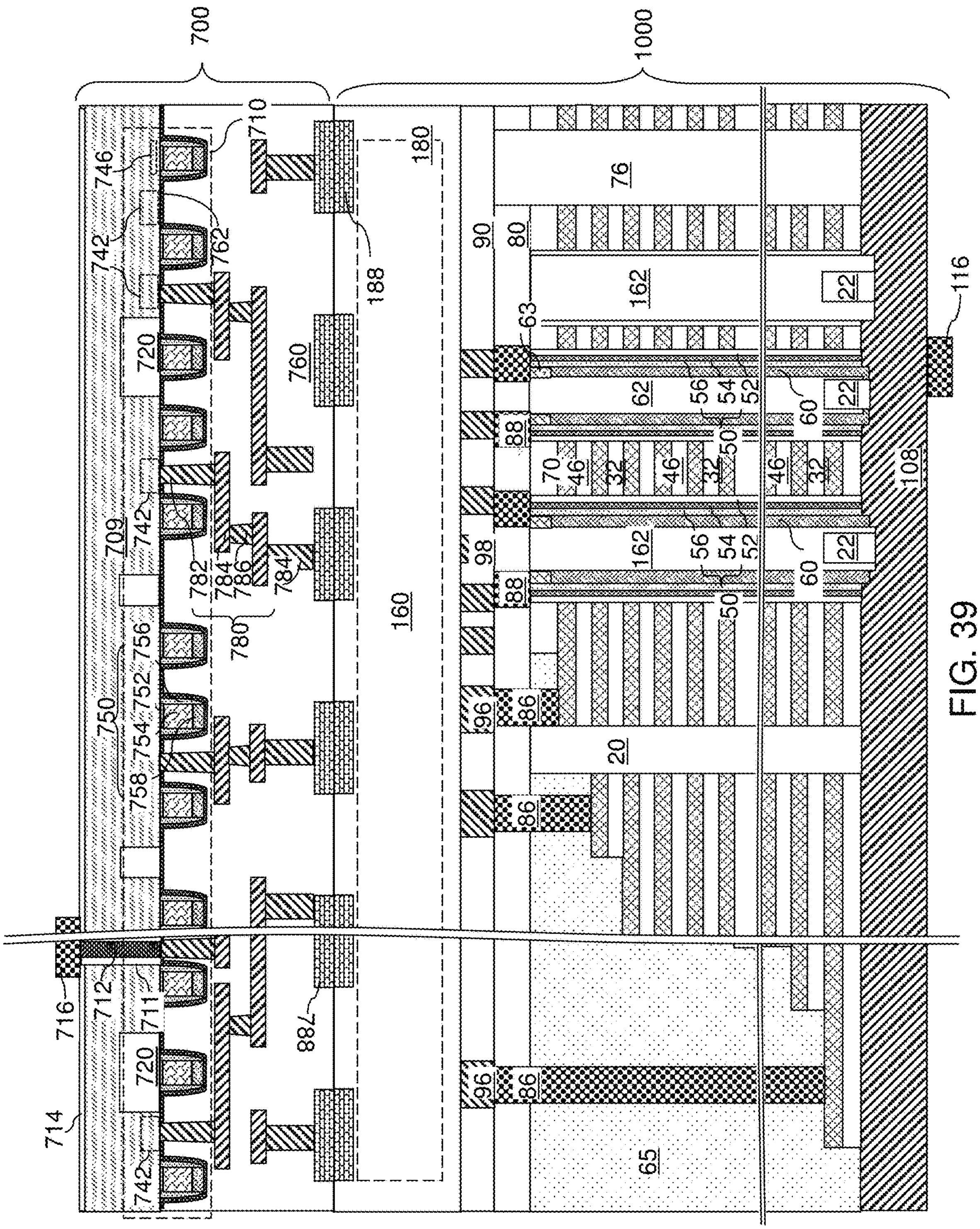
FIG. 39 is a schematic vertical cross-sectional view of the second exemplary structure after formation of a source layer and backside bonding pads according to the second embodiment of the present disclosure.
Figure 40A:
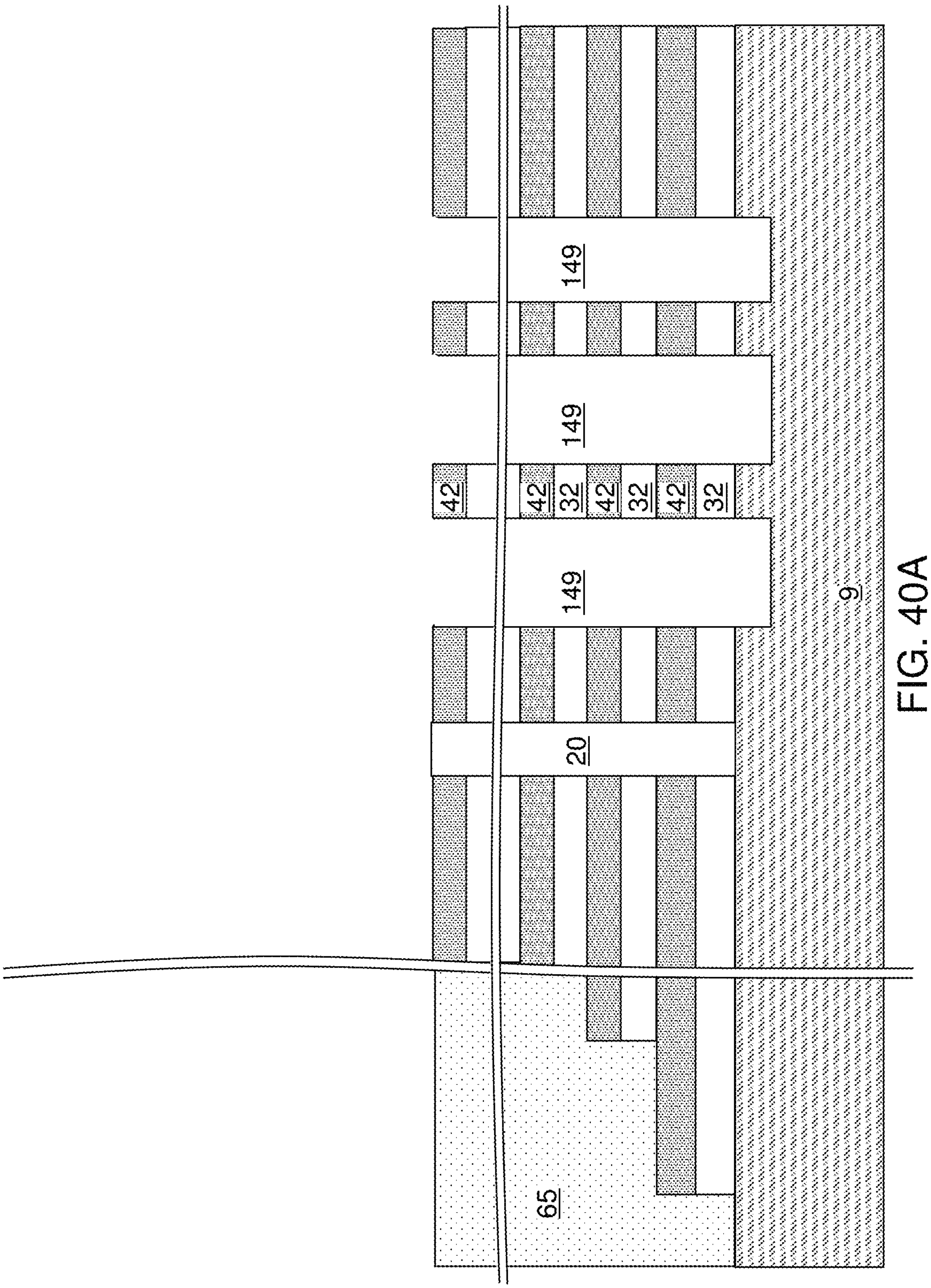
FIG. 40A is a schematic vertical cross-sectional view of a third exemplary structure after formation of a first alternating stack of first insulating layers and first sacrificial material layers, a first retro-stepped dielectric material portion, first support pillar structures, and first-tier trenches according to a third embodiment of the present disclosure.
Figure 40B:
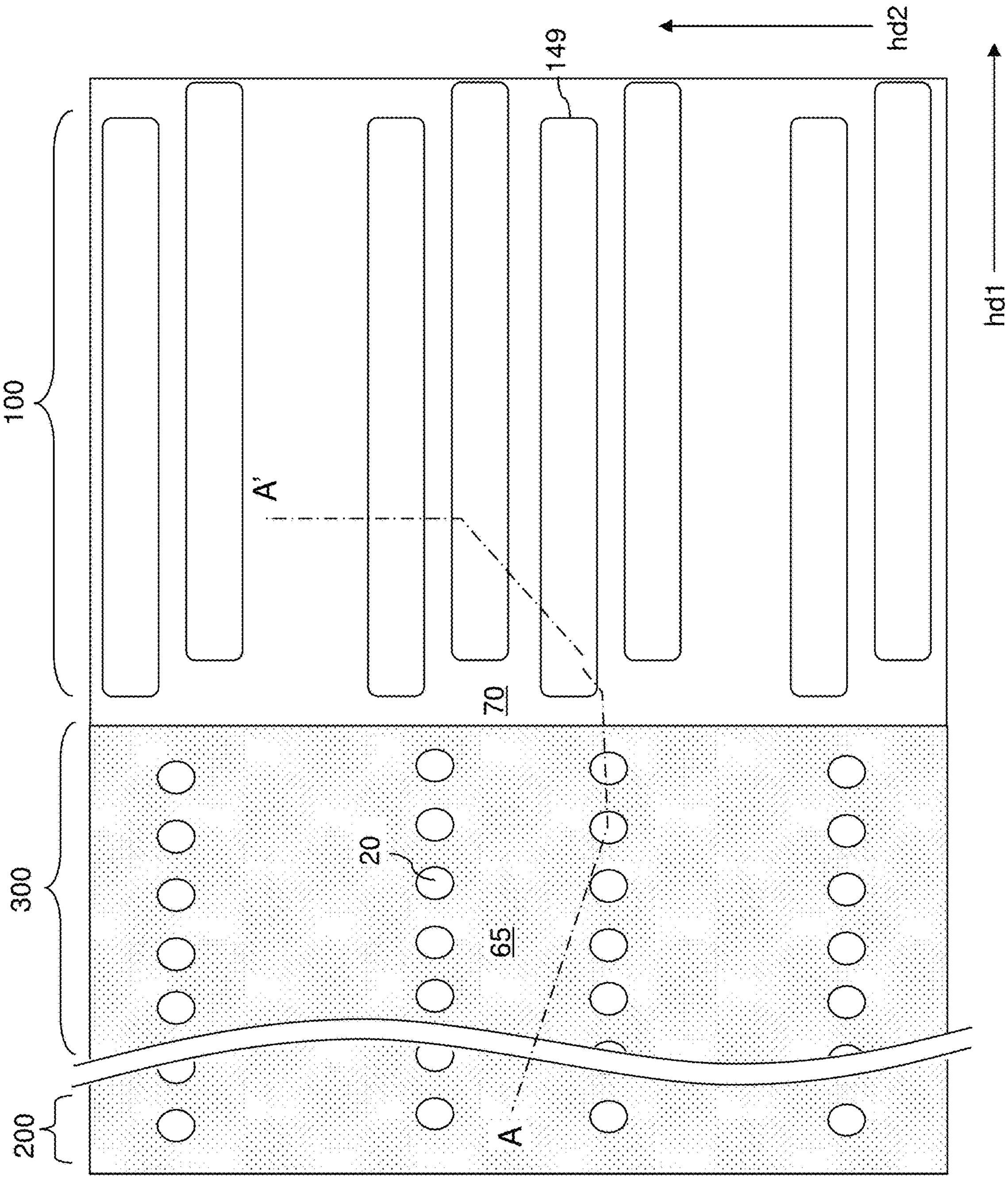
FIG. 40B is top-down view of the third exemplary structure of FIG. 40A.
Figures 41A, 41B, 41C:
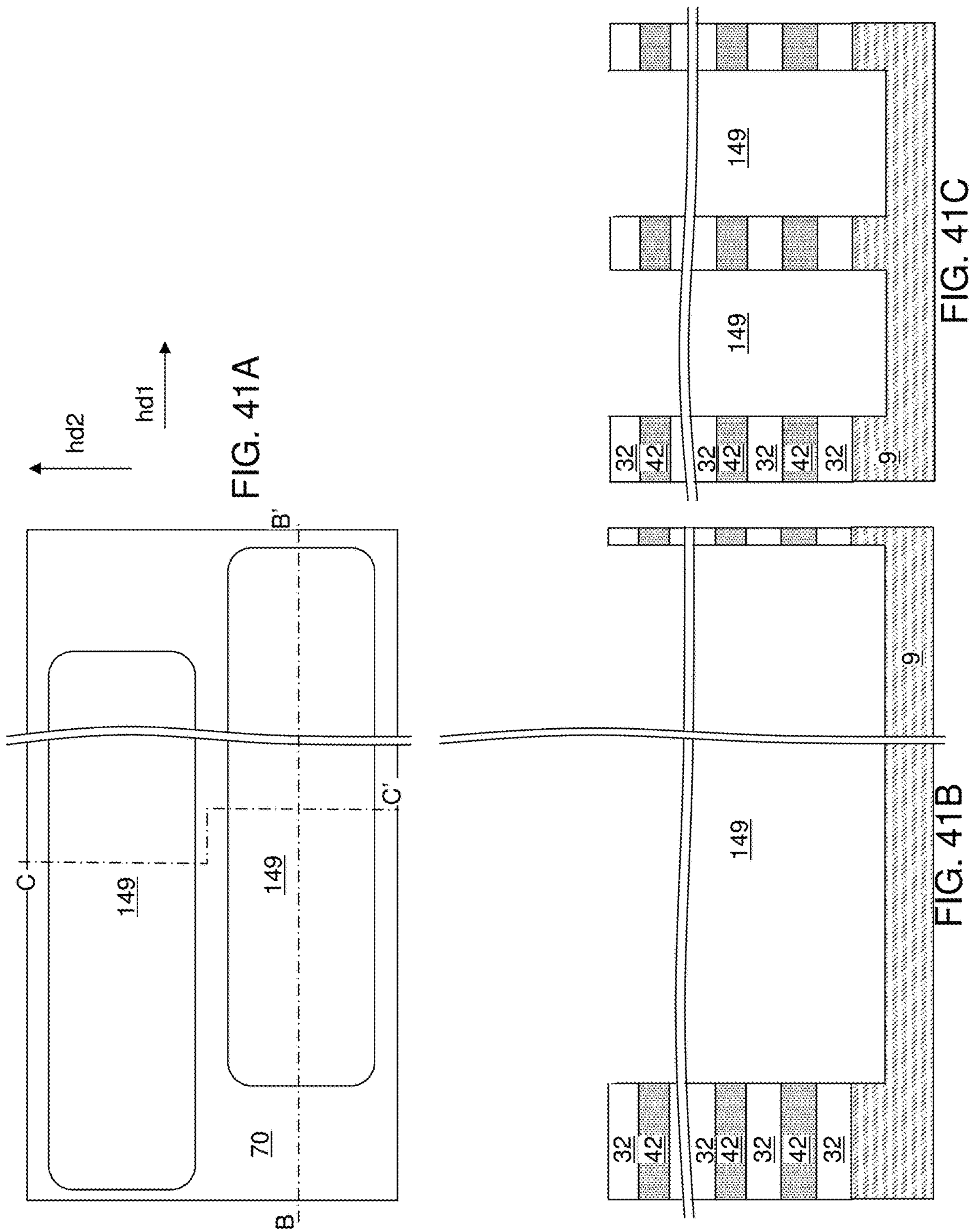
FIG. 41A is a top-down view of a region of the third exemplary structure of FIGS. 40A and 40B.
FIG. 41B is a vertical cross-sectional view along the vertical plane B-B' of the region of the second exemplary structure of FIG. 41A.
FIG. 41C is a vertical cross-sectional view along the vertical plane C-C' of the region of the second exemplary structure of FIG. 41A.

Referring to FIG. 39, at least one conductive material can be deposited on the physically exposed surfaces of the vertical semiconductor channels 60 to form a source layer 108. The at least one conductive material of the source layer 108 may include a heavily doped semiconductor material (e.g., polysilicon) having a doping of the second conductivity type and/or at least one metallic material (such as a conductive metallic nitride material, such as TaN, TiN, and/or WN, and a metallic fill layer including at least one metal such as W, Co, Ru, Mo, and/or Cu). Optionally, backside bonding pads 116 can be formed on the backside of the source layer 108.

Referring to FIGS. 40A, 40B, and 41A-41C, a third exemplary structure according to a third embodiment of the present disclosure can be derived from the second exemplary structure of FIGS. 21A, 21B, and 22A-22C by omitting formation of the insulating cap layer 70. Additional insulating layers 32 and additional sacrificial material layers 42 are formed in subsequent processing steps. For this reason, the insulating layers 32 and the sacrificial material layers 42 provided within the third exemplary structure of FIGS. 40A, 40B, and 41A-41C are herein referred to as first insulating layers 32 and first sacrificial material layers 42. The elongated trenches 149 are hereafter referred to as first elongated trenches 149.

Figure 42A:
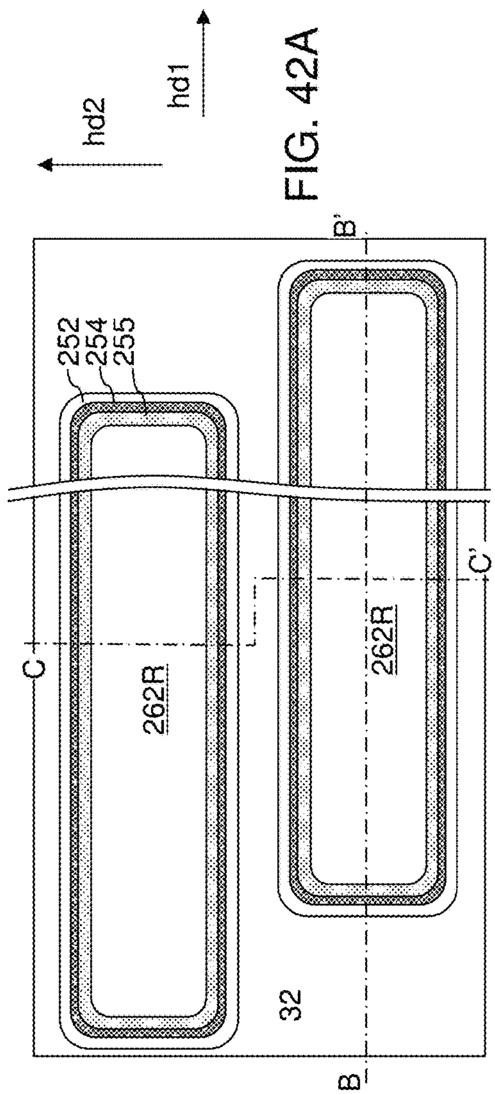
FIG. 42A is a top-down view of a region of the third exemplary structure after formation of a first-tier memory film and a first-tier dielectric core rail within each first-tier trench according to the third embodiment of the present disclosure.
Figure 42B:
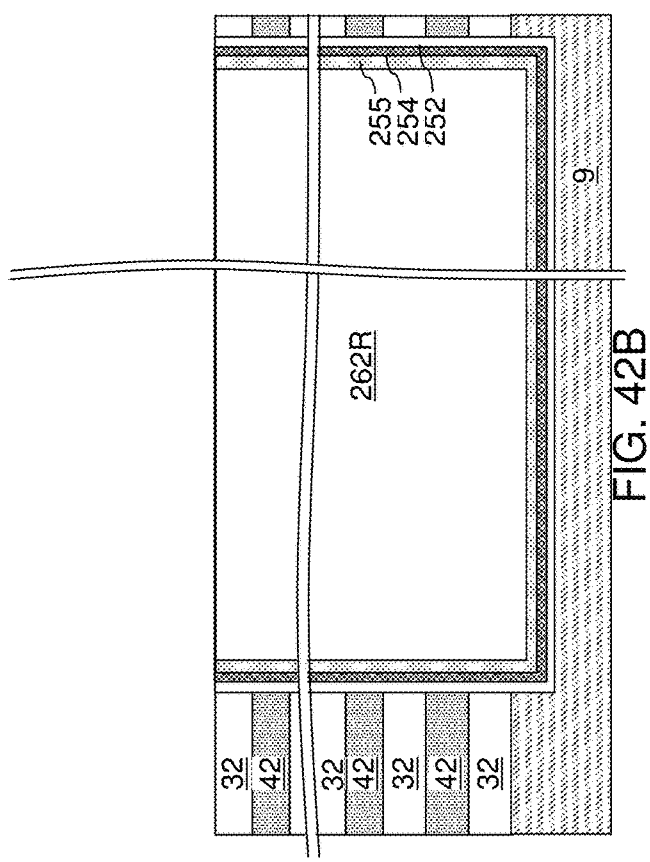
FIG. 42B is a vertical cross-sectional view along the vertical plane B-B' of the region of the third exemplary structure of FIG. 42A.
Figure 42C:
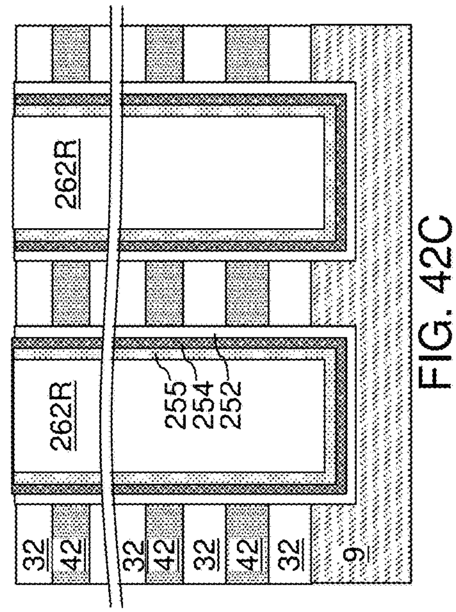
FIG. 42C is a vertical cross-sectional view along the vertical plane C-C' of the region of the third exemplary structure of FIG. 42A.

Referring to FIGS. 42A-42C, a first layer stack (252, 254, 255) including a first blocking dielectric layer 252, a first charge storage layer 254, and an optional first dielectric liner 255 can be sequentially formed. The first blocking dielectric layer 252 can have the same material composition and the same thickness range as the blocking dielectric layer 52 described above. The first charge storage layer 254 can have the same material composition and the same thickness range as the charge storage layer 54 described above. The optional first dielectric liner 255 includes a dielectric material that is different from the material of the first charge storage layer 254. For example, if the first charge storage layer 254 includes silicon nitride, the optional first dielectric liner 255 can include silicon oxide.

A dielectric fill material such as silicon oxide can be deposited in remaining volumes of the first elongated trenches 149, for example, by a conformal deposition process. Excess portions of the dielectric fill material can be removed from above the topmost surface of the first layer stack (252, 254, 255) by a planarization process such as a recess etch process and/or a chemical mechanical planarization process. Each remaining portion of the dielectric fill material in the first elongated trenches 149 comprises a first dielectric core rail 262R.

Figure 43A:
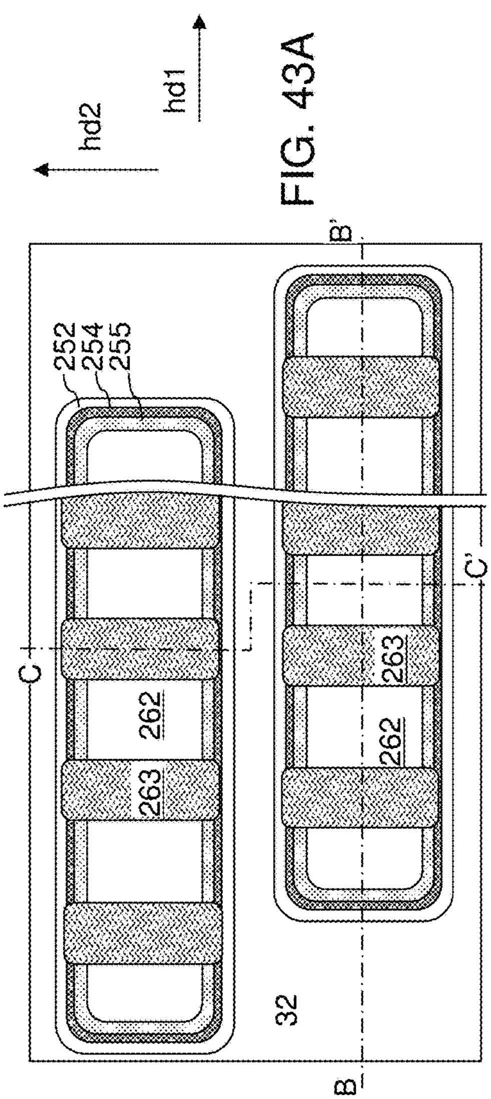
FIG. 43A is a top-down view of a region of the third exemplary structure after formation of first-tier sacrificial pillar structures according to the third embodiment of the present disclosure.
Figure 43B:
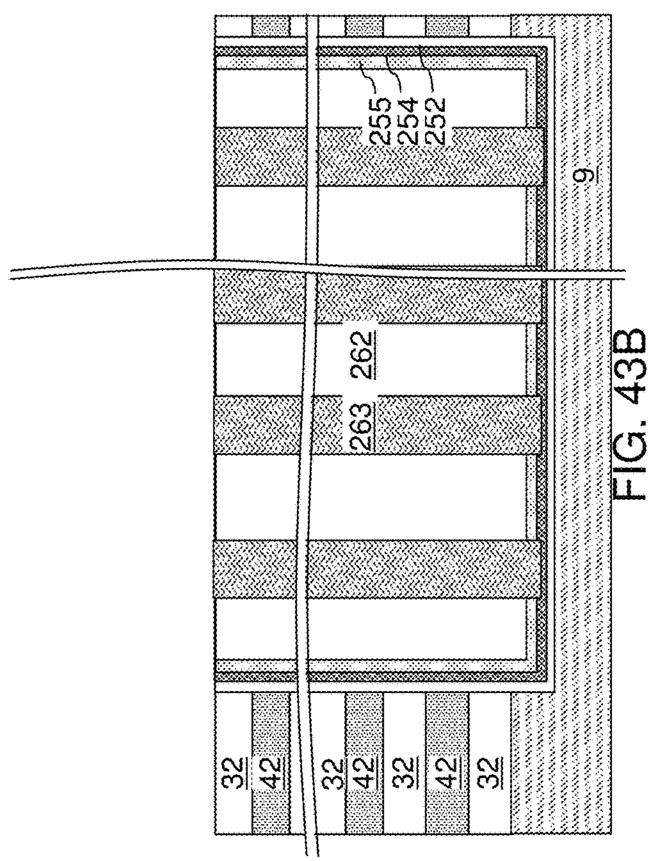
FIG. 43B is a vertical cross-sectional view along the vertical plane B-B' of the region of the third exemplary structure of FIG. 43A.
Figure 43C:
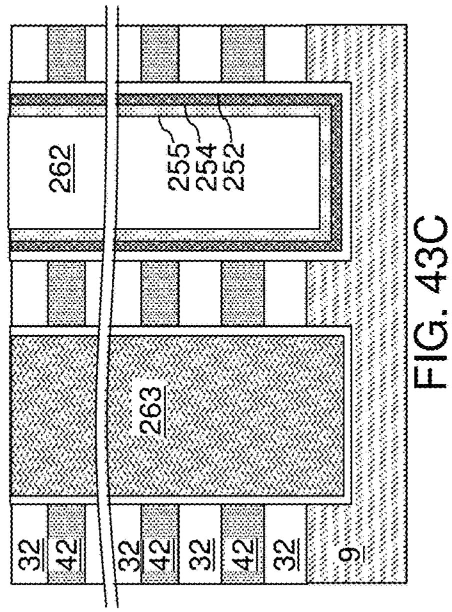
FIG. 43C is a vertical cross-sectional view along the vertical plane C-C' of the region of the third exemplary structure of FIG. 43A.

Referring to FIGS. 43A-43C, a photoresist layer (not shown) can be formed over the third exemplary structure, and can be lithographically patterned to form discrete openings over areas of the first dielectric core rails 262R. Specifically, a row of discrete openings can be formed over each first dielectric core rail 262R. An anisotropic etch process can be performed to transfer the pattern of openings in the photoresist layer through the first dielectric core rails 262R. First pillar cavities are formed in volumes from which the materials of the first dielectric core rails 262R are removed. A row of first pillar cavities can be formed through each first dielectric core rail 262R. Remaining portions of each first dielectric core rail 262R constitute a row of first dielectric cores 262 that are arranged along the first horizontal direction hd1 within a respective first elongated trench 149. Remaining portions of the first dielectric core rails 262R comprise first sacrificial dielectric cores 262.

A sacrificial fill material can be deposited in the first pillar cavities to form first sacrificial fill structures 263. The first sacrificial fill structures 263 can include an amorphous semiconductor material (such as amorphous silicon), amorphous carbon, or organosilicate glass.

Figure 44A:
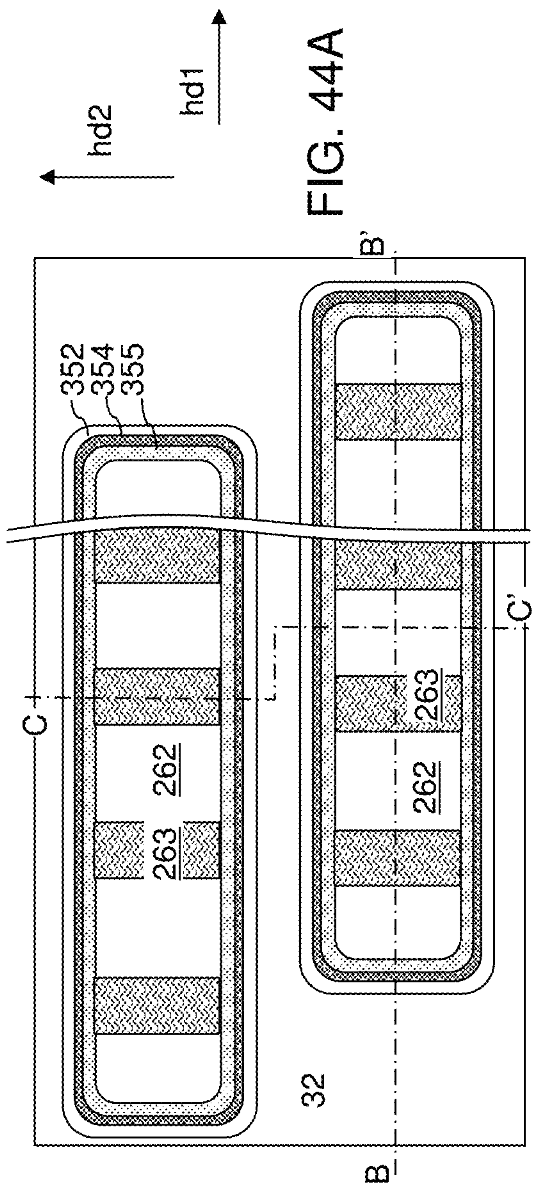
FIG. 44A is a top-down view of a region of the third exemplary structure after formation of second-tier trenches and second-tier memory films according to the third embodiment of the present disclosure.
Figure 44C:
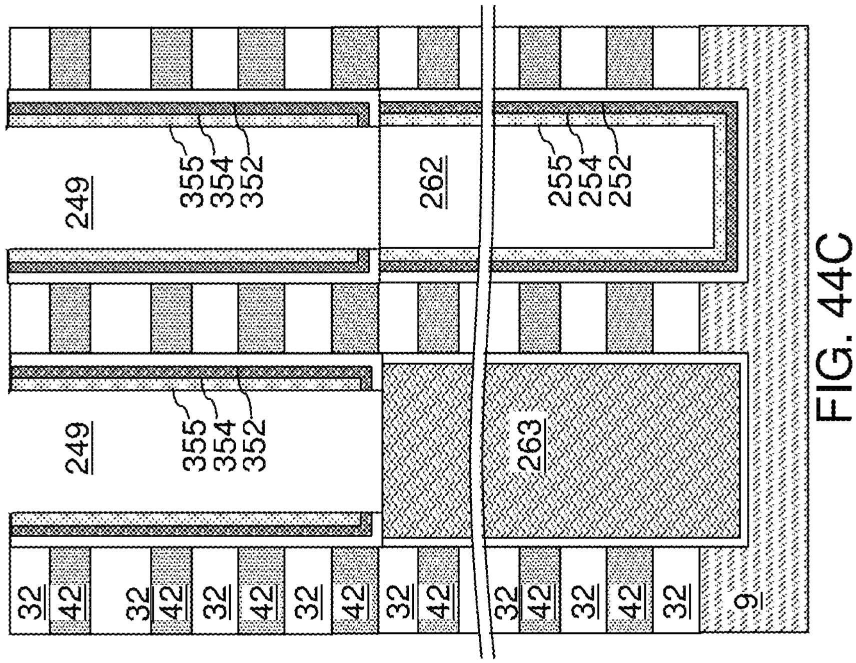
FIG. 44C is a vertical cross-sectional view along the vertical plane C-C' of the region of the third exemplary structure of FIG. 44A.
Figure 44B:
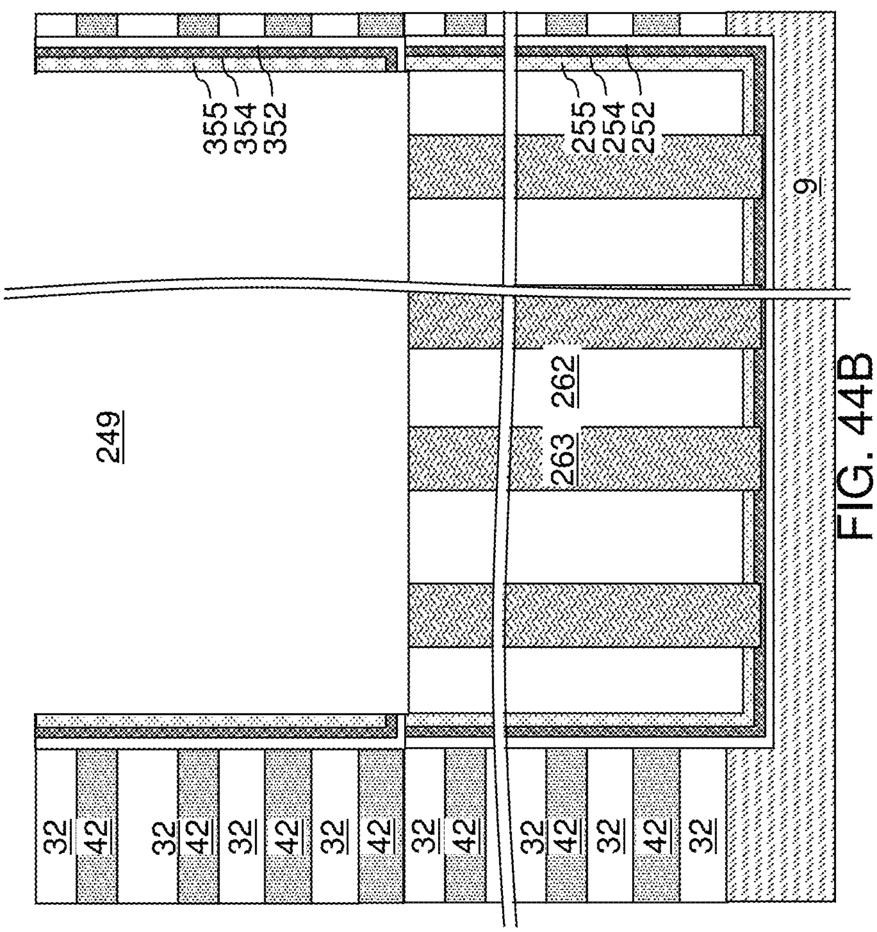
FIG. 44B is a vertical cross-sectional view along the vertical plane B-B' of the region of the third exemplary structure of FIG. 44A.

Referring to FIGS. 44A-44C, additional insulating layers 32 and additional sacrificial material layers 42 can be formed above the horizontal plane including the top surfaces of the first sacrificial dielectric cores 262 and the first sacrificial fill structures 263. The additional insulating layers 32 and the additional sacrificial material layers 42 are herein referred to as second insulating layers 32 and second sacrificial material layers 42. A second retro-stepped dielectric material portion (not shown) can be formed through the alternating stack of the second insulating layers 32 and the second sacrificial material layers 42. Additional elongated trenches, which are herein referred to as second elongated trenches, are formed through the stack of the second insulating layers 32 and the second sacrificial material layers 42. Each of the second elongated trenches can be formed directly above a respective one of the first elongated trenches.

A second layer stack (352, 354, 355) including a second blocking dielectric layer 352, a second charge storage layer 354, and an optional second dielectric liner 355 can be sequentially formed. The second blocking dielectric layer 352 can have the same material composition and the same thickness range as the blocking dielectric layer 52 described above. The second charge storage layer 354 can have the same material composition and the same thickness range as the charge storage layer 54 described above. The optional second dielectric liner 355 includes a dielectric material that is different from the material of the second charge storage layer 354. For example, if the second charge storage layer 354 includes silicon nitride, the optional second dielectric liner 355 can include silicon oxide. An anisotropic etch process can be performed to remove horizontal portions of the second layer stack (352, 354, 355).

Figure 45A:
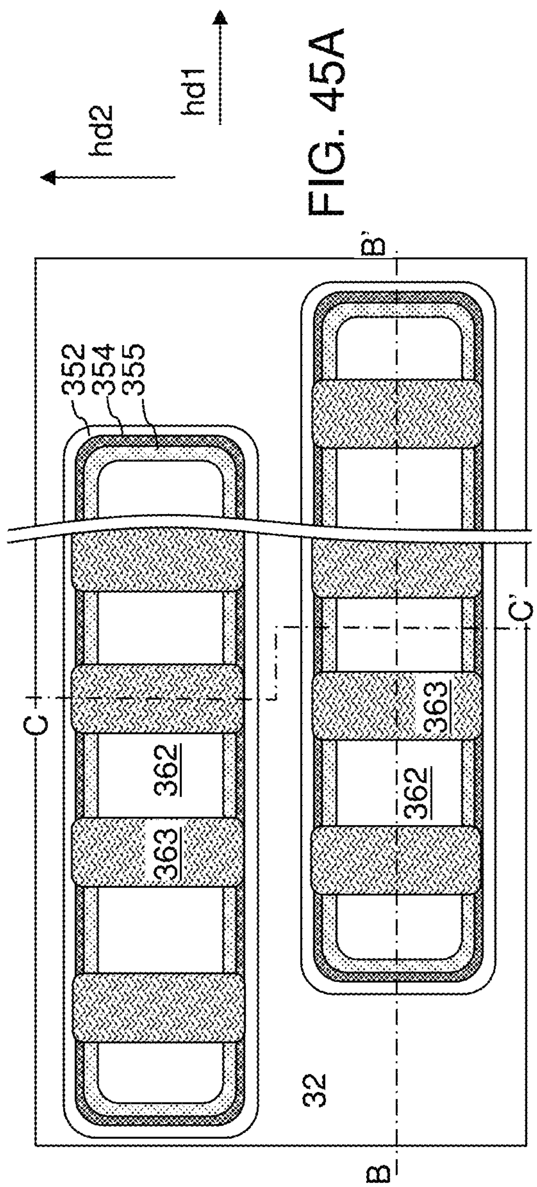
FIG. 45A is a top-down view of a region of the third exemplary structure after formation of second-tier sacrificial pillar structures according to the third embodiment of the present disclosure.
Figure 45C:
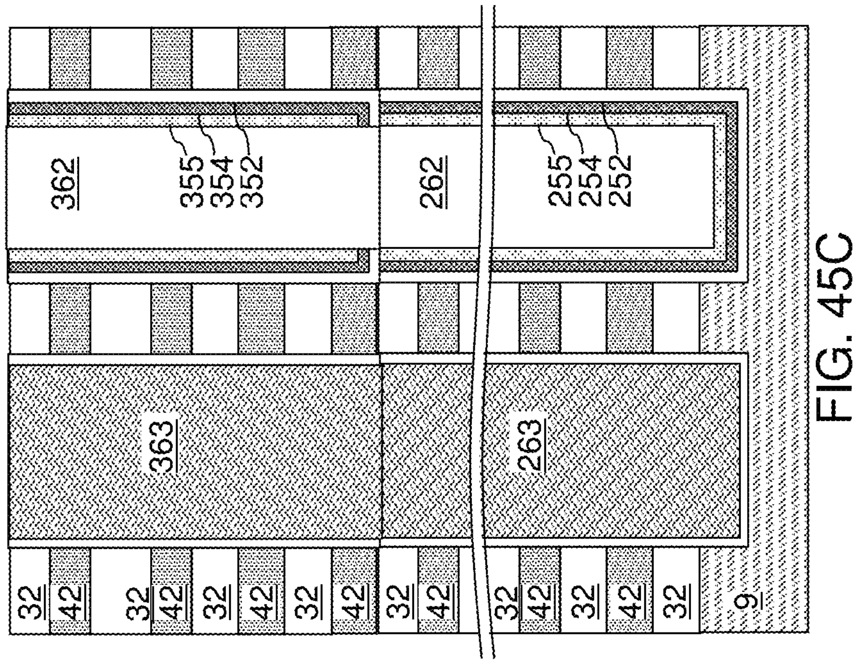
FIG. 45C is a vertical cross-sectional view along the vertical plane C-C' of the region of the third exemplary structure of FIG. 45A.
Figure 45B:
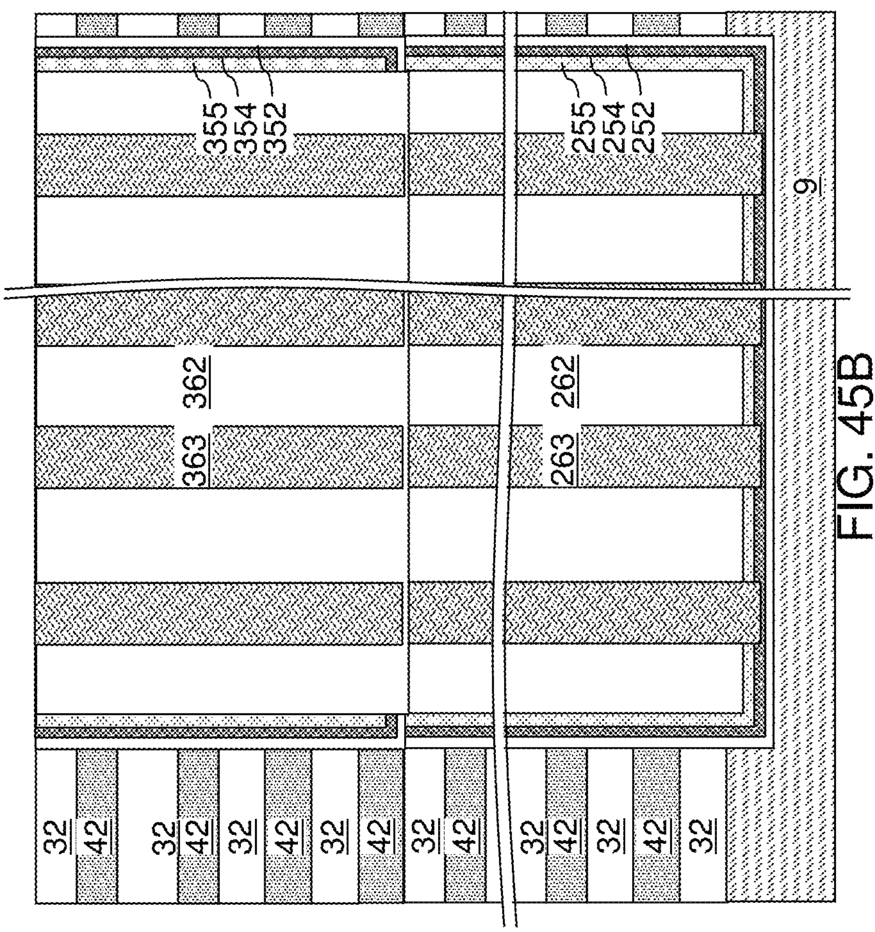
FIG. 45B is a vertical cross-sectional view along the vertical plane B-B' of the region of the third exemplary structure of FIG. 45A.

Referring to FIGS. 45A-45C, a dielectric fill material, such as silicon oxide, can be deposited in remaining volumes of the second elongated trenches, for example, by a conformal deposition process. Excess portions of the dielectric fill material can be removed from above the second alternating stack of the second insulating layers 32 and the second sacrificial material layers 42 by a planarization process, such as a recess etch process and/or a chemical mechanical planarization process. Each remaining portion of the dielectric fill material in the second elongated trenches comprises a second dielectric core rail.

A photoresist layer (not shown) can be formed over the third exemplary structure, and can be lithographically patterned to form discrete openings over areas of the second dielectric core rails. Specifically, a row of discrete openings can be formed over each second dielectric core rail. An anisotropic etch process can be performed to transfer the pattern of openings in the photoresist layer through the second dielectric core rails. Second pillar cavities are formed in volumes from which the materials of the second dielectric core rails are removed. A row of second pillar cavities can be formed through each second dielectric core rail. Remaining portions of each second dielectric core rail constitute a row of second sacrificial dielectric cores 362 that are arranged along the first horizontal direction hd1 within a respective second elongated trench.

A sacrificial fill material can be deposited in the second pillar cavities to form second sacrificial fill structures 363. The second sacrificial fill structures 363 can include an amorphous semiconductor material (such as amorphous silicon), amorphous carbon, or organosilicate glass. Each second sacrificial fill structure 363 can be formed directly on a respective one of the first sacrificial fill structures 263. In one embodiment, each second sacrificial fill structure 363 may have about the same area as, and may overlap with, a respective underlying one of the first sacrificial fill structures 263.

Figure 46A:
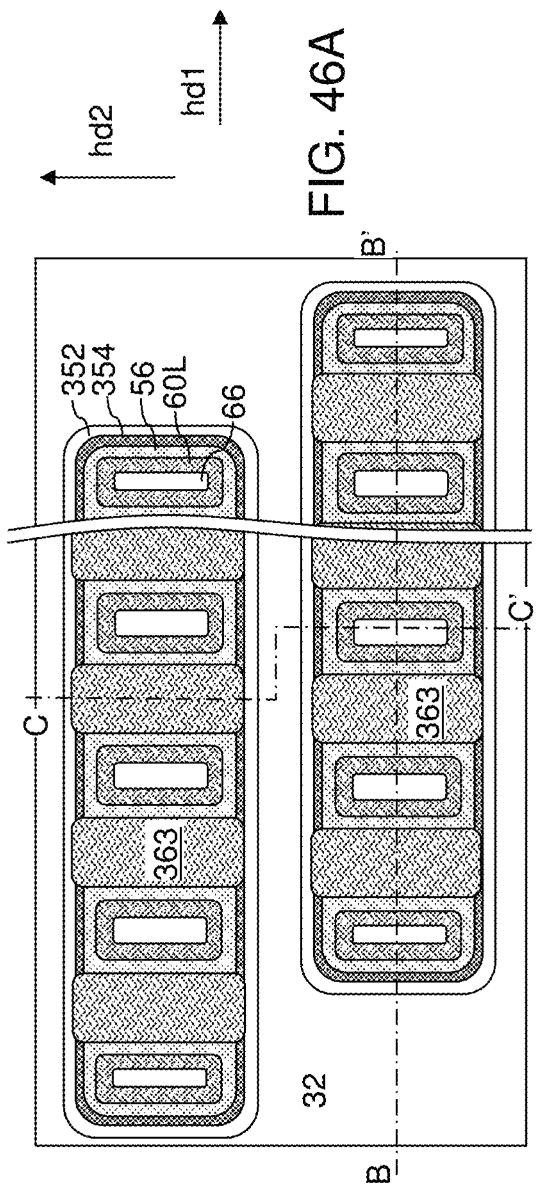
FIG. 46A is a top-down view of a region of the third exemplary structure after formation of tunneling dielectric layers and semiconductor channel layers according to the third embodiment of the present disclosure.
Figure 46C:
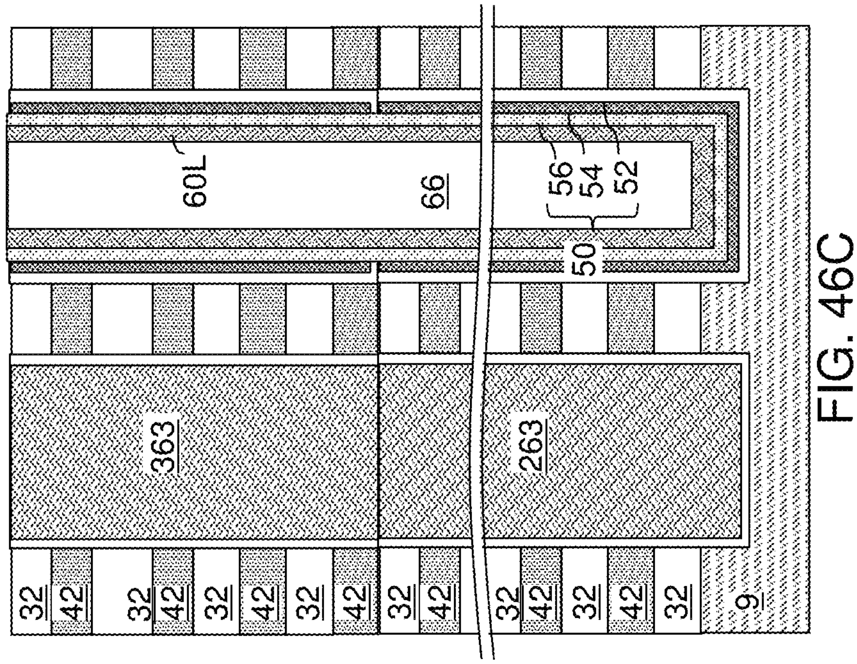
FIG. 46C is a vertical cross-sectional view along the vertical plane C-C' of the region of the third exemplary structure of FIG. 46A.
Figure 46B:
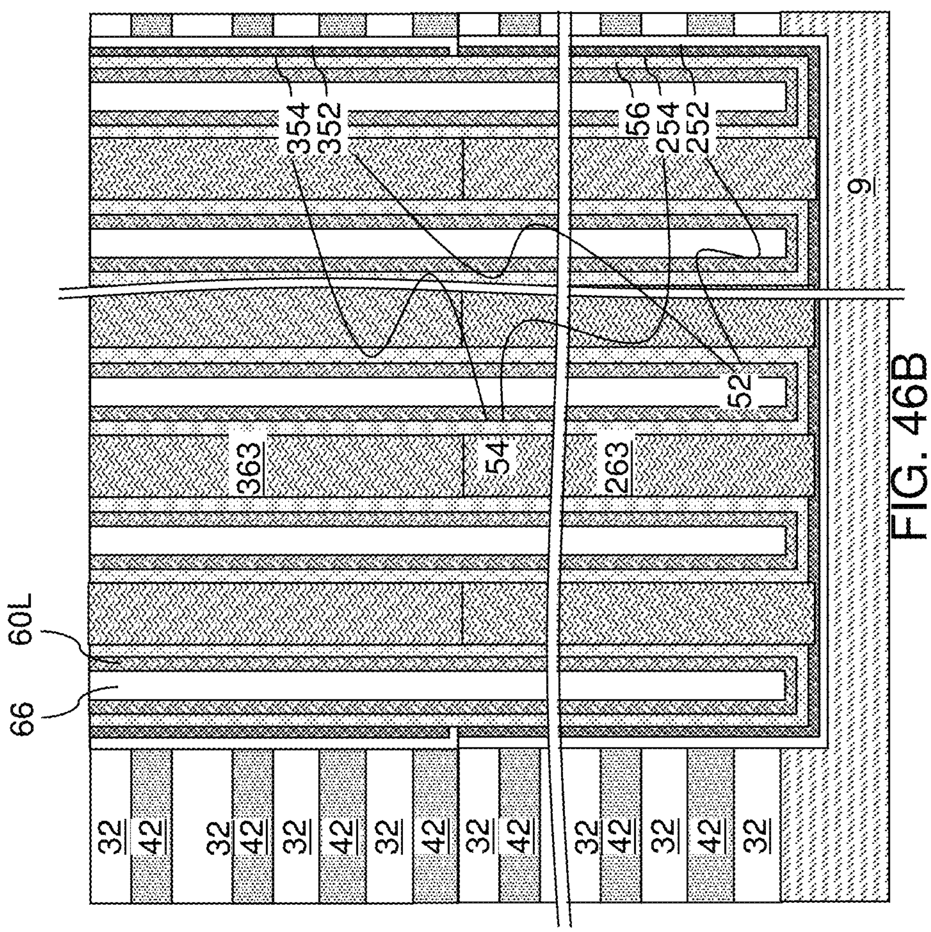
FIG. 46B is a vertical cross-sectional view along the vertical plane B-B' of the region of the third exemplary structure of FIG. 46A.

Referring to FIGS. 46A-46C, the second sacrificial dielectric cores 362 and the first sacrificial dielectric cores 262 can be removed selective to the materials of the second sacrificial fill structures 363 and the first sacrificial fill structures 263 and the layer stacks (252, 254, 255, 352, 354, 355). For example, if the first dielectric cores 262 and the second sacrificial dielectric cores 362 include borosilicate glass or organosilicate glass, a wet etch process employing dilute hydrofluoric acid can be performed to remove the second sacrificial dielectric cores 362 and the first sacrificial dielectric cores 262 selective to the materials of the second sacrificial fill structures 363 and the first sacrificial fill structures 263 and the layer stacks (252, 254, 255, 352, 354, 355). Via cavities are formed in volumes from which the second sacrificial dielectric cores 362 and the first sacrificial dielectric cores 262 are removed.

In case a first dielectric liner 255 and/or a second dielectric liner 355 is employed, the first dielectric liner 255 and/or the second dielectric liner 355 can be removed selective to the first charge storage layer 254 and the second charge storage layer 354 by an isotropic etch process. Generally, a row of via cavities can be formed in each stack of a first elongated trench and a second elongated trench by removing remaining portions of the dielectric core rails selective to the rows of sacrificial fill structures (263, 363).

A tunneling dielectric layers 56 and a semiconductor channel layer 60L can be sequentially deposited in the via cavities. The tunneling dielectric layer 56 can have the same material composition and the same thickness range as in the first exemplary structure and the second exemplary structure. The semiconductor channel layer 60L can have the same material composition and the same thickness range as in the first exemplary structure and the second exemplary structure. A dielectric core material such as silicon oxide can be deposited in remaining volumes of the via cavities.

Portions of the dielectric core material, the semiconductor channel layer 60L and the tunneling dielectric layer 56 overlying the topmost surface of the second alternating stack (32, 42) of the second insulating layers 32 and the second sacrificial material layers 42 can be removed by a planarization process such as a chemical mechanical planarization process. Each remaining portion of the dielectric core material constitutes a dielectric core 66.

Each vertical stack of a first blocking dielectric layer 252 and a second blocking dielectric layer 352 constitutes a blocking dielectric layer 52. Each vertical stack of a first charge storage layer 254 and a second charge storage layer 354 constitutes a charge storage layer 54. A contiguous combination of a charge storage layer 54, a blocking dielectric layer 52, and a tunneling dielectric layer 56 constitutes a memory film 50.

Figure 47A:
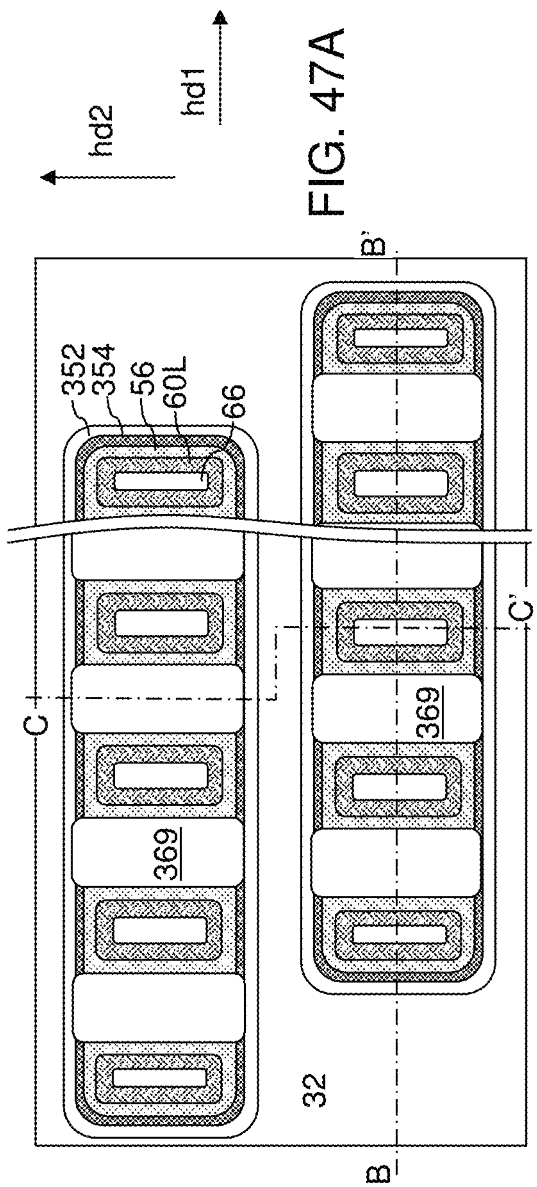
FIG. 47A is a top-down view of a region of the third exemplary structure after formation of pillar cavities according to the third embodiment of the present disclosure.
Figure 47C:
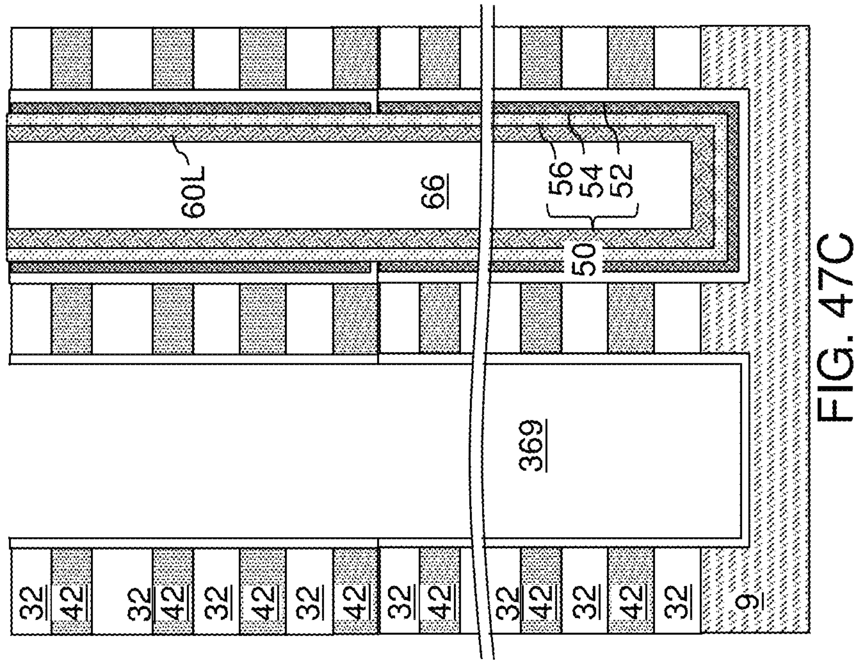
FIG. 47C is a vertical cross-sectional view along the vertical plane C-C' of the region of the third exemplary structure of FIG. 47A.
Figure 47B:
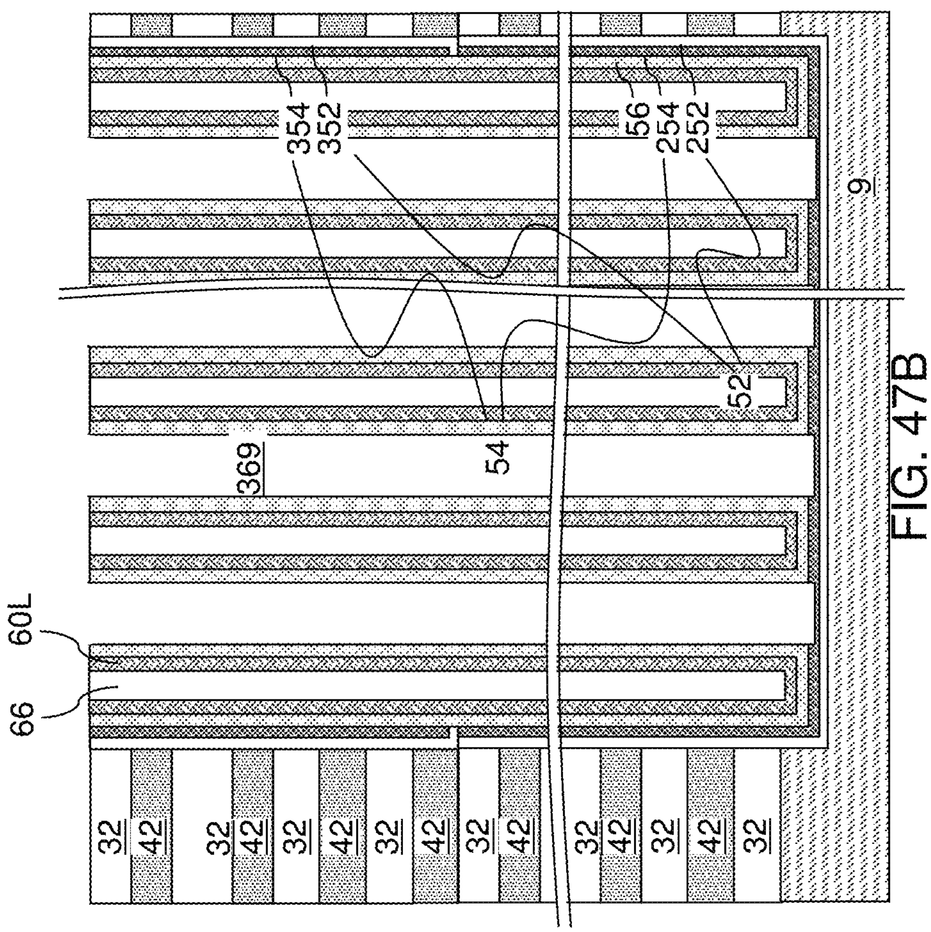
FIG. 47B is a vertical cross-sectional view along the vertical plane B-B' of the region of the third exemplary structure of FIG. 47A.

Referring to FIGS. 47A-47C, the rows of sacrificial fill structures (263, 363) can be removed selective to the material of the tunneling dielectric layer 56. For example, an optional photoresist layer (not shown) can be applied over the third exemplary structure, and can be lithographically patterned to form openings in areas that overlie the rows of sacrificial fill structures (263, 363). An isotropic etchant that etches the materials of the rows of sacrificial fill structures (263, 363) selective to the material of the tunneling dielectric layer 56 can be employed in an isotropic etch process to remove the rows of sacrificial fill structures (263, 363). Pillar cavities 369 are formed in volumes form which the rows of sacrificial fill structures (263, 363) are removed.

Figure 48A:
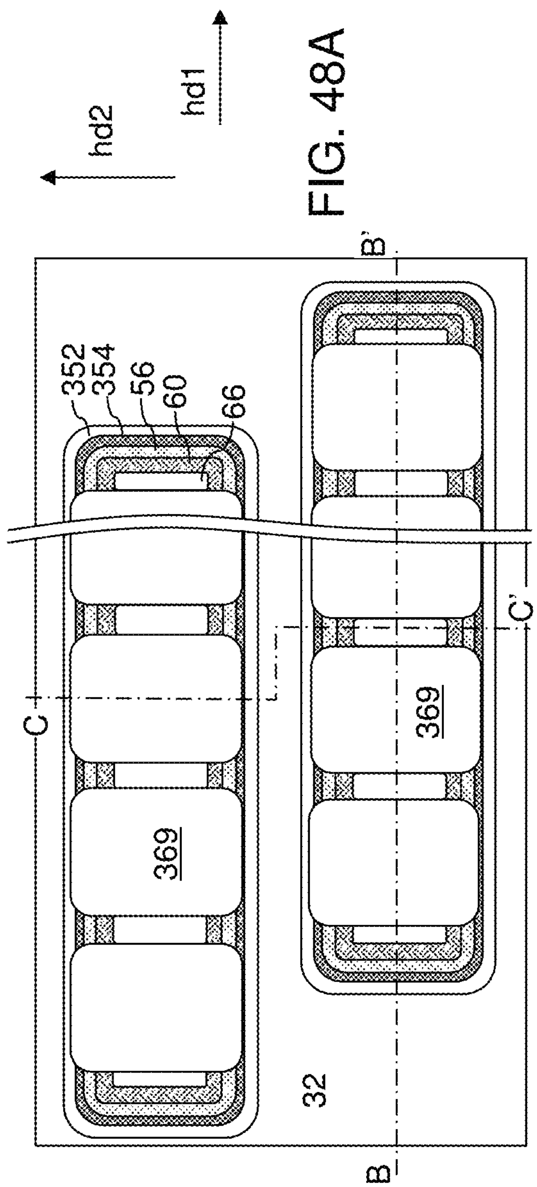
FIG. 48A is a top-down view of a region of the third exemplary structure after expansion of the pillar cavities according to the third embodiment of the present disclosure.
Figure 48B:
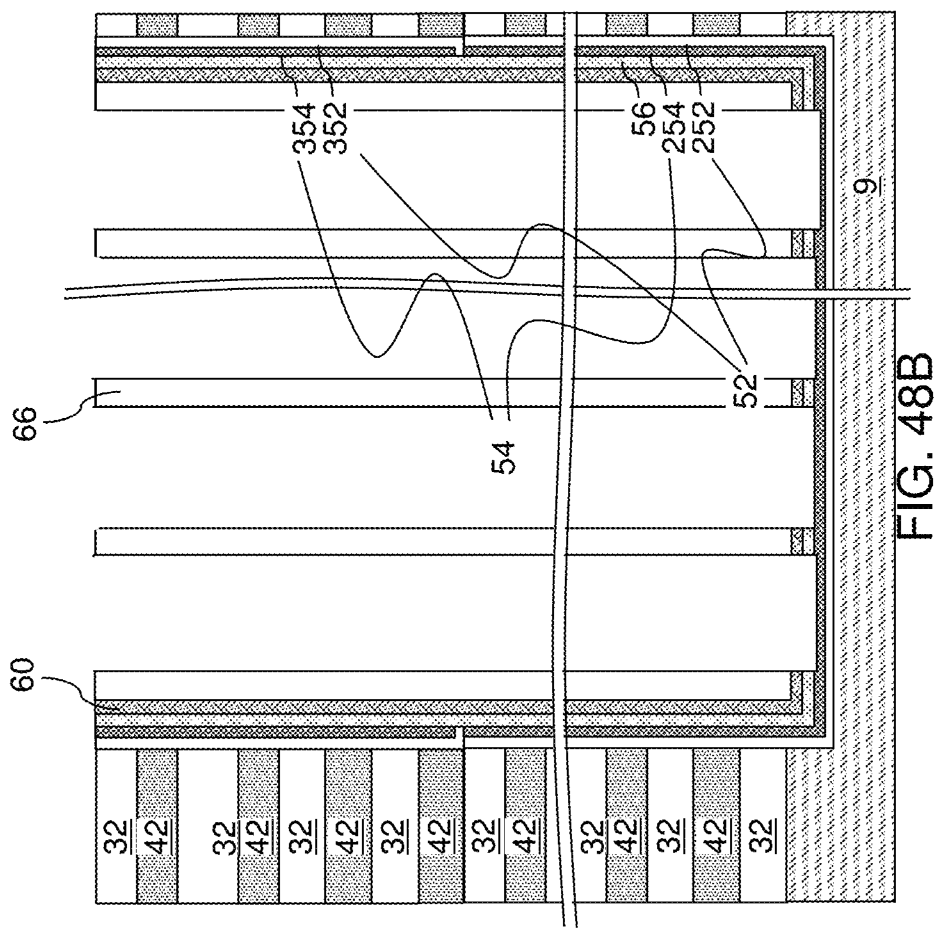
FIG. 48B is a vertical cross-sectional view along the vertical plane B-B' of the region of the third exemplary structure of FIG. 48A.
Figure 48C:
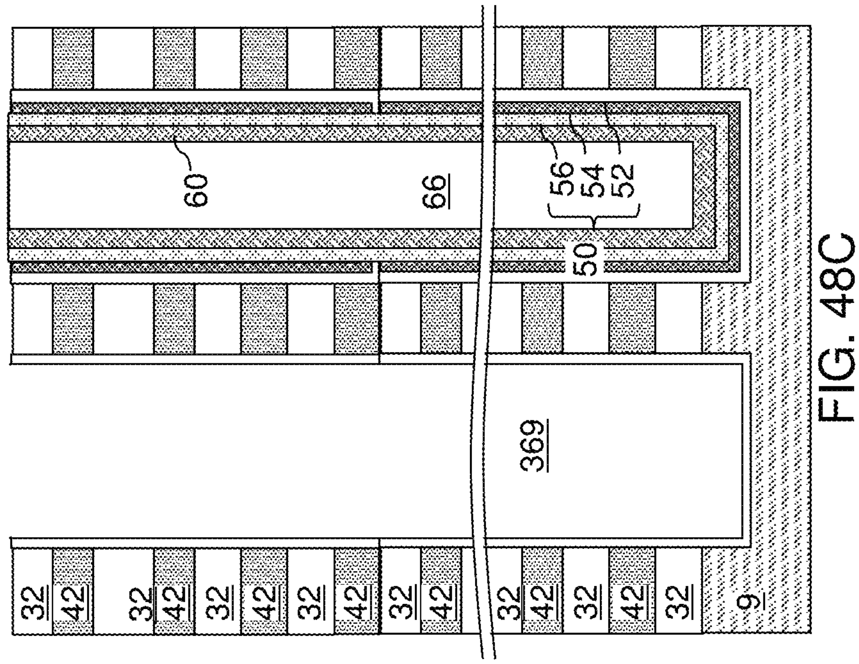
FIG. 48C is a vertical cross-sectional view along the vertical plane C-C' of the region of the third exemplary structure of FIG. 48A.

Referring to FIGS. 48A-48C, an isotropic etch process can be performed to sequentially etch the material of the tunneling dielectric layer 56 and the material of the semiconductor channels 60. Portions of the tunneling dielectric layers 56 and the vertical semiconductor channels 60 that are proximal to the pillar cavities 369 can be removed by the isotropic etch process. The semiconductor channel layer 60L is divided into multiple semiconductor channels 60. The tunneling dielectric layer 56 is divided into multiple tunneling dielectric layers 56.

Figure 49A:
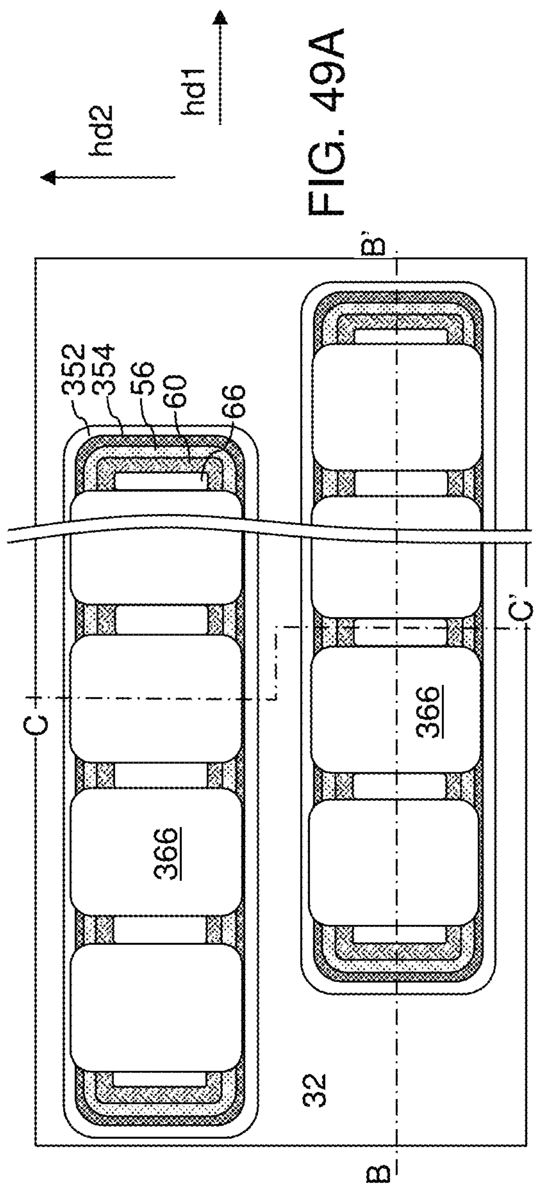
FIG. 49A is a top-down view of a region of the third exemplary structure after formation of dielectric pillar structures according to the third embodiment of the present disclosure.
Figure 49C:
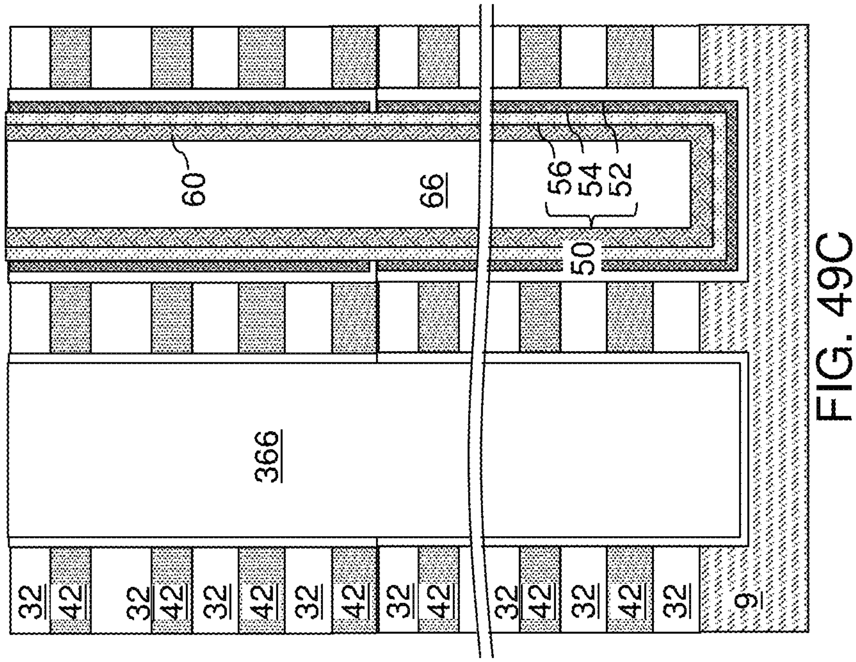
FIG. 49C is a vertical cross-sectional view along the vertical plane C-C' of the region of the third exemplary structure of FIG. 49A.
Figure 49B:
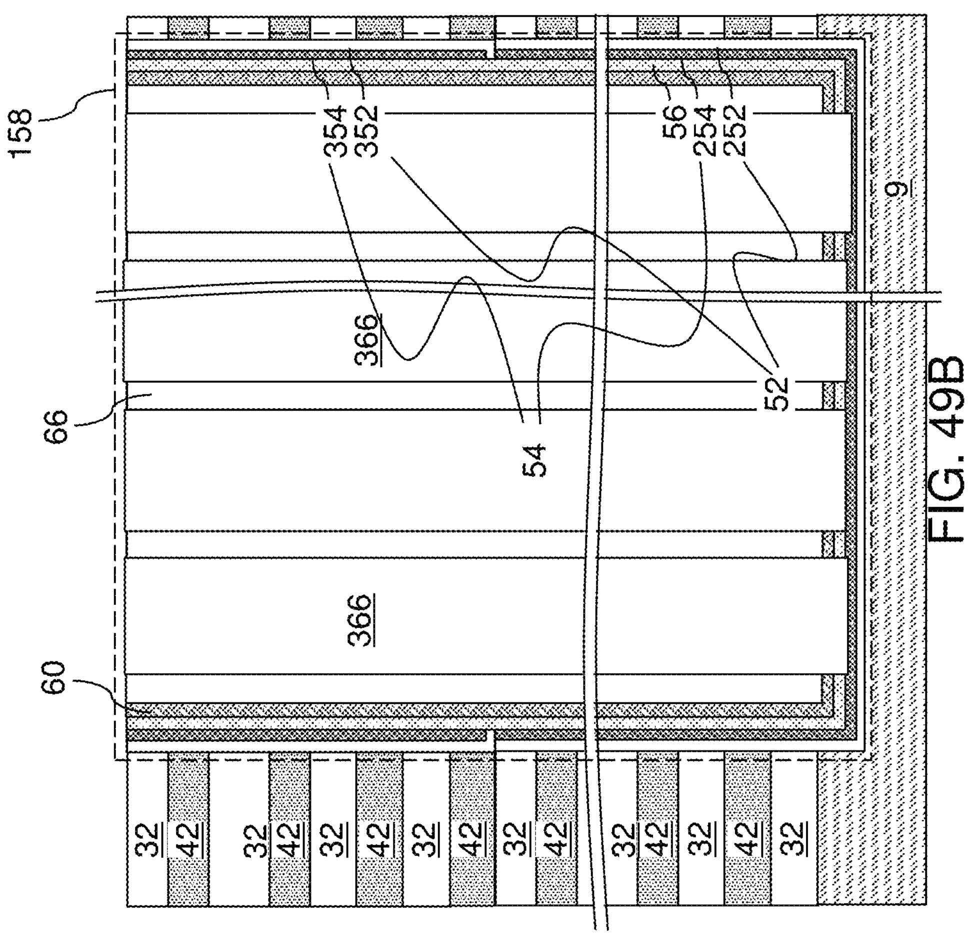
FIG. 49B is a vertical cross-sectional view along the vertical plane B-B' of the region of the third exemplary structure of FIG. 49A.

Referring to FIGS. 49A-49C, a dielectric fill material such as silicon oxide can be deposited in the pillar cavities 369. Excess portions of the dielectric fill material can be removed from above the second alternating stack (32, 42) by a planarization process such as a chemical mechanical planarization process. Remaining portions of the dielectric fill material comprise dielectric pillar structures 366.

Each contiguous set of a memory film 50 and a vertical semiconductor channel 60 constitutes a memory stack structure (50, 60). Generally, two rows of memory stack structures (50, 60) may vertically extend through each of the elongated trenches. The two rows of memory stack structures (50, 60) can be arranged along the first horizontal direction hd1, and can be laterally spaced apart from each other along the second horizontal direction hd2. Each of the memory stack structures (50, 60) comprises a vertical semiconductor channel 60 that is a patterned portion of the semiconductor channel layer 60L and a memory film 50. A trench fill structure 158 can be formed within each stack of elongated trenches.

Figure 50B:
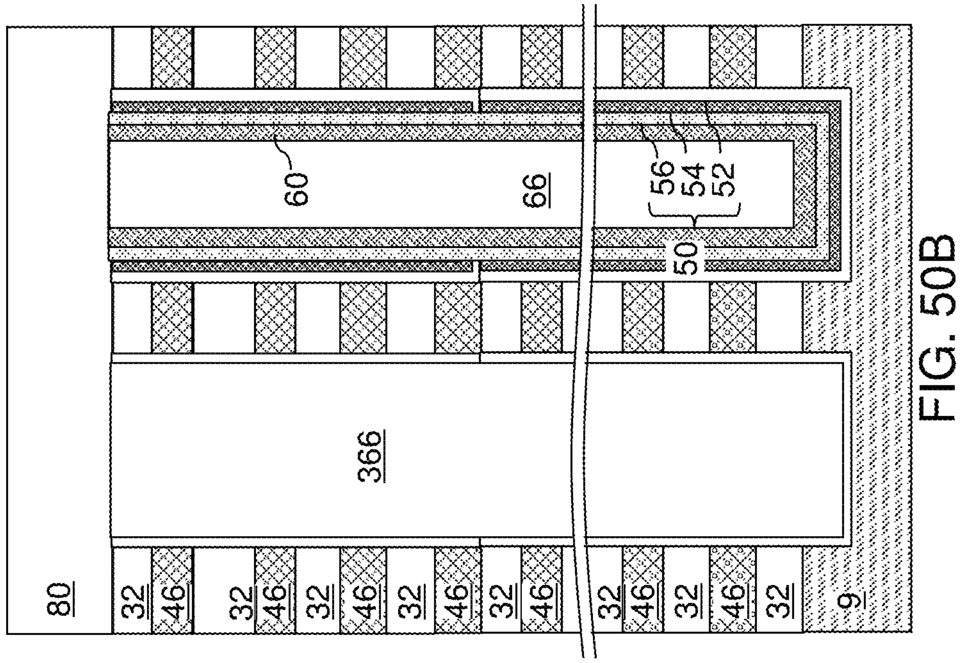
FIG. 50B is a second vertical cross-sectional view of the region of the third exemplary structure of FIG. 50A.
Figure 50A:
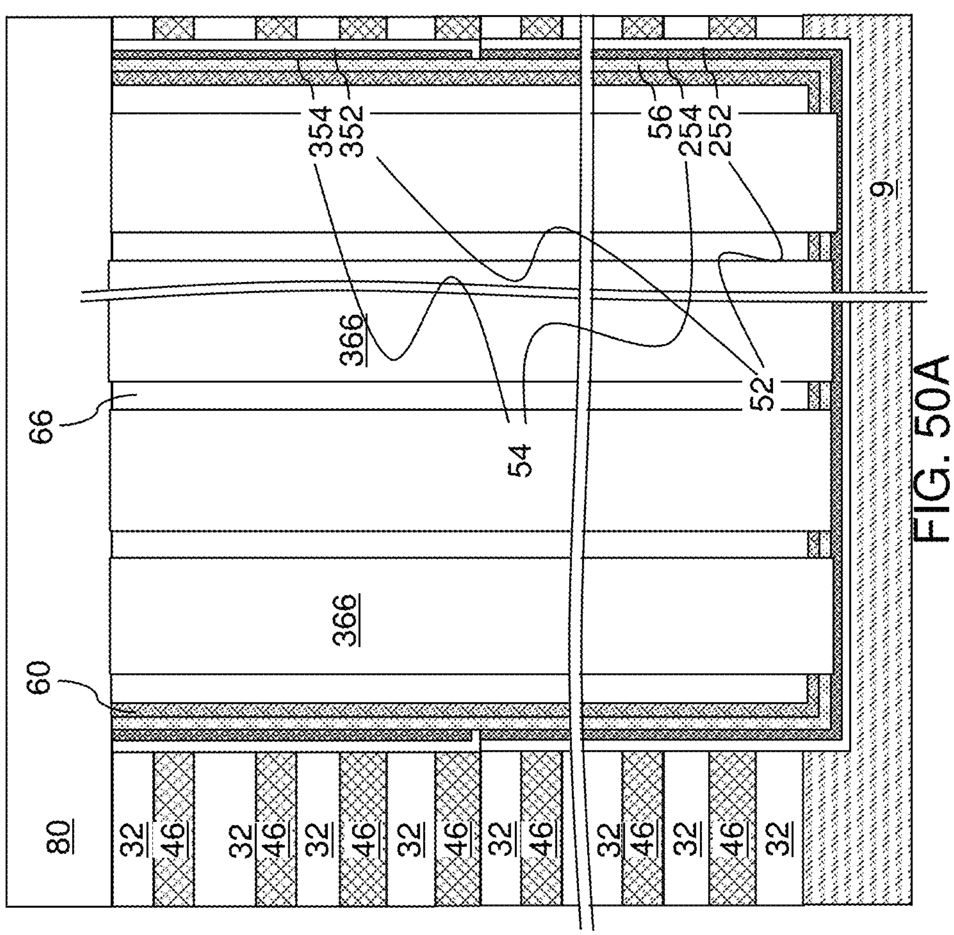
FIG. 50A is a first vertical cross-sectional view of a region of the third exemplary structure after replacement of the sacrificial material layers with electrically conductive layers according to the third embodiment of the present disclosure.

Referring to FIGS. 50A and 50B, the processing steps of FIGS. 30A, 30B, and 31 can be performed to form a contact-level dielectric layer 80, to replace the sacrificial material layers 42 with electrically conductive layers 46, and to form backside trench fill structures 76.

Figure 51:
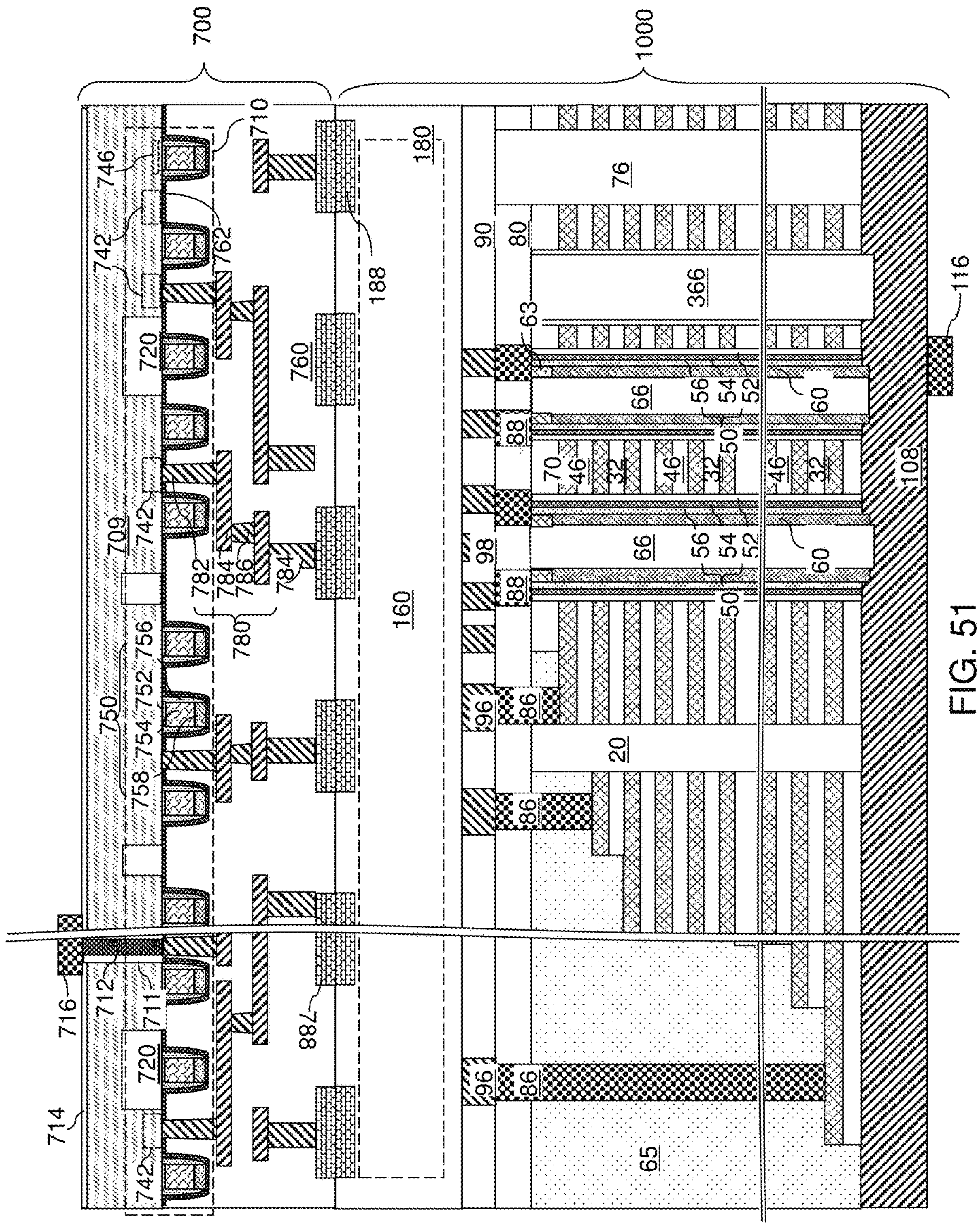
FIG. 51 is a vertical cross-sectional view of the third exemplary structure after attaching a logic die and replacing the substrate with a source layer according to the third embodiment of the present disclosure.

Referring to FIG. 51, the processing steps of FIG. 33 can be performed to form metal interconnect structures 180 embedded in dielectric material layers 160, and to form memory-side bonding pads 188, thereby providing a memory die 1000. A logic die 700 can be attached to the logic die 700. The processing steps of FIGS. 24-39 can be performed to form source-select-level dielectric isolation structures 22, a source layer 108, and backside bonding pads 116.

Referring collectively to FIGS. 21A-51 and according to various embodiments of the present disclosure, a three-dimensional memory device comprising a memory die 1000 is provided. The memory die 1000 comprises: an alternating stack of insulating layers 32 and electrically conductive layers 46; elongated trenches 149 that vertically extend through the alternating stack (32, 46), laterally bounded by sidewalls of the alternating stack (32, 46), laterally extending along a first horizontal direction hd1, and laterally spaced apart from each other along a second horizontal direction hd2; and trench fill structures 158 located in the elongated trenches 149, wherein each of the trench fill structures 158 comprises two rows of memory stack structures (50, 60) that are arranged along the first horizontal direction hd1 and laterally spaced apart from each other along the second horizontal direction hd2, and each of the memory stack structures (50, 60) comprises a vertical semiconductor channel 60 and a memory film 50. The electrically conductive layers 46 comprise word-line-level electrically conductive layers (e.g., word lines which are not divided by the source-select-level dielectric isolation structures 22), and each of the word-line-level electrically conductive layers laterally encloses (i.e., completely surrounds in a horizontal plane) a plurality of trench fill structures 158 (and a plurality of elongated trenches 149) as a respective continuous structure.

In one embodiment each of the word-line-level electrically conductive layers may extend between, and may contact each of, a respective pair of backside trench fill structures 76 located within a neighboring pair of backside trenches 79.

In one embodiment, a source layer 108 contacts source side end surfaces of the vertical semiconductor channels 60. In one embodiment, the electrically conductive layers 46 comprise source-select-level electrically conductive layers (e.g., source side select gate electrodes) located between the source layer 108 and the word-line-level electrically conductive layers (e.g., word lines).

In one embodiment, the three-dimensional memory device further comprises optional source-select-level dielectric isolation structures 22 laterally extending along the first horizontal direction hd1, separating source side end surfaces of the vertical semiconductor channels 60, located vertically between the source layer 108 and the word-line-level electrically conductive layers, and located laterally between a respective neighboring pair of the source-select-level electrically conductive layers. The number of levels of the source-select-level electrically conductive layers may be in a range from 1 to 8.

In one embodiment, each of the trench fill structures 158 comprises two rows of drain regions 63 contacting drain side end surfaces of a subset of the vertical semiconductor channels 60 that are located within a respective elongated trench 149.

In one embodiment, each of the memory films 50 comprises a layer stack including a tunneling dielectric layer 56, a charge storage layer 54, and a blocking dielectric layer 52, wherein the tunneling dielectric layer 56 continuously extends from the substrate to a horizontal plane including a distal surface of an electrically conductive layer of the alternating stack (32, 46) that is most distal from the source layer 108 (i.e., the distal surface of the most distal electrically conductive layer 46).

In one embodiment, each of the charge storage layer 54 and the blocking dielectric layer 52 continuously extends from the source layer 108 to the horizontal plane including the distal surface of the electrically conductive layer of the alternating stack that is most distal from the source layer 108, as illustrated in FIGS. 38A-38C.

In one embodiment, each of the charge storage layer 54 and the blocking dielectric layer 52 comprises a respective first portion (254 or 252) vertically extending through a first subset of the electrically conductive layers 46 and a respective second portion (354 or 352) vertically extending through a second subset of the electrically conductive layers 46 that is more distal from the source layer 108 than the first subset.

In one embodiment, each of the trench fill structures 158 comprises a laterally alternating sequence of dielectric cores (62 or 66) and dielectric pillar structures (162 or 366); the dielectric cores (62 or 66) contact the vertical semiconductor channels 60 and do not contact memory films 50; and the dielectric pillar structures (162 or 366) contact the memory films 50. In one embodiment, interfaces between the dielectric cores (62 or 66) and the vertical semiconductor channels 60 are parallel to the first horizontal direction hd1.

In one embodiment, each of the trench fill structures 158 comprises an elongated dielectric pillar structure 162' contacting each of the vertical semiconductor channels 60 and each of the memory films 50 in a respective trench fill structure, as illustrated in FIG. 29E.

In one embodiment, the three-dimensional memory device comprises a logic die 700 that is bonded to the memory die 1000 and comprises a peripheral circuit configured to drive the memory cells in the memory die 1000.

The various embodiments of the present disclosure provide dual channel NAND memory cells in which a pair of vertical semiconductor channels 60 is formed within each memory opening 49, or multiple pairs of vertical semiconductor channels 60 is formed within each elongated trench 149. The various embodiments of the present disclosure reduce lateral spacing among NAND strings along a first horizontal direction hd1, and may reduce the pitch between rows of NAND strings along a second horizontal direction hd2 that is perpendicular to the first horizontal direction hd1. Thus, the various embodiments of the present disclosure provided improved scaling of a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising a memory die that includes:

an alternating stack of insulating layers and electrically conductive layers;

elongated trenches that vertically extend through the alternating stack, wherein each of the elongated trenches comprises a single elongated opening that is laterally bounded by sidewalls of the alternating stack, and laterally extends along a first horizontal direction, and wherein the elongated trenches are laterally spaced apart from each other along a second horizontal direction; and trench fill structures each located entirely in a respective one of the elongated trenches, wherein each of the trench fill structures comprises two rows of memory stack structures that are arranged along the first horizontal direction and laterally spaced apart from each other along the second horizontal direction, and each of the memory stack structures comprises a vertical semiconductor channel and a memory film, wherein the electrically conductive layers comprise word-line-level electrically conductive layers, and each of the word-line-level electrically conductive layers laterally encloses a plurality of trench fill structures as a respective continuous structure.

2. The three-dimensional memory device of claim 1, further comprising a source layer contacting source side end surfaces of the vertical semiconductor channels.

3. The three-dimensional memory device of claim 2, wherein the electrically conductive layers comprise source-select-level electrically conductive layers located between the source layer and the word-line-level electrically conductive layers.

4. The three-dimensional memory device of claim 3, further comprising source-select-level dielectric isolation structures laterally extending along the first horizontal direction, separating the source side end surfaces of the vertical semiconductor channels, located vertically between the source layer and the word-line-level electrically conductive layers, and located laterally between a respective neighboring pair of the source-select-level electrically conductive layers.

5. The three-dimensional memory device of claim 2, wherein each of the trench fill structures further comprises two rows of drain regions contacting drain side end surfaces of a subset of the vertical semiconductor channels located within a respective elongated trench.

6. The three-dimensional memory device of claim 2, wherein each of the memory films comprises a layer stack including a tunneling dielectric layer, a charge storage layer, and a blocking dielectric layer.

7. The three-dimensional memory device of claim 6, wherein the tunneling dielectric layer continuously extends from the source layer to a horizontal plane including a distal surface of an electrically conductive layer of the alternating stack that is most distal from the source layer.

8. The three-dimensional memory device of claim 7, wherein each of the charge storage layer and the blocking dielectric layer continuously extends from the source layer to the horizontal plane including the distal surface of the electrically conductive layer of the alternating stack that is most distal from the source layer.

9. The three-dimensional memory device of claim 1, wherein:

each of the trench fill structures comprises a laterally alternating sequence of dielectric cores and dielectric pillar structures;

the dielectric cores contact the vertical semiconductor channels and do not contact memory films; and the dielectric pillar structures contact the memory films.

10. The three-dimensional memory device of claim 9, wherein interfaces between the dielectric cores and the vertical semiconductor channels are parallel to the first horizontal direction.

11. The three-dimensional memory device of claim 1, wherein each of the trench fill structures further comprises an elongated dielectric pillar structure contacting each of the vertical semiconductor channels and each of the memory films in a respective trench fill structure.

12. The three-dimensional memory device of claim 1, further comprising a logic die that is bonded to the memory die and comprising a peripheral circuit configured to drive the memory die.

13. The three-dimensional memory device of claim 1, wherein each sidewall of the respective single elongated opening vertically extends straight through the alternating stack from a topmost layer within the alternating stack to a bottommost layer within the alternating stack.

14. The three-dimensional memory device of claim 1, wherein each of the elongated trenches is completely laterally encircled by a plurality of the word-line-level electrically conductive layers.

15. The three-dimensional memory device of claim 1, wherein each of the elongated trenches is completely laterally encircled by the insulating layers and the electrically conductive layers.

* * * * *